(12) United States Patent
Inagaki et al.

(10) Patent No.: US 8,729,400 B2
(45) Date of Patent: May 20, 2014

(54) MULTILAYER PRINTED WIRING BOARD

(75) Inventors: Yasushi Inagaki, Ibi-gun (JP);
Katsuyuki Sano, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 90 days.

(21) Appl. No.: 12/272,892

(22) Filed: Nov. 18, 2008

(65) Prior Publication Data
US 2009/0090542 A1 Apr. 9, 2009

Related U.S. Application Data

(62) Division of application No. 10/564,856, filed as application No. PCT/JP2005/001611 on Feb. 3, 2005, now Pat. No. 8,119,920.

(30) Foreign Application Priority Data

| Feb. 4, 2004 | (JP) | 2004-028074 |
| Feb. 5, 2004 | (JP) | 2004-029201 |
| Feb. 19, 2004 | (JP) | 2004-043068 |
| Feb. 19, 2004 | (JP) | 2004-043069 |

(51) Int. Cl.
*H05K 1/03* (2006.01)
(52) U.S. Cl.
USPC .................. 174/255; 174/260; 174/262
(58) Field of Classification Search
USPC .................. 174/255, 260, 261, 262
See application file for complete search history.

(56) References Cited

U.S. PATENT DOCUMENTS

| 4,769,270 | A | | 9/1988 | Nagamatsu et al. | |
| 5,374,788 | A | * | 12/1994 | Endoh et al. | 174/266 |
| 5,774,340 | A | | 6/1998 | Chang et al. | |
| 5,876,842 | A | * | 3/1999 | Duffy et al. | 428/209 |
| 5,879,568 | A | | 3/1999 | Urasaki et al. | |
| 6,084,779 | A | * | 7/2000 | Fang | 361/763 |
| 6,165,892 | A | * | 12/2000 | Chazan et al. | 438/623 |
| 6,201,194 | B1 | | 3/2001 | Lauffer et al. | |
| 6,203,967 | B1 | | 3/2001 | Westbrook et al. | |
| 6,262,579 | B1 | | 7/2001 | Chazan et al. | |
| 6,323,435 | B1 | | 11/2001 | Strandberg et al. | |
| 6,323,439 | B1 | | 11/2001 | Kambe et al. | |

(Continued)

FOREIGN PATENT DOCUMENTS

| CN | 1771772 B | 8/2010 |
| JP | 64-80100 | 3/1989 |

(Continued)

OTHER PUBLICATIONS

Office Action issued Jun. 17, 2010, in Taiwan Patent Application No. 09920418940.

*Primary Examiner* — Ishwarbhai B Patel
(74) *Attorney, Agent, or Firm* — Oblon, Spivak, McClelland, Maier & Neustadt, L.L.P.

(57) ABSTRACT

An IC chip for a high frequency region, particularly a packaged substrate in which no malfunction or error occurs even if 3 GHz is exceeded. A conductive layer on a core substrate is formed at a thickness of 30 μm and a conductor circuit on an interlayer resin insulation layer is formed at a thickness of 15 μm. By thickening the conductive layer, the volume of the conductor can be increased and resistance can be reduced. Further, by using the conductive layer as a power source layer, the capacity of supply of power to an IC chip can be improved.

19 Claims, 38 Drawing Sheets

(56) References Cited

U.S. PATENT DOCUMENTS

| | | | |
|---|---|---|---|
| 6,333,857 | B1 | 12/2001 | Kanbe et al. |
| 6,376,052 | B1 | 4/2002 | Asai et al. |
| 6,434,818 | B2 | 8/2002 | Kanechika et al. |
| 6,440,641 | B1 | 8/2002 | Lykins et al. |
| 6,573,600 | B2 * | 6/2003 | Kikuchi et al. ............... 257/750 |
| 6,613,987 | B2 | 9/2003 | Seki et al. |
| 6,749,927 | B2 | 6/2004 | Cooray |
| 6,767,616 | B2 * | 7/2004 | Ooi et al. ..................... 428/209 |
| 6,809,415 | B2 | 10/2004 | Tsukada et al. |
| 6,879,492 | B2 | 4/2005 | Alcoe et al. |
| 6,931,726 | B2 | 8/2005 | Boyko et al. |
| 7,507,913 | B2 * | 3/2009 | Inagaki et al. ............... 174/260 |
| 8,119,920 | B2 | 2/2012 | Inagaki et al. |
| 2003/0173676 | A1 | 9/2003 | Horikawa |
| 2004/0011555 | A1 | 1/2004 | Chiu |
| 2006/0202322 | A1 * | 9/2006 | Kariya et al. ............... 257/698 |
| 2007/0029106 | A1 * | 2/2007 | Kato ............................ 174/255 |

FOREIGN PATENT DOCUMENTS

| | | |
|---|---|---|
| JP | 6-260756 | 9/1994 |
| JP | 6-275959 | 9/1994 |
| JP | 8-46306 | 2/1996 |
| JP | 10-93237 | 4/1998 |
| JP | 2000-4080 A | 1/2000 |
| JP | 2000-101245 | 4/2000 |
| JP | 2000-156565 | 6/2000 |
| JP | 2000-244130 | 9/2000 |
| JP | 2001-156408 | 6/2001 |
| JP | 2002-64272 | 2/2002 |
| JP | 2002-151841 | 5/2002 |
| JP | 2002-151847 | 5/2002 |
| JP | 2002-204077 | 7/2002 |
| JP | 2002-271034 | 9/2002 |
| JP | 2002-353365 | 12/2002 |
| JP | 2002-353597 A | 12/2002 |
| JP | 2003-31944 | 1/2003 |
| JP | 2003-31945 | 1/2003 |
| JP | 2003-115662 | 4/2003 |
| JP | 2003-197811 | 7/2003 |
| JP | 2003-324263 | 11/2003 |
| JP | 2004-22852 A | 1/2004 |
| JP | 2004-31738 | 1/2004 |
| KR | 10-0385422 | 5/2003 |
| TW | 398162 | 7/2000 |
| TW | 550991 | 9/2003 |
| WO | WO 00/07222 A2 | 2/2000 |

* cited by examiner

Fig. 2
(A)
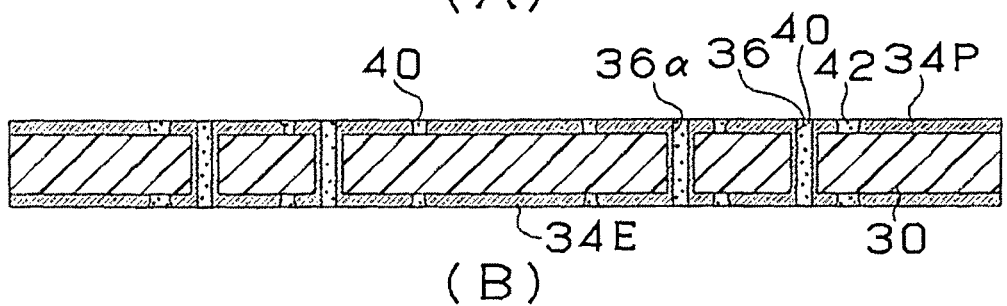
(B)
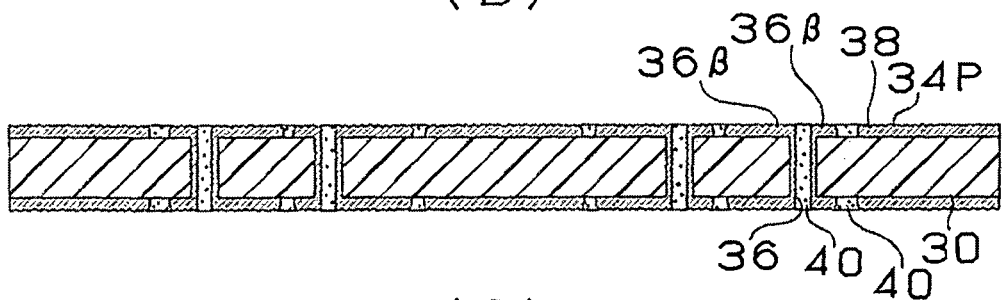
(C)
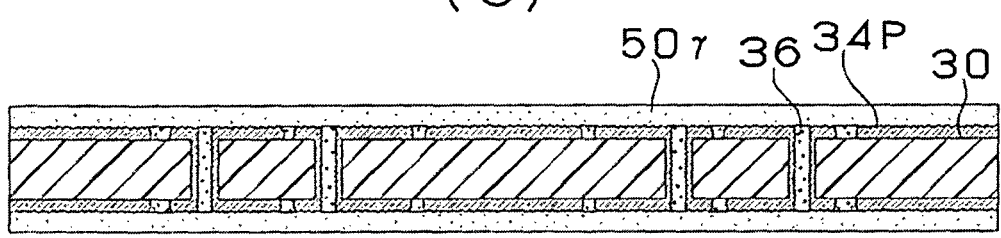
(D)
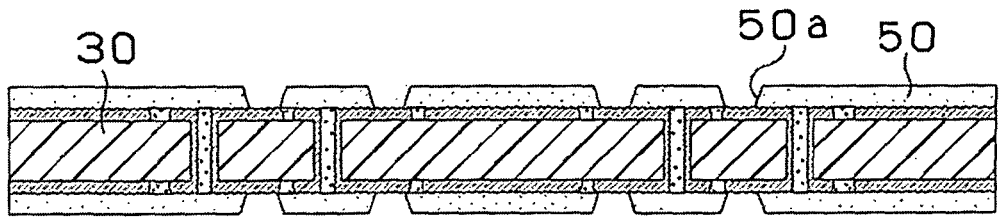
(E)
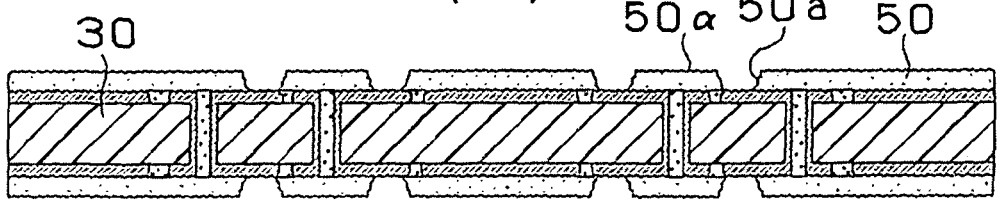

Fig. 3
(A)
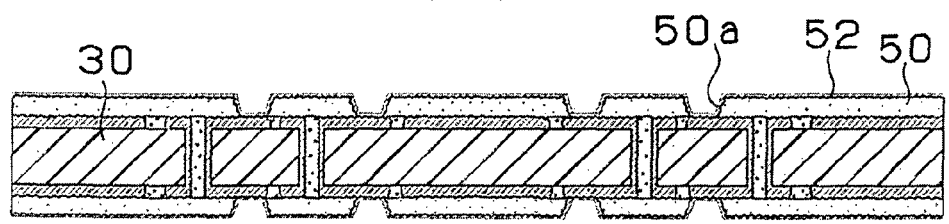
(B)
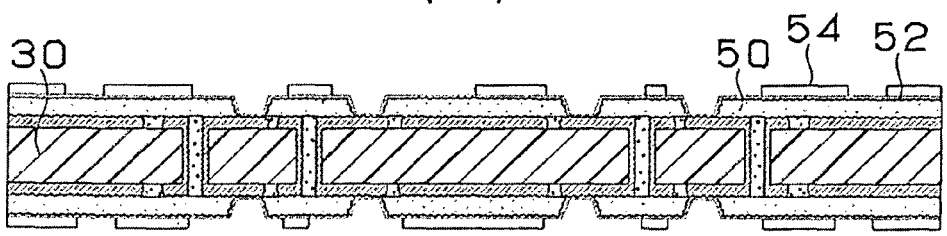
(C)
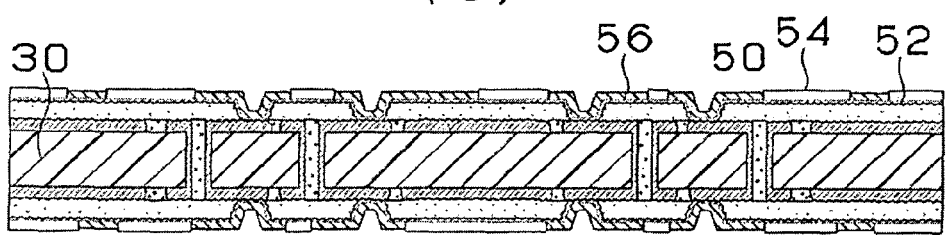
(D)
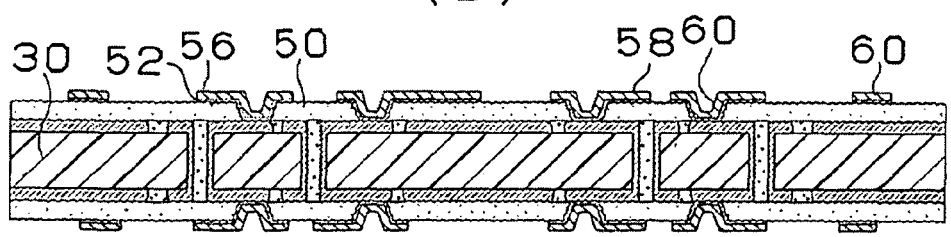

Fig. 4
(A)
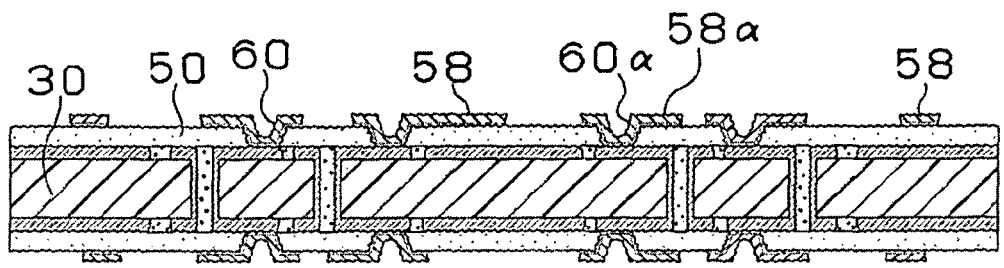
(B)
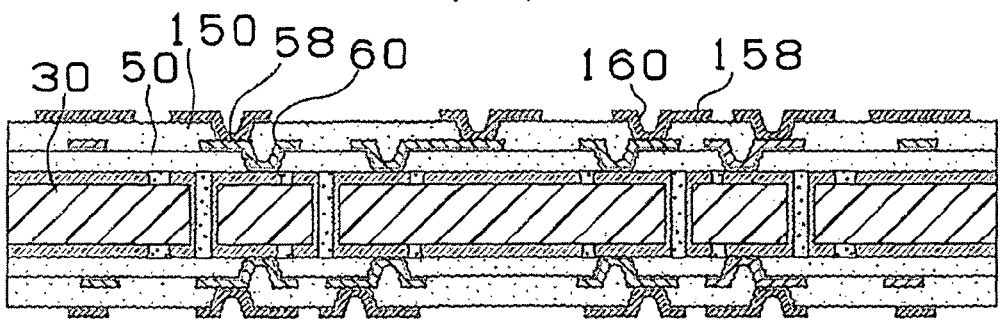
(C)
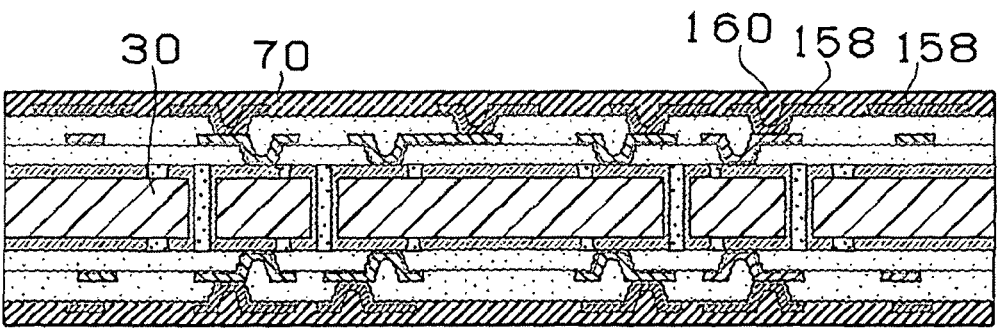

Fig. 5
(A)
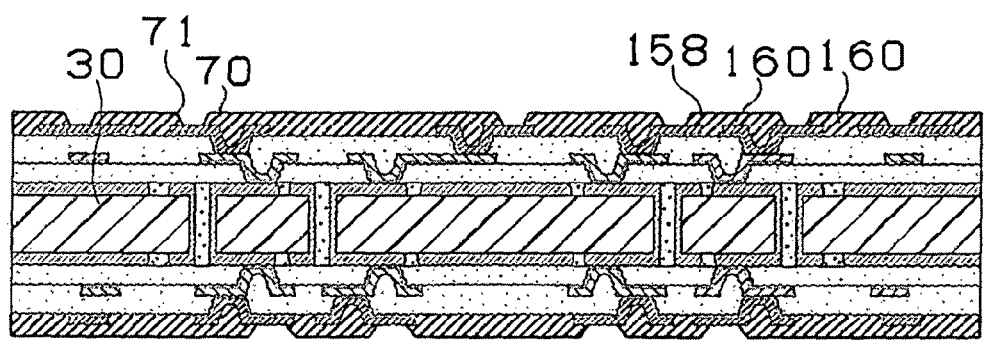
(B)
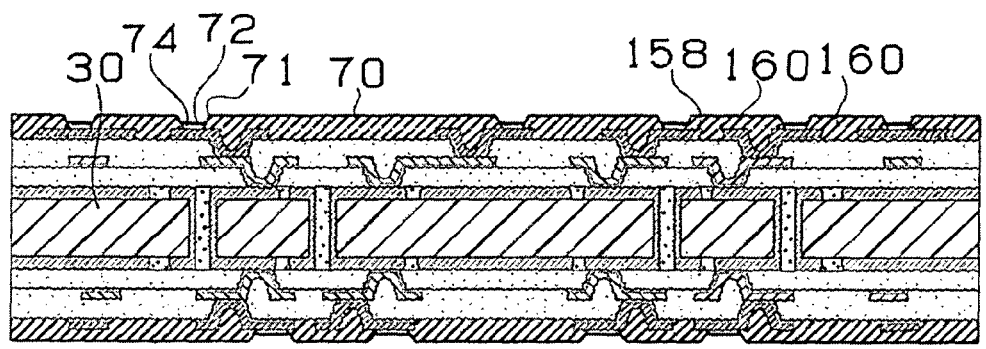

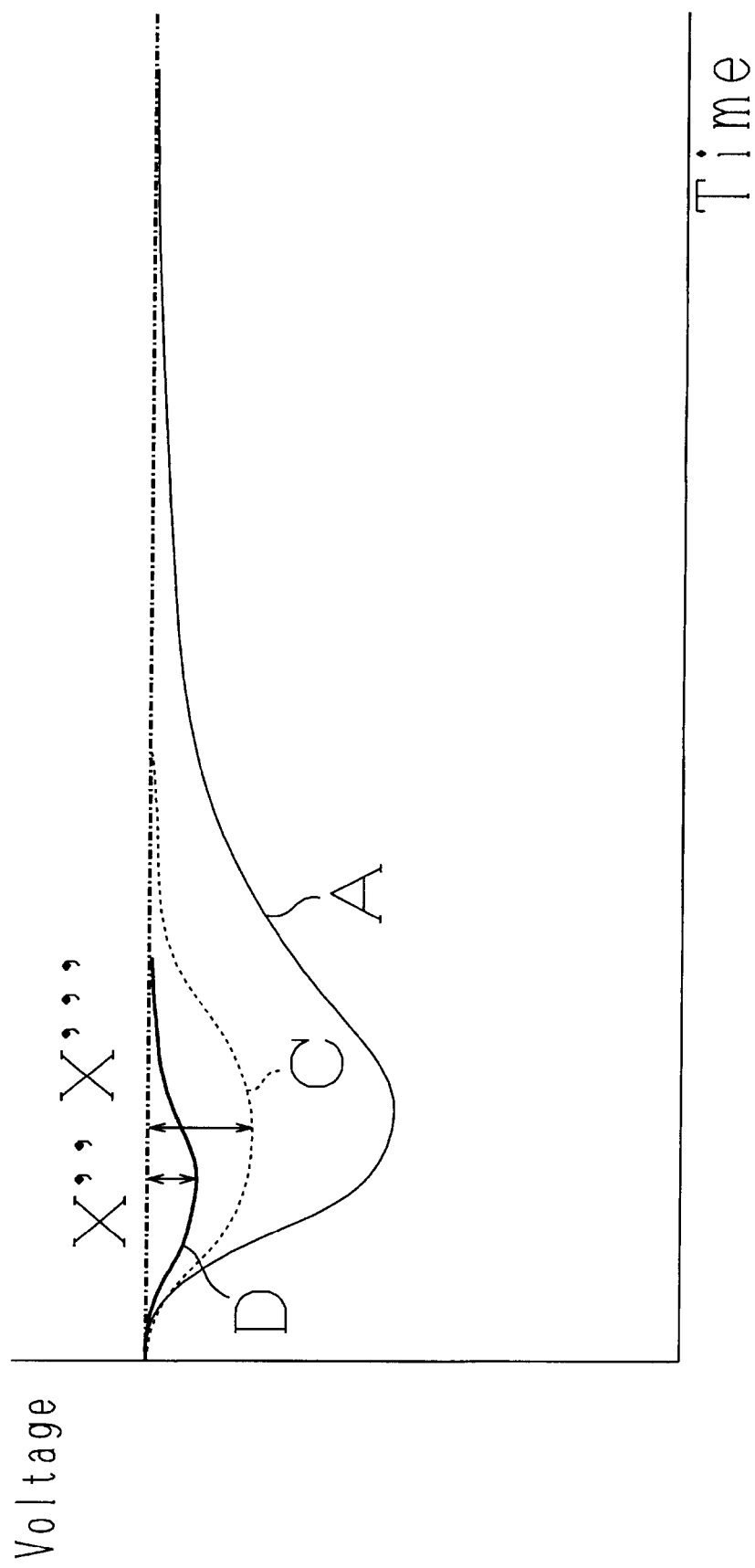

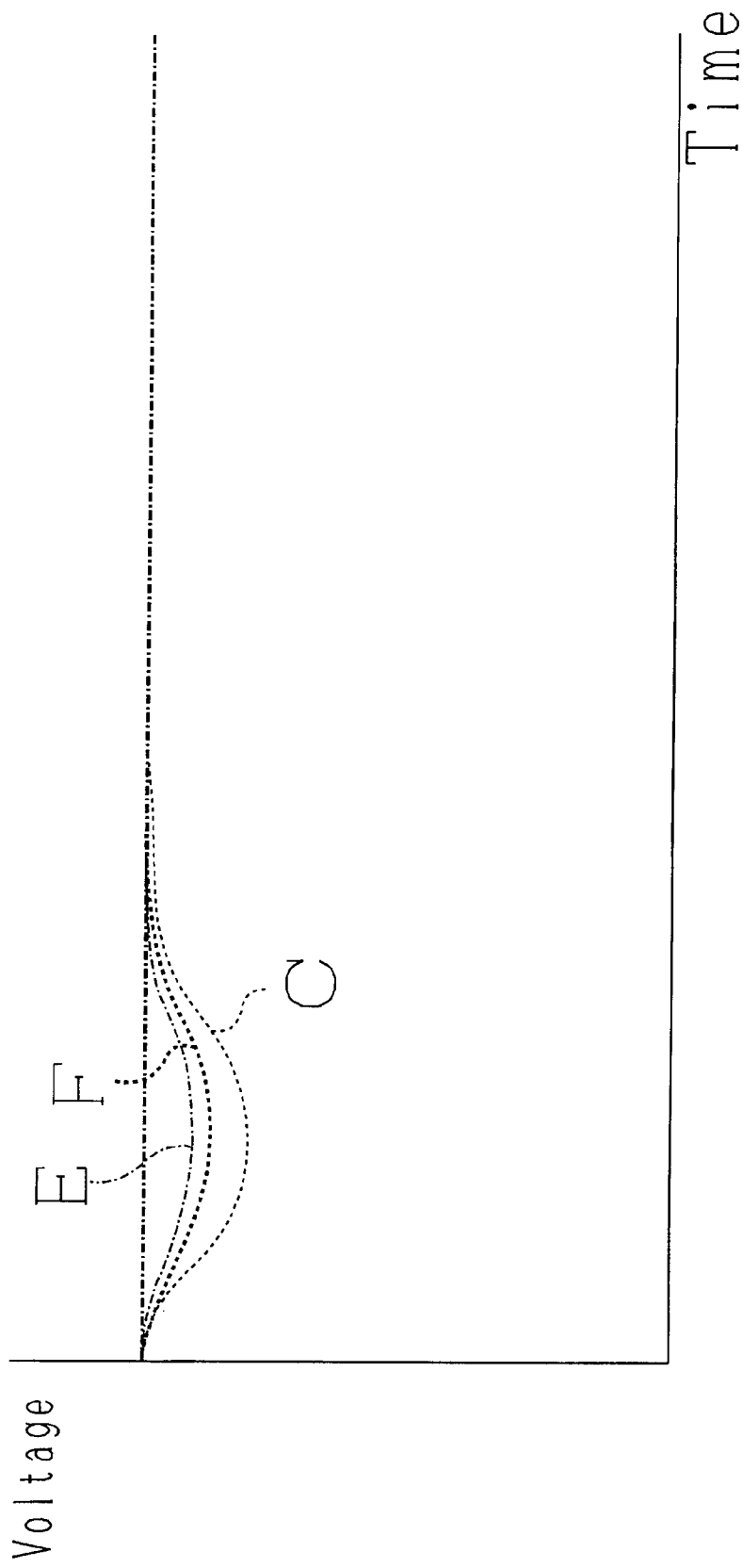

Fig. 25

| | Thickness Of Conductor Circuit | 100hr | | 300hr | | 500hr | | 1000hr | | Amount Of Voltage Drop |
|---|---|---|---|---|---|---|---|---|---|---|
| | Ratio α1/α2 | Presence /Absence Of IC Malfunction | Open Yes/No | Presence /Absence Of IC Malfunction | Open Yes/No | Presence /Absence Of IC Malfunction | Open Yes/No | Presence /Absence Of IC Malfunction | Open Yes/No | Voltage (V) |
| First Embodiment-1 | 2.0 | ○ | ○ | ○ | ○ | ○ | ○ | ○ | ○ | 0.091 |
| First Embodiment-2 | 3.7 | ○ | ○ | ○ | ○ | ○ | ○ | ○ | ○ | 0.085 |
| First Embodiment-3 | 5.0 | ○ | ○ | ○ | ○ | ○ | ○ | ○ | ○ | 0.085 |
| First Embodiment-4 | 30.0 | ○ | ○ | ○ | ○ | ○ | ○ | ○ | ○ | 0.093 |
| First Embodiment-5 | 1.2 | ○ | ○ | ○ | ○ | ○ | ○ | ○ | ○ | 0.093 |
| Second Embodiment-1 | 2.0 | ○ | ○ | ○ | ○ | ○ | ○ | ○ | ○ | 0.091 |
| Second Embodiment-2 | 3.3 | ○ | ○ | ○ | ○ | ○ | ○ | ○ | ○ | 0.085 |
| Second Embodiment-3 | 5.0 | ○ | ○ | ○ | ○ | ○ | ○ | ○ | ○ | 0.085 |
| Second Embodiment-4 | 30.0 | ○ | ○ | ○ | ○ | ○ | ○ | ○ | ○ | 0.094 |
| Third Embodiment-1 | 2.3 | ○ | ○ | ○ | ○ | ○ | ○ | ○ | ○ | 0.087 |
| Third Embodiment-2 | 3.7 | ○ | ○ | ○ | ○ | ○ | ○ | ○ | ○ | 0.085 |
| Third Embodiment-3 | 10.0 | ○ | ○ | ○ | ○ | ○ | ○ | ○ | ○ | 0.093 |
| Third Embodiment-4 | 30.0 | ○ | ○ | ○ | ○ | ○ | ○ | ○ | ○ | 0.093 |
| Third Embodiment-5 | 40.0 | ○ | ○ | ○ | ○ | ○ | ○ | ○ | ○ | 0.096 |
| Fourth Embodiment-1 | 3.3 | ○ | ○ | ○ | ○ | ○ | ○ | ○ | ○ | 0.085 |
| Fourth Embodiment-2 | 4.0 | ○ | ○ | ○ | ○ | ○ | ○ | ○ | ○ | 0.085 |
| Fourth Embodiment-3 | 5.0 | ○ | ○ | ○ | ○ | ○ | ○ | ○ | ○ | 0.085 |
| Fourth Embodiment-4 | 20.0 | ○ | ○ | ○ | ○ | ○ | ○ | ○ | ○ | 0.096 |
| Fourth Embodiment-5 | 30.0 | ○ | ○ | ○ | ○ | ○ | ○ | ○ | ○ | 0.097 |
| Fourth Embodiment-6 | 40.0 | ○ | ○ | ○ | ○ | ○ | ○ | ○ | ○ | 0.098 |

Fig. 26

| | Thickness Of Conductor Circuit | 100hr | | 300hr | | 500hr | | 1000hr | | Amount Of Voltage Drop |
|---|---|---|---|---|---|---|---|---|---|---|
| | Ratio α1/α2 | Presence/Absence Of IC Malfunction | Open Yes/No | Presence/Absence Of IC Malfunction | Open Yes/No | Presence/Absence Of IC Malfunction | Open Yes/No | Presence/Absence Of IC Malfunction | Open Yes/No | Voltage (V) |
| Fifth Embodiment -1 | 6.7 | ○ | ○ | ○ | ○ | ○ | ○ | ○ | ○ | 0.084 |
| Fifth Embodiment -2 | 5.3 | ○ | ○ | ○ | ○ | ○ | ○ | ○ | ○ | 0.085 |
| Fifth Embodiment -3 | 10.0 | ○ | ○ | ○ | ○ | ○ | ○ | ○ | ○ | 0.090 |
| Fifth Embodiment -4 | 20.0 | ○ | ○ | ○ | ○ | ○ | ○ | ○ | ○ | 0.094 |
| Fifth Embodiment 5 | 30.0 | ○ | ○ | ○ | ○ | ○ | ○ | ○ | ○ | 0.095 |
| Fifth Embodiment -6 | 40.0 | ○ | ○ | ○ | ○ | ○ | ○ | ○ | ○ | 0.097 |
| Sixth Embodiment -1 | 2.0 | ○ | ○ | ○ | ○ | ○ | ○ | ○ | ○ | 0.091 |
| Sixth Embodiment -2 | 3.7 | ○ | ○ | ○ | ○ | ○ | ○ | ○ | ○ | 0.085 |
| Sixth Embodiment -3 | 5.0 | ○ | ○ | ○ | ○ | ○ | ○ | ○ | ○ | 0.085 |
| Sixth Embodiment 4 | 30.0 | ○ | ○ | ○ | ○ | ○ | ○ | ○ | ○ | 0.095 |
| Comparison Example -1 | 1.0 | × | ○ | × | ○ | × | × | × | × | 0.108 |
| Comparison Example -2 | 1.0 | × | ○ | × | ○ | × | × | × | × | 0.108 |
| Comparison Example -3 | 1.0 | × | ○ | × | ○ | × | × | × | × | 0.108 |
| Comparison Example -4 | 1.0 | × | ○ | × | ○ | × | × | × | × | 0.108 |
| Comparison Example -5 | 1.0 | × | ○ | × | ○ | × | × | × | × | 0.108 |
| Reference Example -1 | 41.5 | × | ○ | ○ | ○ | × | ○ | × | × | 0.103 |
| Reference Example -2 | 41.5 | × | ○ | ○ | ○ | × | ○ | × | × | 0.103 |
| Reference Example -3 | 41.5 | × | ○ | ○ | ○ | × | ○ | × | × | 0.103 |
| Reference Example -4 | 41.5 | × | ○ | ○ | ○ | × | ○ | × | × | 0.103 |
| Reference Example -5 | 41.5 | × | ○ | ○ | ○ | × | ○ | × | × | 0.103 |

Presence/Absence Of Malfunciton Of IC Chip (○: No Malfunction, ×: Malfunction)    Open Yes/No (○: no open, ×: open)

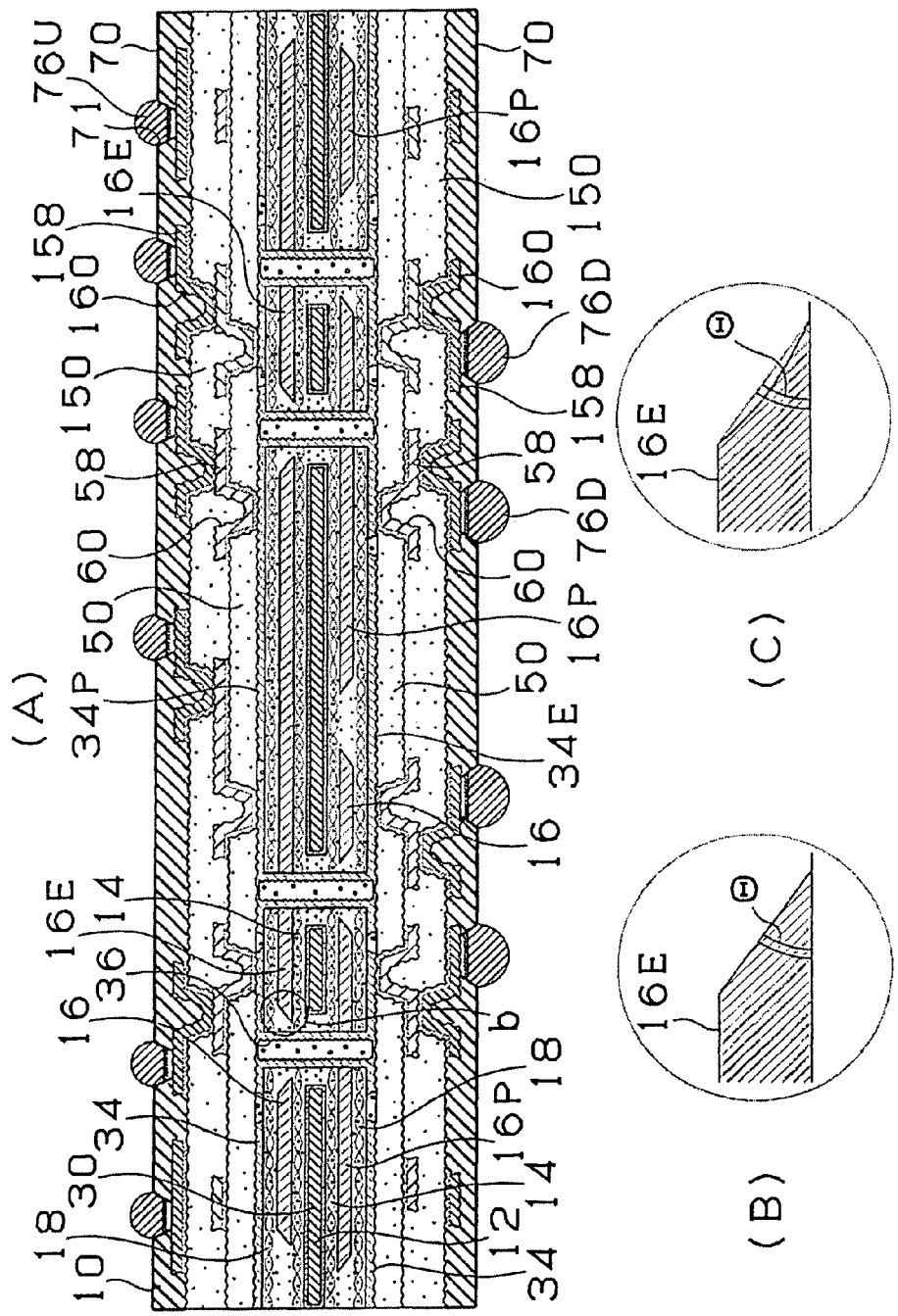

Fig. 28

| # | tan Θ | HAST(log X) | Resistance Change Ratio (%) | Shape |
|---|---|---|---|---|
| Seventh Embodiment—1 | 2 | 5.1 | 0.8 | Rounded Face |
| Seventh Embodiment—2 | 2.8 | 10.8 | 0.8 | Rounded Face |
| Seventh Embodiment—3 | 3.5 | 11.2 | 1.0 | Rounded Face |
| Seventh Embodiment—4 | 53 | 12.8 | 3.2 | Rounded Face |
| Seventh Embodiment—5 | 55 | 13.0 | 4.8 | Rounded Face |
| Seventh Embodiment—6 | 57 | 13.1 | 16.8 | Rounded Face |
| Seventh Embodiment—7 | 2.8 | — | 3.4 | Linear |
| Seventh Embodiment—8 | 53 | — | 5.8 | Linear |
| Seventh Embodiment—9 | 57 | — | 34.2 | Linear |

Fig. 30

| Embodiment | Thickness Of Conductive Layer In Inner Layer | Shape Of Taper | tan θ | Presence/Absence Of Malfunction | | | | Heat Cycle Test | |
|---|---|---|---|---|---|---|---|---|---|
| | | | | No.1 | No.2 | No.3 | No.4 | 1000回 | 2000回 |
| Eighth Embodiment-1 | 30 | Rounded Face | 1.6~2.5 | No | Yes | Yes | — | — | — |
| Eighth Embodiment-2 | 45 | Rounded Face | 1.4~2.1 | No | No | Yes | — | — | — |
| Eighth Embodiment-3 | 60 | Rounded Face | 1.4~2.1 | No | No | No | — | — | — |
| Eighth Embodiment-4 | 100 | Rounded Face | 1.3~1.9 | No | No | No | — | — | — |
| Eighth Embodiment-5 | 125 | Rounded Face | 1.3~1.9 | No | No | No | — | — | — |
| Eighth Embodiment-6 | 150 | Rounded Face | 1.2~1.7 | No | No | No | — | — | — |
| Eighth Embodiment-7 | 30 | Rounded Face | 3.0~10.8 | No | No | No | Yes | — | — |
| Eighth Embodiment-8 | 45 | Rounded Face | 3.0~11.0 | No | No | No | Yes | — | — |
| Eighth Embodiment-9 | 60 | Rounded Face | 3.0~11.2 | No | No | No | Yes | — | — |
| Eighth Embodiment-10 | 100 | Rounded Face | 2.8~11.2 | No | No | No | Yes | — | — |
| Eighth Embodiment-11 | 125 | Rounded Face | 2.7~11.0 | No | No | Yes | Yes | — | — |
| Eighth Embodiment-12 | 150 | Rounded Face | 2.7~11.4 | No | No | Yes | Yes | — | — |
| Eighth Embodiment-13 | 30 | Rounded Face | 3.0~5.3 | No | No | No | No | — | — |
| Eighth Embodiment-14 | 45 | Rounded Face | 3.1~5.4 | No | No | No | No | — | — |
| Eighth Embodiment-15 | 60 | Rounded Face | 3.1~5.4 | No | No | No | No | — | — |
| Eighth Embodiment-16 | 100 | Rounded Face | 2.7~5.5 | No | No | No | No | — | — |
| Eighth Embodiment-17 | 125 | Rounded Face | 2.9~5.7 | No | No | No | No | — | — |
| Eighth Embodiment-18 | 150 | Rounded Face | 2.7~5.7 | No | No | No | No | — | — |
| Eighth Embodiment-19 | 30 | Rounded Face | 4.2~10.8 | No | No | No | Yes | ○ | ○ |
| Eighth Embodiment-20 | 45 | Rounded Face | 4.0~11.0 | No | No | No | No | ○ | ○ |
| Eighth Embodiment-21 | 60 | Rounded Face | 3.8~11.0 | No | No | No | No | ○ | ○ |
| Eighth Embodiment-22 | 100 | Rounded Face | 3.7~11.2 | No | No | No | No | ○ | ○ |
| Eighth Embodiment-23 | 125 | Rounded Face | 3.7~11.4 | No | No | No | No | ○ | ○ |
| Eighth Embodiment-24 | 150 | Rounded Face | 3.7~11.3 | No | No | No | No | ○ | ○ |
| Eighth Embodiment-25 | 30 | Linear | 4.0~10.8 | No | No | No | Yes | ○ | × |
| Eighth Embodiment-26 | 45 | Linear | 4.0~10.8 | No | No | No | Yes | ○ | × |
| Eighth Embodiment-27 | 60 | Linear | 4.0~11.0 | No | No | No | Yes | ○ | × |
| Eighth Embodiment-28 | 100 | Linear | 3.7~11.2 | No | No | No | Yes | ○ | × |
| Eighth Embodiment-29 | 125 | Linear | 3.8~11.4 | No | No | No | Yes | ○ | × |
| Eighth Embodiment-30 | 150 | Linear | 3.7~11.4 | No | No | No | Yes | ○ | × |
| Eighth Comparison Example-1 | 15* | Rounded Face | 1.6~2.5 | Yes | Yes | Yes | Yes | — | — |
| Eighth Comparison Example-2 | 15* | Rounded Face | 3.0~10.8 | Yes | Yes | Yes | Yes | — | — |
| Eighth Comparison Example-3 | 15* | Rounded Face | 3.0~5.3 | Yes | Yes | Yes | Yes | — | — |
| Eighth Comparison Example-4 | 15* | Rounded Face | 4.2~10.8 | Yes | Yes | Yes | Yes | — | — |

A value marked in column of thickness of conductor in inner layer of the eighth comparative example indicates a sum of power source layers of core substrate.

Fig. 32

| # | α1/α2 | Quantity Of Inner Layers | Thickness Of Conductive Layer On Interlayer Insulation Layer (μm) | Thickness Of Power Source Layer On The Front Surface Of Core Substrate (μm) | Thickness Of Power Source Layer In Inner Layer Of Core Substrate (μm) | Sum Of Thicknesses Of Power Source Layers Of Core (μm) | Amount Of Voltage Drop (V) | Result After HAST Test |
|---|---|---|---|---|---|---|---|---|
| Ninth Embodiment—1 | 2 | 2 | 20 | 15 | 25 | 40 | 0.091 | ○ |
| Ninth Embodiment—2 | 1.2 | 2 | 20 | 9 | 15 | 24 | 0.093 | ○ |
| Ninth Embodiment—3 | 3 | 2 | 20 | 15 | 45 | 60 | 0.085 | ○ |
| Ninth Embodiment—4 | 3.75 | 2 | 20 | 15 | 60 | 75 | 0.085 | ○ |
| Ninth Embodiment—5 | 30.75 | 12 | 20 | 15 | 100 | 615 | 0.095 | ○ |
| Ninth Embodiment—6 | 40.75 | 16 | 20 | 15 | 100 | 815 | 0.097 | ○ |
| Ninth Embodiment—7 | 3 | 2 | 20 | 45 | 15 | 60 | 0.087 | ○ |
| Ninth Embodiment—8 | 3.75 | 2 | 20 | 60 | 15 | 75 | 0.086 | ○ |
| Ninth Embodiment—9 | 3.25 | 2 | 20 | 15 | 50 | 65 | 0.084 | ○ |
| Ninth Embodiment—10 | 8.25 | 2 | 20 | 15 | 150 | 165 | 0.083 | ○ |
| Ninth Embodiment—11 | 9.5 | 2 | 20 | 15 | 175 | 190 | 0.09 | × |
| Ninth Embodiment—12 | 10.75 | 2 | 20 | 15 | 200 | 215 | 0.093 | × |
| Ninth Embodiment—28 | 7 | 2 | 20 | 15 | 125 | 140 | 0.084 | ○ |
| Ninth Comparison Example—1 | 1 | 2 | 20 | 10 | 10 | 20 | 0.108 | ○ |
| Ninth Comparison Example—2 | 42 | 16 | 20 | 40 | 100 | 840 | 0.103 | ○ |
| Ninth Comparison Example—3 | 50.75 | 20 | 20 | 15 | 100 | 1015 | 0.123 | ○ |

Fig. 33

| # | α1/α2 | Quantity Of Inner Layers | Thickness Of Conductive Layer On Interlayer Insulation Layer (μm) | Thickness Of Power Source Layer On The Front Surface Of Core Substrate (μm) | Thickness Of Power Source Layer In Inner Layer Of Core Substrate (μm) | Sum Of Thicknesses Of Power Source Layers Of Core (μm) | Amount Of Voltage Drop (V) | Presence/Absence Of Malfunction | | |
|---|---|---|---|---|---|---|---|---|---|---|
| | | | | | | | | Mounting of No.1 IC | Mounting of No.2 IC | Mounting of No.3 IC |
| Ninth Embodiment—1 | 2 | 2 | 20 | 15 | 25 | 40 | 0.091 | No | Yes | Yes |
| Ninth Embodiment—2 | 1.2 | 2 | 20 | 9 | 15 | 24 | 0.093 | No | Yes | Yes |
| Ninth Embodiment—3 | 3 | 2 | 20 | 15 | 45 | 60 | 0.085 | No | No | No |
| Ninth Embodiment—4 | 3.75 | 2 | 20 | 15 | 60 | 75 | 0.085 | No | No | No |
| Ninth Embodiment—5 | 30.75 | 12 | 20 | 15 | 100 | 615 | 0.095 | No | Yes | Yes |
| Ninth Embodiment—6 | 40.75 | 16 | 20 | 15 | 100 | 815 | 0.097 | No | Yes | Yes |
| Ninth Embodiment—7 | 3 | 2 | 20 | 45 | 15 | 60 | 0.087 | No | No | Yes |
| Ninth Embodiment—8 | 3.75 | 2 | 20 | 60 | 15 | 75 | 0.086 | No | No | Yes |
| Ninth Embodiment—9 | 3.25 | 2 | 20 | 15 | 50 | 65 | 0.084 | No | No | No |
| Ninth Embodiment—10 | 8.25 | 2 | 20 | 15 | 150 | 165 | 0.083 | No | No | Yes |
| Ninth Embodiment—11 | 9.5 | 2 | 20 | 15 | 175 | 190 | 0.09 | No | Yes | Yes |
| Ninth Embodiment—12 | 10.75 | 2 | 20 | 15 | 200 | 215 | 0.093 | No | Yes | Yes |
| Ninth Embodiment—27 | 4 | 4 | 20 | 15 | 32.5 | 80 | 0.087 | No | No | Yes |
| Ninth Embodiment—28 | 7 | 2 | 20 | 15 | 125 | 140 | 0.084 | No | No | No |
| Ninth Comparison Example—1 | 1 | 2 | 20 | 10 | 10 | 20 | 0.108 | Yes | Yes | Yes |
| Ninth Comparison Example—2 | 42 | 16 | 20 | 40 | 100 | 840 | 0.103 | Yes | Yes | Yes |
| Ninth Comparison Example—3 | 50.75 | 20 | 20 | 15 | 100 | 1015 | 0.123 | Yes | Yes | Yes |

Fig. 34

| # | Conductor Width/Interval Between Conductors (μm) | | | | |
|---|---|---|---|---|---|
| | 5/5 | 7.5/7.5 | 10/10 | 12.5/12.5 | 15/15 |
| Ninth Embodiment-3 | ○ | ○ | ○ | ○ | ○ |
| Ninth Embodiment-4 | ○ | ○ | ○ | ○ | ○ |
| Ninth Embodiment-7 | × | × | ○ | ○ | ○ |
| Ninth Embodiment-8 | × | × | ○ | ○ | ○ |

Fig. 36

| # | α1/α2 | No dummy land TH% | Quantity Of Inner Layers | Thickness Of Conductive Layer On Interlayer Insulation Layer (μm) | Thickness Of Power Source Layer On The Front Surface Of Core Substrate (μm) | Thickness Of Power Source Layer in Inner Layer Of Core Substrate (μm) | Sum Of Thicknesses Of Power Source Layers Of Core (μm) | Presence/Absence Of Malfunction | | |
|---|---|---|---|---|---|---|---|---|---|---|
| | | | | | | | | Mounting of No.1 IC | Mounting of No.2 IC | Mounting of No.3 IC |
| Ninth Embodiment-13 | 3 | 50 | 2 | 20 | 15 | 45 | 60 | No | No | No |
| Ninth Embodiment-14 | 3 | 100 | 2 | 20 | 15 | 45 | 60 | No | No | No |
| Ninth Embodiment-15 | 3.25 | 50 | 2 | 20 | 15 | 50 | 65 | No | No | No |
| Ninth Embodiment-16 | 3.25 | 100 | 2 | 20 | 15 | 50 | 65 | No | No | No |
| Ninth Embodiment-17 | 3.75 | 50 | 2 | 20 | 15 | 60 | 75 | No | No | No |
| Ninth Embodiment-18 | 3.75 | 100 | 2 | 20 | 15 | 60 | 75 | No | No | No |
| Ninth Embodiment-19 | 8.25 | 50 | 2 | 20 | 15 | 150 | 165 | No | No | No |
| Ninth Embodiment-20 | 8.25 | 100 | 2 | 20 | 15 | 150 | 165 | No | No | No |
| Ninth Embodiment-21 | 9.5 | 50 | 2 | 20 | 15 | 175 | 190 | No | No | Yes |
| Ninth Embodiment-22 | 9.5 | 100 | 2 | 20 | 15 | 175 | 190 | No | No | Yes |
| Ninth Embodiment-23 | 10.75 | 50 | 2 | 20 | 15 | 200 | 215 | No | No | Yes |
| Ninth Embodiment-24 | 10.75 | 100 | 2 | 20 | 15 | 200 | 215 | No | No | Yes |
| Ninth Embodiment-25 | 3 | 50 | 2 | 20 | 45 | 15 | 60 | No | No | Yes |
| Ninth Embodiment-26 | 3 | 100 | 2 | 20 | 45 | 15 | 60 | No | No | Yes |

Fig. 37

| Embodiment | Thickness Of Conductive Layer In Inner Layer | Shape Of Taper | tan θ | no-dummy land TH% | Presence/Absence Of Malfunction No.4 |
|---|---|---|---|---|---|
| Tenth Embodiment-1 | 45 | Rounded Face | 3.1~5.4 | 50 | No |
| Tenth Embodiment-2 | 60 | Rounded Face | 3.1~5.4 | 50 | No |
| Tenth Embodiment-3 | 100 | Rounded Face | 2.7~5.5 | 50 | No |
| Tenth Embodiment-4 | 125 | Rounded Face | 2.7~5.7 | 50 | No |
| Tenth Embodiment-5 | 150 | Rounded Face | 2.9~5.7 | 50 | No |
| Tenth Embodiment-6 | 45 | Rounded Face | 3.1~5.4 | 100 | No |
| Tenth Embodiment-7 | 60 | Rounded Face | 3.1~5.4 | 100 | No |
| Tenth Embodiment-8 | 100 | Rounded Face | 2.7~5.5 | 100 | No |
| Tenth Embodiment-9 | 125 | Rounded Face | 2.7~5.7 | 100 | No |
| Tenth Embodiment-10 | 150 | Rounded Face | 2.9~5.7 | 100 | No |
| Tenth Embodiment-11 | 45 | Rounded Face | 4.0~11.0 | 50 | No |
| Tenth Embodiment-12 | 60 | Rounded Face | 3.8~11.0 | 50 | No |
| Tenth Embodiment-13 | 100 | Rounded Face | 3.7~11.2 | 50 | No |
| Tenth Embodiment-14 | 125 | Rounded Face | 3.7~11.4 | 50 | No |
| Tenth Embodiment-15 | 150 | Rounded Face | 3.7~11.3 | 50 | No |
| Tenth Embodiment-16 | 45 | Rounded Face | 4.0~11.0 | 100 | No |
| Tenth Embodiment-17 | 60 | Rounded Face | 3.8~11.0 | 100 | No |
| Tenth Embodiment-18 | 100 | Rounded Face | 3.7~11.2 | 100 | No |
| Tenth Embodiment-19 | 125 | Rounded Face | 3.7~11.4 | 100 | No |
| Tenth Embodiment-20 | 150 | Rounded Face | 3.7~11.3 | 100 | No |

Fig.38
(A)
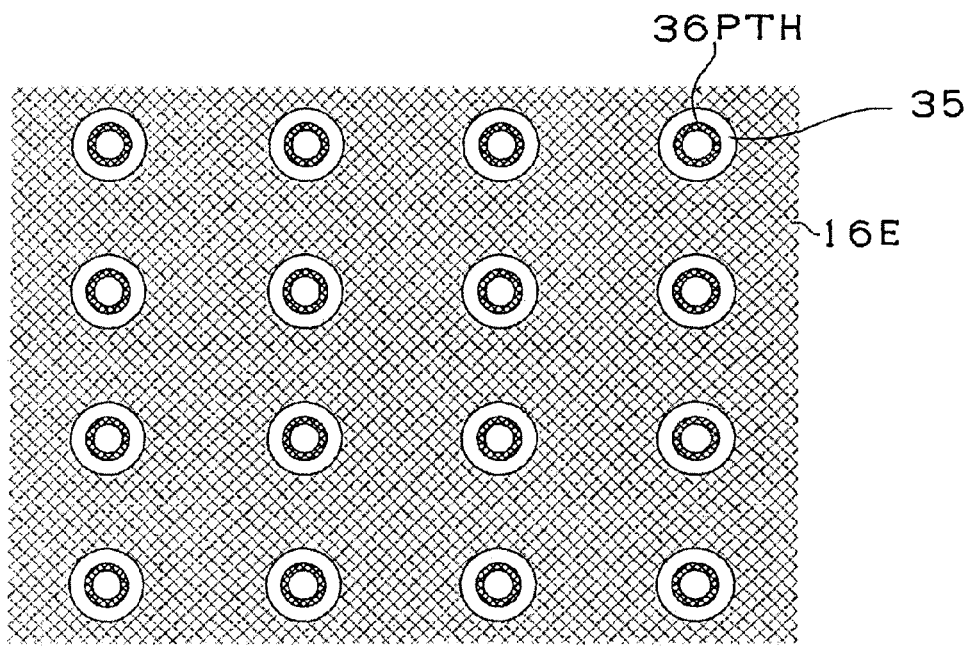
(B)
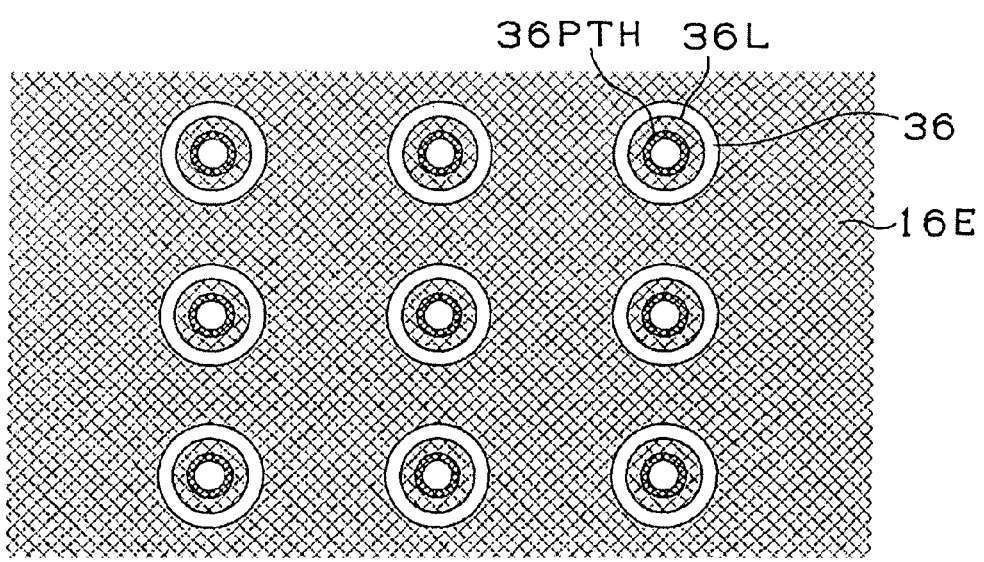

MULTILAYER PRINTED WIRING BOARD

CROSS-REFERENCES TO RELATED APPLICATIONS

The application is a divisional of and claims the benefit of priority under 35 U.S.C. §120 from U.S. Ser. No. 10/564,856, filed Jan. 17, 2006, the entire content is incorporated herein by reference, and claims the benefit of priority under 35 U.S.C. §119 from Japanese Patent Application Nos. 2004-028074, filed Feb. 4, 2004; 2004-029201, filed Feb. 5, 2004; 2004-043068, filed Feb. 19, 2004; and 2004-043069, filed Feb. 19, 2004.

TECHNICAL FIELD

This invention relates to a multilayer printed wiring board and provides a technique related to a multilayer printed wiring board capable of having improved electric characteristics and reliability without causing malfunction, error or the like even if a high frequency IC chip, particularly an IC chip in a high frequency range of 3 GHz or higher is mounted thereon.

BACKGROUND ART

In forming a buildup type multilayer printed wiring board constituting an IC chip package, interlayer insulating resin is formed on one of or each of the surfaces of a core substrate having through holes formed therein and via holes for interlayer conduction are opened by a laser or photo etching, whereby an interlayer resin insulating layer is thereby formed. A conductor layer is formed on the via holes by plating or the like and etching and the like are performed to form a pattern, thus creating a conductor circuit. Further, by repeatedly forming the interlayer insulating layer and the conductor layer, the buildup multilayer printed wiring board is obtained. By forming solder bumps and external terminals (PGA/BGA's or the like) on the front layer of the board at need, the board becomes a substrate capable of mounting an IC chip thereon or a package substrate. The IC chip is C4 (flip-chip) mounted, whereby the IC chip is electrically connected to the substrate.

As prior art of the buildup type multilayer printed wiring board, there are known JP6-260756A and JP6-275959A. In both of the publications, a land is formed on a core substrate having through holes filled with resin filler, interlayer insulating layers having via holes formed therein are provided on the both surfaces of the substrate, respectively, a conductor layer is formed by an additive method and the conductor layer is connected to the land, thereby obtaining a high density multilayer wiring board having fine wirings formed thereon.
Prior Art 1: JP6-260756A is incorporated herein by reference.
Prior Art 2: JP6-275959A is incorporated herein by reference.

DISCLOSURE OF THE INVENTION

Object to be Solve the Invention

However, as the frequency of an IC chip is higher, the frequency of occurrence of malfunction or error becomes higher. Particularly if the frequency of the IC chip exceeds 3 GHz, the frequency of occurrence of malfunction or error considerably increases. If the frequency exceeds 5 GHz, the IC chip often turns inoperative. Due to this, a computer including the IC chip as a CPU cannot perform operations that the computer should do, i.e., cannot perform desired functions and operations such as the recognition of an image, the changeover of a switch and the transmission of data to the outside of the computer.

If the substrate for an IC chip of this type is to be subjected to a non-destructive test and to be dissembled, no problems such as short-circuit or opens do not occur to the substrate itself and if the IC chip having a low frequency (particularly less than 1 GHz) is mounted on the substrate, then no malfunction or error occurs to the IC chip.

To solve the above objection, in Japan patent application No. 2002-233775, the inventors suggested the printed circuit board of which the thickness of the conductor layer in the core substrate is larger than the thickness of the conductor layer on the interlayer insulating layer. However, in the above invention, the insulating clearance between the circuit patterns is narrow in the core substrate having the fine pattern and the printed circuit board has low insulating reliability.

The present invention has been achieved to solve the above-stated disadvantages and the object of the present invention is to provide a multilayer printed wiring board capable of being constituted as a printed board or a package substrate free of malfunction or error even with an IC chip in a high frequency range, particularly, with a frequency exceeding 3 GHz.

A still further object of the present invention is to provide a multilayer printed wiring board having high insulating reliability and high connecting reliability.

Means for Solving the Problem

As a result of accumulated researches for achieving the above-mentioned objects, the inventor and other people have reached an invention having a following content as its configuration.

A first invention of this application exists in a multilayer printed wiring board in which interlayer insulation layer and conductive layer are formed on a core substrate and electric connection is achieved through via holes,
the thickness of conductive layer on the core substrate being larger than the thickness of the conductive layer on interlayer insulation layer, and
the side face of the conductive layer on the core substrate being tapered and when it is assumed that an angle formed by a straight line connecting the top end and bottom end of the side face of the conductive layer and the horizontal face of the core substrate is $\Theta$, the $\Theta$ satisfying a relational equation of $2.8 < \tan \Theta < 55$.

A second invention of this application exists in a multilayer printed wiring board in which interlayer insulation layer and conductive layer are formed on a core substrate and electric connection is achieved through via holes,
the core substrate being a multilayer core substrate composed of three or more layers, having the conductive layers on the front and rear surfaces and a thick conductive layer in the inner layer, and of the conductive layer in the inner layer of the core substrate and the conductive layers on the front and rear surfaces, at least a layer is a conductive layer for power source layer or a conductive layer for grounding.

Further, assuming that an angle formed by a straight line connecting the top end and bottom end of the side face of the conductive layer in the inner layer and the horizontal face of the core substrate is $\Theta$, the $\Theta$ may satisfy a relational equation of $2.8 < \tan \Theta < 55$.

The first advantage of the invention is that by making the conductor layer as the power supply layer of the core substrate thick, it is possible to intensify the strength of the core substrate and that even if the core substrate itself is made thin, it is possible for the substrate itself to relax warps and generated stresses.

The second advantage of the invention is that by making the conductor layers thick, it is possible to increase the volumes of the conductors themselves. By increasing the volumes, it is possible to decrease the resistances of the conductors. Due to this, the electrical transmission of the signal line or the like is not hampered. Accordingly, the loss of the signal transmitted or the like does not occur. This advantage is exhibited by making only the substrate which becomes the core thick. It is preferable, that the thick conductor layer is formed as an inner layer of the core substrate. The interlayer insulating layer on the core substrate and the conductor layer on the interlayer insulating layer can be flattened. Mutual inductance decreases.

The third advantage of the invention is that by employing the conductor layer as the power supply layer, it is possible to improve the capability of supplying power to the IC chip. In addition, by employing the conductor layer as the earth layer, it is possible to decrease the noise superposed on the signal and power to the IC chip. This is because the decreased resistances of the conductors as described as the second advantage can prevent the supply of power from being hampered. Due to this, if the IC chip is mounted on the multilayer printed wiring board, it is possible to decrease a loop inductance from the IC chip—the substrate—the power supply. Accordingly, power shortage in an initial operation is decreased to make it difficult to cause power shortage. Even if the IC chip in a higher frequency range is mounted on the multilayer printed wiring board, malfunction, error or the like does not occur in the initial operation.

As a fourth effect, assuming that the side face of the conductive layer of the core substrate is tapered and an angle formed by a straight line connecting the top end and bottom end of the side face of the conductive layer and the horizontal face of the core substrate (hereinafter, called just angle of the side face of the conductive layer depending on a case) is $\Theta$, the $\Theta$ satisfies the relational equation of $2.8<\tan\Theta<55$ and therefore, a fine structure, prevention of shortage of power and high-speed transmission signal can be achieved at the same time. Because the $\tan\Theta$ is over 2.8, an interval between the bottom ends of the conductive layer can be secured even if the top ends of the conductive layer are disposed near each other. As a consequence, a high-density printed wiring board having a high insulation reliability is obtained. Further, because a through hole and an inner layer conductor of a core substrate, each having an opposite potential can be disposed near each other, inductance can be reduced. Thus, a multilayer printed wiring board easy to prevent the shortage of power can be produced. As a method for bringing both to near each other, it is permissible to adopt a through hole having no dummy land, described later. On the other hand, because the $\tan\Theta$ is less than 55, the side wall of the conductive layer is not at right angle. For the reason, the thickness and diameter of the conductor of the signal through hole (through hole connected to a signal circuit of the IC electrically) do not need to be reduced to match impedance. As a consequence, conductor resistance of the signal through hole can be reduced, which is advantageous for the transmission of high speed signals. Further, if the side face of the conductive layer is tapered, the shortage of power and deterioration of a signal can be prevented at the same time. Because damping of the signal can be reduced in the signal through hole passing through the multilayer core as it is tapered, deterioration of the signal is unlikely to occur. Further, because an angle of the side face of the conductive layer is over a predetermined angle, conductor resistance can be reduced, thereby suppressing the shortage of power. In case of the multilayer core, when it is assumed that the angle of the side face of the conductive layer on the front and rear surfaces is $\Theta 1$ and the angle of the side face of the conductive layer in the inner layer is $\Theta 2$, a relation of $\Theta 1>\Theta 2$ is preferred. The reason is that impedance matching is facilitated on a signal line of built-up layers because the built-up layer is formed of interlayer insulation layer and conductive layer on the core substrate. The reason is that when a signal line of the built-up layer is formed on a taper whose $\Theta 1$ is small, an area in which the thickness of the interlayer insulation layer below the signal line differs increases. Further, because the through hole pitch cannot be decreased, inductance cannot be reduced.

As a result of accumulated researches for achieving the above-mentioned objects, the inventor and other people have reached the first invention having a following content as its configuration. That is, according to a first invention, there is provided a multilayer printed wiring board in which interlayer insulation layer and conductive layer are formed on a core substrate so as to achieve electric connection through via holes, at least one of sums of thicknesses of conductive layers for power source or for grounding of a core substrate is larger than the thicknesses of the conductive layers on interlayer insulation layer.

The feature of the present invention exists in using a multilayer core substrate as the core substrate and not increasing the thickness of conductive layer only on the front and rear surfaces of the core substrate but increasing the sum of respective conductive layers. In case of the multilayer core substrate, the total thickness of the conductive layers on the front and rear surfaces of the core substrate and conductive layer in the inner layer is a thickness for contributing to supply of power to the IC and stabilization thereof. This case is applied when electric connection exists between the conductive layer on the front surface layer and the conductive layer in the inner layer while the electric connections are secured at two or more positions. That is, by adopting the multilayer structure to increase the sum of the thicknesses of the respective conductive layers of the multilayer core substrate and using the conductive layer of the core as a conductive layer for power source, the capacity of supply of power to the IC chip can be improved. Further, by using the conductive layer of the core as a grounding layer, noise which overlaps a signal or power of the IC chip can be reduced and power can be supplied stably to the IC. Thus, when an IC chip is mounted on the multilayer printed substrate, loop inductance from the IC chip to the substrate to power source can be reduced. Thus, shortage of power at the initial operation decreases so that the shortage of power becomes unlikely to occur and thus, even if the IC chip for high frequency region is mounted, malfunction or error at the initial startup is not induced. Further, noise is reduced thereby generating no malfunction or error.

Further, by adopting the multilayer core substrate, the thickness of the respective conductive layers of the multilayer core substrate can be decreased while securing the sum of the thicknesses of the conductive layers of the multilayer core substrate. That is, because an insulation interval between the wiring patterns can be surely secured even if a fine wiring pattern is formed, it is possible to provide a printed wiring board having a high insulation reliability.

As other effect, by increasing the thickness of the conductive layer for power source or grounding of the core substrate, the strength of the core substrate is intensified. Even if the core substrate itself is thinned, warpage or generated stress can be relaxed in the substrate itself.

Further, even if the power is supplied to the IC chip via the IC chip—the substrate—capacitors or the power supply layer—power, the same advantage can be exhibited. The loop inductance can be decreased. For this reason, no loss occurs to the supply of power to the capacitors or dielectric layers. In the first place, the IC chip performs complex arithmetic processings and operations while instantaneously consuming power. By supplying power from the power supply layer to the IC chip, it is possible to supply the power without the need to mount many capacitors even if the IC chip in a high frequency range is mounted and power shortage (a state of the occurrence of voltage drop) occurs in the initial operation. Power shortage (voltage drop) in the initial operation occurs so as to employ the IC chip in the high frequency range. If the conventional IC chip is used, the necessary power is sufficiently supplied by the capacity of the capacitors or dielectric layers.

Particularly if the thickness of the conductor layer serving as the power supply layer of the core substrate is larger than the thickness of the conductor layer on the interlayer insulating layer on each surface or both surfaces of the core substrate, the three advantages stated above can be maximized. The conductor layer on the interlayer insulating layer means herein a conductor layer formed on an interlayer resin insulating layer of build-up part of the build-up printed circuit board (In the present invention, 58, 158 in FIG. 27)

The power supply layer of the core substrate may be arranged on the upper surface layer, lower surface layer or at least one of inner layers of the substrate or in a plurality layers. If the power supply layer is formed on the inner layer, a plurality of layers of two or more may be arranged. The other layers can be used as earth layers. Basically, as long as the power supply layer of the core substrate is thicker than the conductor layer of the interlayer insulating layer, the advantage of the power supply layer can be exhibited. The power supply layers and the earth layers are desirably placed alternately, to improve an electric character.

It is, however, preferable to form the power supply layer on the inner layer. If it is formed on the inner layer, the power supply layer is arranged between the IC chip and the external terminals or capacitors. Due to this, the distances between the IC chip and the external terminals or capacitors are uniform, which decreases hampering factors and can suppress power shortage.

Further, according to the present invention, a multilayer printed wiring board having an interlayer insulating layer and a conductor layer formed on a core substrate, the conductor layer being electrically connected through a via hole, is characterized in that if a thickness of the conductor layer on said core substrate is $\alpha 1$ and a thickness of the conductor layer on the interlayer insulating layer is $\alpha 2$, $\alpha 1$ and $\alpha 2$ satisfy $\alpha 2 < \alpha 1 \leq 40\alpha 2$.

At $\alpha 1 \leq \alpha 2$, the advantage against the power shortage is not exhibited at all. That is, it is not clear that the voltage drop which occurs in the initial operation is suppressed.

A case in which $\alpha 1$ exceeds $40\alpha 2$ ($\alpha 1 > 40\alpha 2$) has been also considered. However, the electrical characteristics of $\alpha 1$ are basically equal to those of $40\alpha 2$. That is, it is understood that $40\alpha 2$ is a critical point of the advantage of the present application. Even if $\alpha 1$ is larger than $40\alpha$, the improvement of the electrical advantage cannot be expected. Nevertheless, if $\alpha 1$ exceeds $40\alpha$ and the conductor layer is formed on the surface layer of the core substrate, it is difficult to form lands or the like for the connection of the conductor layer to the core substrate. If the further upper interlayer insulating layer is formed, irregularities grow and waviness sometimes occurs to the interlayer insulating layers and impedances cannot be matched. However, that range ($\alpha 1 > 40\alpha 2$) does not often cause any problem depending on the materials.

It is more preferable that $\alpha 1$ satisfies $1.2\alpha 2 \leq \alpha 1 \leq 40\alpha 2$. It is confirmed that the malfunction, error or the like of the IC chip due to the power shortage (voltage drop) does not occur.

The core substrate means herein a resin substrate the core material of which, such as glass epoxy resin, is impregnated, a ceramic substrate, a metal substrate, a composite core substrate using a combination of resin, ceramic and metal, a substrate having a (power supply) conductor layer provided on the inner layer of the substrate, a multilayer core substrate having three or more conductor layers formed thereon, or the like.

To make the conductor of the power supply layer thick, the conductor layer may be formed on the substrate buried with metal by an ordinary method in relation to the printed wiring board for forming the conductor layer by plating, sputtering or the like.

If the substrate is the multilayer core substrate, said $\alpha 1$ means the sum of the thickness of the conductor layer on the surface layer of the core substrate and that of the conductor layer on the inner layer of the core substrate is equal to the thickness of the conductor layers of the core. In this case, the multilayer wiring board is employed if the conductor layer on the surface layer is electrically connected to the conductor layer on the inner layer and the electrical connection thereof is established in two or more portions. That is, even if the number of layers increases, the thickness of the conductor layers of the core substrate is to be increased but the advantage remains the same. Further, if the area of a conductor layer is almost equal to that of a pad or a land, the thickness of the conductor layer is not considered to be added. It is preferable that the conductor layer is the power supply layer or the earth layer.

In this case, the core substrate may comprise three layers (surface layers+inner layer). A multilayer core substrate comprising three or more may be used.

If necessary, such components as capacitors, dielectric layers or resistances may be buried in the inner layer of the core substrate and an electric component containing core substrate thus formed may be used.

Further, if the conductor layer on the inner layer of the core substrate is made thick, it is preferable to arrange the conductor layers right under the IC chip. By arranging the conductor layers right under the IC chip, it is possible to minimize the distance between the IC chip and the power supply layer and to thereby further decrease the loop inductance. Accordingly, power is supplied more efficiently and the power shortage problem is solved. At this time, it is preferable that if the thickness of the conductor layer on the core substrate is $\alpha 1$ and the thickness of the conductor layer on the interlayer insulating layer is $\alpha 2$, $\alpha 1$ and $\alpha 2$ satisfy $\alpha 2 < \alpha 1 \leq 40\alpha 2$.

In case of a multilayer printed wiring board having a plurality of layers made of materials equal in thickness and built up, the layer having the power supply layer as the conductor layer on the printed board or the substrate is defined as the core substrate.

It is also preferable that the multilayer core substrate is such that a relatively thick conductor layer is provided on the inner layer, a relatively thin conductor layer is provided on the surface layer and that the conductor layer on the inner layer is a conductor layer mainly for a power supply layer or an earth. (Relatively thick and relatively thin mean herein that if the thicknesses of all the conductor layers are compared and there are a relatively thick layer and a relatively thin layer, then the inner layer is relatively thick to the other conductor layers and the surface layer is relatively thin.) The surface conductive layer can be used as the power supply of the earth, one surface layer can be used as the power supply and the other surface can be used as the earth.

Namely, by arranging the thick conductor layer on the inner layer side, it is possible to form the resin layer to cover the conductor layer on the inner layer and ensure the flatness of the core even if the thickness of the thick conductor layer is arbitrarily changed. Due to this, waviness does not occur to the conductor layer of the interlayer insulating layer. Even if the thin conductor layer is arranged on the surface layer of the multilayer core substrate, it is possible to secure a sufficient thickness of the conductor layers as those of the core by adding together the thicknesses of the thin conductor layer and the conductor layer on the inner layer. By employing the conductor layers for power supply layers or earth layers, it is possible to improve the electrical characteristics of the multilayer printed wiring board.

The thickness of the conductor layer on the inner layer of the core substrate is made larger than the thickness of the conductor layer on the interlayer insulating layer. By doing so, even if the conductor layer is arranged on the surface of the multilayer core substrate, it is possible to secure the sufficient thickness of the conductor layers of the core by adding together the thicknesses of the conductor layer on the surface of the substrate and the thick conductor layer on the inner layer. Namely, even if a large capacity of power is supplied, the IC chip can be actuated without causing any problems, so that no malfunction or operational defect occurs to the IC chip. At this time, it is preferable that if the thickness of the conductor layer on the core substrate is $\alpha 1$ and the thickness of the conductor layer on the interlayer insulating layer is $\alpha 2$, $\alpha 1$ and $\alpha 2$ satisfy $\alpha 2 < \alpha 1 \leq 40\alpha 2$.

Further, according to the present invention, a multilayer printed wiring board having an interlayer insulating layer and a conductor layer formed on a core substrate, the conductor layer being electrically connected through a via hole, is characterized in that if a total thickness of the conductor layers for earth on said core substrate is $\alpha 3$ and a thickness of the conductor layer on the interlayer insulating layer is $\alpha 2$, $\alpha 3$ and $\alpha 2$ satisfy $\alpha 2 < \alpha 3 \leq 40\alpha 2$.

In the range, the noise on the signal power supply to the IC chip can be reduced. The power supply to the IC has high reliability. In the rage of $1.2\alpha 2 < \alpha 3 \leq 40\alpha 2$, the advantage can be improved.

In case of a multilayer core substrate, it is preferable that the conductor layer on the inner layer is made relatively thick and used as a power supply layer, and that the conductor layers on the surface layer are formed to put the conductor layer on the inner layer therebetween and used as signal lines. With this structure, it is possible to intensify power as described above.

Furthermore, by arranging the signal line between the conductor layers in the core substrate, it is possible to form a micro-strip structure. Due to this, it is possible to decrease inductance and to match impedances to one another. It is thereby possible to stabilize the electric characteristics of the multilayer printed wiring board. It is further preferable that the conductor layer on the surface layer is relatively thin. The through hole pitch of the core substrate may be not more than 600 μm.

It is preferable that the multilayer core substrate is constituted so that the conductor layer on the inner layer is formed on the each surface of the metallic plate electrically connected to the conductor layer through a resin layer and that the conductor layer on the surface is formed outside of the inner layer conductor layer through a resin layer. By arranging the electrically insulated metallic plate in the central portion, it is possible to secure sufficient mechanical strength. Further, by forming the inner layer conductor layer on each surface of the metallic plate through the resin layer and forming the surface conductor layer outside of the inner layer conductor layer through the resin layer, it is possible to impart symmetry to the both surfaces of the metallic plate and to prevent the occurrence of warps, waviness and the like in a heat cycle and the like.

The multilayer core substrate may be constituted so that the conductor layer on the inner layer is formed on the each surface of the metallic plate, low coefficient of thermal expansion metal like a 36 alloy or 42 alloy, electrically connected to the conductor layer through an insulating layer and that the conductor layer on the surface is formed outside of the inner layer conductor layer through an insulating layer. By arranging the electrically insulated metallic plate in the central portion, it is possible to bring close the coefficient of thermal expansion in X-Y direction on the printed circuit board and the IC thereof. A small part heat cycle character of the resin layer of the interference between the printed circuit board and the IC can be improved. Further, by forming the inner layer conductor layer on each surface of the metallic plate through the insulating layer and forming the surface conductor layer outside of the inner layer conductor layer through the insulating layer, it is possible to impart symmetry to the both surfaces of the metallic plate and to prevent the occurrence of warps, waviness and the like in a heat cycle and the like.

In FIG. 22, the vertical axis indicates voltage supplied to the IC chip and the horizontal axis indicates passage of time. In FIG. 22, printed wiring boards without capacitors for the power supply of IC chip with high frequency of 1 GHz or higher are used as models. A curve A shows the change of the voltage to an IC chip with 1 GHz with the passage of time, and a curve B shows the change of the voltage to an IC chip with 3 GHz with the passage of time. According to each voltage change with time, when the IC chip starts to be actuated, a large quantity of power may be instantaneously required. If the supply of power is insufficient, voltage drops (at point X or X'). Thereafter, the power to be supplied is gradually added, so that the voltage drop is eliminated. However, if the voltage drops, malfunction or error tends to occur to the IC chip. That is, a defect caused by the insufficient function or actuation of the IC chip due to lack of the supply of power occurs. This power shortage (voltage drop) grows as the frequency of the IC chip is higher. Due to this, it takes time to solve the voltage drop problem and a time lag occurs in allowing the IC to perform a desired function or actuating the IC.

To compensate for the power shortage (voltage drop), the IC chip is connected to an external capacitor and the power accumulated in the capacitor is discharged, whereby the power shortage or voltage drop problem can be solved.

In FIG. 23, printed boards with capacitors are used as models. A curve C shows the change of the voltage to the IC chip with 1 GHz with the passage of time if a small capacity of a capacitor is mounted on the board. Compared with the curve A which shows a case where the capacitor is not mounted, the degree of the voltage drop of the curve C is low. Further, a curve D shows the change of the voltage to the IC with the passage of time similarly to the curve C if a capacitor larger in capacity than the capacitor mounted in case of the curve C. Compared with the curve C, the degree of the voltage drop of the curve D is lower. Thus, in case of the curve D, it is possible to function and actuate a desired chip in short time. However, as shown in FIG. 22, if the frequency of the IC chip is higher, a larger capacity of the capacitor may be required.

As a result, the region on which the capacitor is mounted needs to be established. Therefore it is difficult to secure the voltage, it is impossible to improve the operation and function of the IC chip and it is difficult to improve the density of the IC chip.

FIG. 24 is a graph if the thickness of the conductor layer of the core substrate and that of the conductor layer as the power supply is $\alpha 1$ and that of the conductor layer on the interlayer insulating layer is $\alpha 2$. In FIG. 24, a curve C shows the change of the voltage with the passage of time if a small capacity of a capacitor is mounted on an IC chip with 1 GHz and $\alpha 1 = \alpha 2$. A curve F shows the change of the voltage with the passage of time if a small capacity of a capacitor is mounted on the IC chip with 1 GHz and $\alpha 1 = 1.5\alpha 2$. A curve E shows the change of the voltage with the passage of time if a small capacity of a capacitor is mounted on the IC chip with 1 GHz and $\alpha 1 = 2.0\alpha 2$. As the conductor layer of the core is thicker, the power shortage or voltage drop becomes lower. Due to this, it may be said that the malfunction of the IC chip less occurs. By making the conductor layer of the core substrate and the conductor layer as the power supply layer thick, the volumes of the conductor layers increase. If the volumes increase, the conductor resistances decrease, so that the loss of the power to be transmitted to the voltage or current is eliminated. As a result, power is supplied while the transmission loss between the IC chip and the power supply is lowered, no malfunction or error occurs to the IC chip. This is mainly thanks to the thickness of the conductor layer as the power supply layer; by making the conductor layer as the power supply layer of the core substrate thicker than that on the other interlayer insulating layer, the advantage can be exhibited.

Furthermore, it is discovered that the advantage attained if the conductor formed on the surface layer on one surface or each surface of the core substrate and the conductor layer as the power supply layer are made thick can be also exhibited if the multilayer core substrate which comprises three or more layers is used and in which the conductor layer is formed on the inner layer or the conductor layer as the power supply layer is formed on the inner layer. Namely, the advantage of decreasing power shortage or voltage drop can be exhibited. If the multilayer core substrate is employed, this advantage is exhibited when the sum of the thicknesses of all the conductor layers is larger than the thicknesses of the conductor layers on the interlayer insulating layers even if the thicknesses of the all the conductor layers and conductor layers for the power supply layers are smaller than the thicknesses of the conductor layers on the interlayer insulating layers or even if the thicknesses of the all the conductor layers and conductor layers for the power supply layers are equal to or smaller than the thicknesses of the conductor layers on the interlayer insulating layers. In this case, there is no difference in area among the conductor layers. In other words, this advantage is exhibited when all the conductor layers are equal in area. For example, if two conductor layers are provided, the one is a solid layer having a large area and the other has an area as small as a via hole or the land thereof, then the advantage of the one conductor layer is canceled by the other conductor layer.

Furthermore, even if the core substrate includes electronic components such as capacitors, dielectric layers or resistances, this advantage is conspicuously exhibited. By including the electronic components in the substrate, it is possible to shorten the distance between the IC chip and each capacitor or dielectric layer. It is, therefore, possible to decrease the loop inductance. It is possible to decrease the power shortage or voltage drop. In case of the core substrate including therein capacitors or dielectric layers, for example, by making the thicknesses of the conductor layers of the core substrate and the conductor layers as the power supply layer larger than the conductor layers on the interlayer insulating layers, it is possible to decrease the resistances of the conductors of both the main power supply and the power of the included capacitors or dielectric layer, thereby making it possible to decrease transmission loss and to further exhibit the advantage of the substrate including therein capacitors.

As the core substrate, the resin substrate is employed. However, it is discovered that the ceramic or metal core substrate exhibits the same advantage. As the material of the conductor layer, copper is employed. Even if the other metals are employed, it is not confirmed that the advantage is cancelled and malfunction or error occurs to the IC chip. It, therefore, appears that the advantage is not influenced by the difference in the material of the core substrate or the difference in the material of the conductor layers. It is more preferable that the conductor layers of the core substrate and those of the interlayer insulating layer are made of the same metal. This is because the advantages of the present application can be exhibited since there is no difference in such characteristics as electrical characteristics and the coefficient of thermal expansion and physical properties between the conductor layers of the core substrate and those of the interlayer insulating layers.

Effect of the Invention

According to the present invention, resistance of conductor of the IC chip to the substrate to power source can be reduced thereby reducing transmission loss. For the reason, desired performances of a transmitted signal and power are exerted. Thus, the IC chip functions and operates properly and thus no malfunction or error is generated. Resistance of conductor of the IC chip to the substrate to grounding can be reduced and overlapping of noise on the signal line and power line is reduced to prevent a malfunction or error.

Further, according to the present invention, it is evident that the degree of the shortage of power (voltage drop) generated at the initial startup of the IC chip decreases and even if an IC chip for high frequency region, particularly, an IC chip for 3 GHz or more is mounted, it is evident that it can be started without any problem. Thus, the electric characteristic and electric connectivity can be improved.

By forming the core substrate into a multilayer structure to increase the sum of the thicknesses of the conductive layers, a printed wiring board having an excellent insulation reliability can be produced.

Further, resistance within a circuit of the printed wiring board can be reduced more as compared with a conventional printed wiring board. Thus, even if reliability test (high temperature/high humidity bias test) to be executed under high temperature/high humidity is carried out by applying bias, it takes long for destruction and thus, the reliability is improved.

Because resistance of the conductive layer for power source drops, generation of heat can be suppressed even if a large amount of electricity flows. The same thing can be said of the grounding layer. At this point, malfunction is made hard to occur, so that reliability of the printed wiring board after the IC is mounted is raised.

Further, assuming that the side face of the conductive layer of the core substrate is tapered (linear taper shown in FIG. 27(B) or rounded taper shown in FIG. 27(C)) and an angle formed by the straight line connecting the top end and the bottom end of the side face of the conductive layer and the horizontal face of the core substrate is $\Theta$, if the multilayer printed wiring board using the multilayer core substrate shown in FIG. 27(A) is exemplified, when an angle formed by the straight line connecting the top end and bottom end of the side face of a conductive layer 16E in the inner layer of the core substrate and the core substrate is Θ, it is preferable that the Θ satisfies the relational equation of 2.8<tan Θ<55. The same thing can be said of 16P. By forming such a conductive layer, the reliability does not drop even if a thick conductive layer is formed. Further, malfunction of the IC due to delay of signal, shortage of signal strength and the like are unlikely to occur. Because the volume of the conductive layer is reduced if the tan Θ decreases, delay is likely to occur in supply of power to the IC. On the other hand, if the tan Θ increases, signal strength likely deteriorates in the through hole. The reason for the deterioration in signal strength will be described about an example of the 4-layer core in which the conductive layer in the inner layer is thick. An attention is paid to the signal through hole (through hole connected to a signal circuit of the IC electrically) which passes through the multilayer core. As shown in FIG. 31, from the top, the signal through hole passes through insulation layer 1, ground layer, insulation layer 2, power source layer and insulation layer 3. Because in the signal wiring, impedance changes depending on whether or not there is a ground or power source in the surrounding, the value of impedance differs across an interface X1 between the insulation layer 1 and the ground layer. Thus, reflection of signal occurs on that interface. The same thing occurs on X2, X3, X4. The change amount of impedance increases as a distance between the signal through hole and ground layer or power source layer decreases or the thickness of ground layer and the power source layer increases. For the reason, signal deterioration likely occurs in a through hole in the multilayer core including a thick conductive layer in its inner layer. It is preferable to set the value of the tan Θ small in order to prevent it. Because by decreasing the value of the tan Θ, an interval between the signal through hole and the conductive layer in the inner layer expands gradually in a sectional direction even if the minimum interval between the signal through hole and the conductive layer in the inner layer is set equal, that is, the same density is secured, the change amount of impedance decreases. Because this problem likely occurs if an IC having a larger drive frequency is mounted, it is preferable that the tan Θ is less than 11.4 or particularly less than 5.7.

BRIEF DESCRIPTION OF THE DRAWINGS

FIGS. 2(A), (B), (C), (D) and (E) are process diagrams showing the manufacturing method of the multilayer printed wiring board according to the first embodiment-1;

FIGS. 3(A), (B), (C) and (D) are process diagrams showing the manufacturing method of the multilayer printed wiring board according to the first embodiment-1;

FIGS. 4(A), (B) and (C) are process diagrams showing the manufacturing method of the multilayer printed wiring board according to the first embodiment-1;

FIGS. 5(A) and (B) are process diagrams showing the manufacturing method of the multilayer printed wiring board according to the first embodiment-1;

FIG. 23 is a graph showing changes in voltage during the operation of the IC chip;

FIG. 24 is a graph showing changes in voltage during the operation of the IC chip;

FIG. 25 is a table showing test results of the embodiments;

FIG. 26 is a table showing test results of the embodiments and the comparative examples;

FIG. 27(A) is a sectional view of the multilayer printed wiring board according to the seventh embodiment, and FIGS. 27(B), (C) are the explanatory view enlarging the conductive layers surrounded by the circle b;

FIG. 28 is a table showing test results of a seventh embodiment;

FIG. 30 is a table showing test results of an eight embodiment;

FIG. 32 is a table showing test results of a ninth embodiment;

FIG. 33 is a table showing test results of the ninth embodiment;

FIG. 34 is a table showing test results of the ninth embodiment;

FIG. 36 is a table showing test results of the ninth embodiment;

FIG. 37 is a table showing test results of a tenth embodiment;

FIG. 38(A) is a lateral sectional view of the inner layer of the multilayer core board showing having no dummy land, FIG. 38(B) is a lateral sectional view of the inner layer of the multilayer core board showing having dummy land.

BEST MODES FOR CARRYING OUT THE INVENTION

Embodiment 1

Glass Epoxy Resin Substrate

Figure 1:
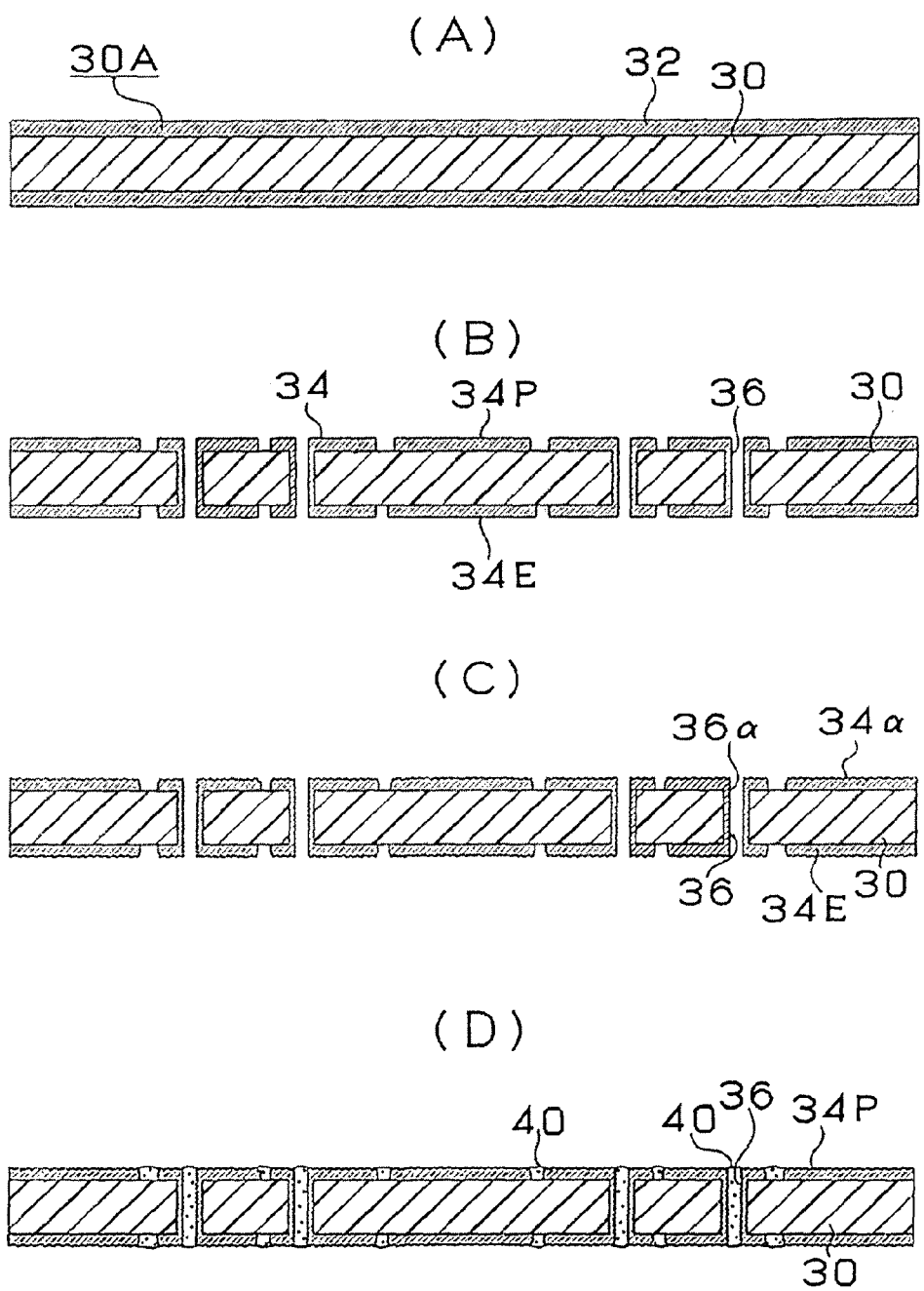
FIGS. 1(A), (B), (C) and (D) are process diagrams showing the manufacturing method of the multilayer printed wiring board according to a first embodiment of the present invention.
Figure 6:
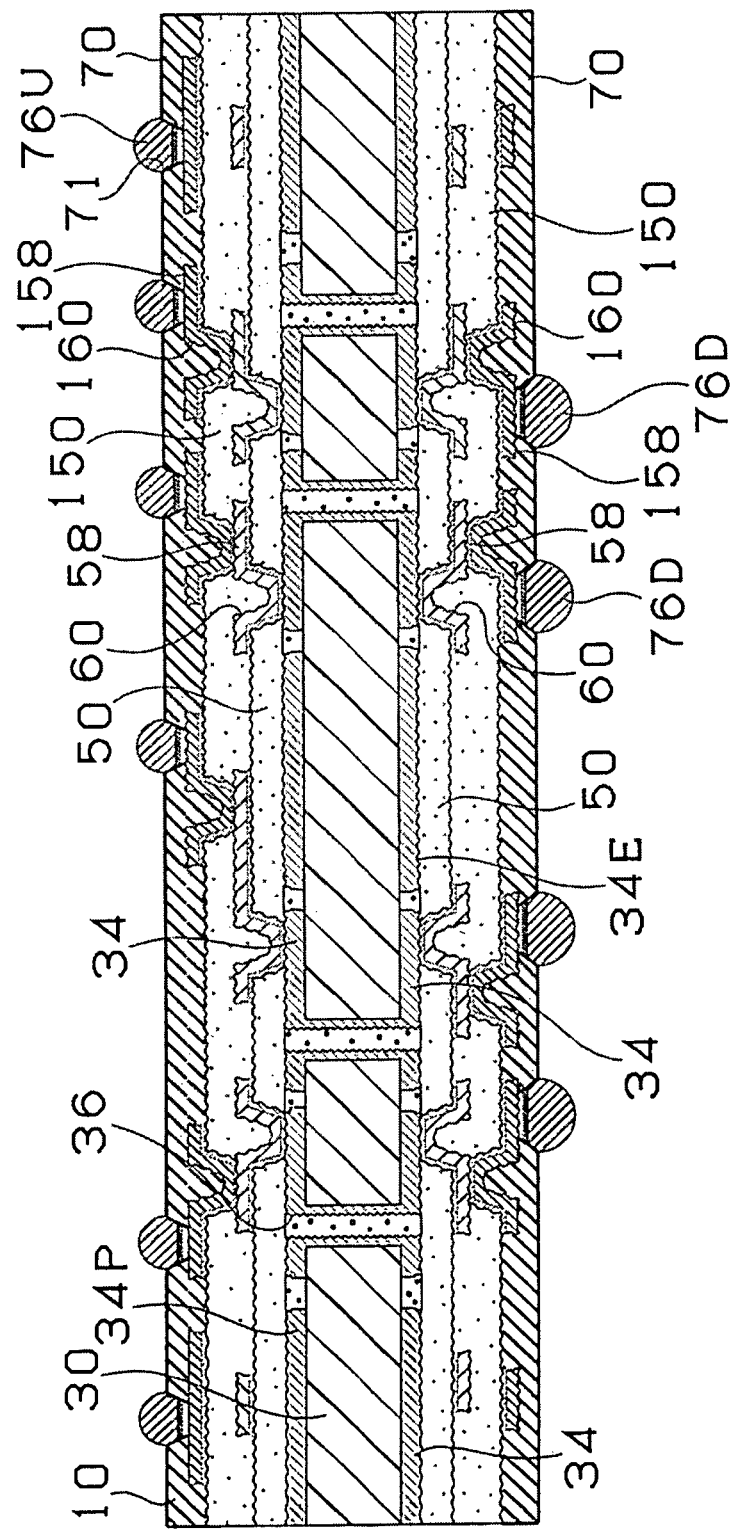
FIG. 6 is a sectional view of the multilayer printed wiring board according to the first embodiment.
Figure 7:
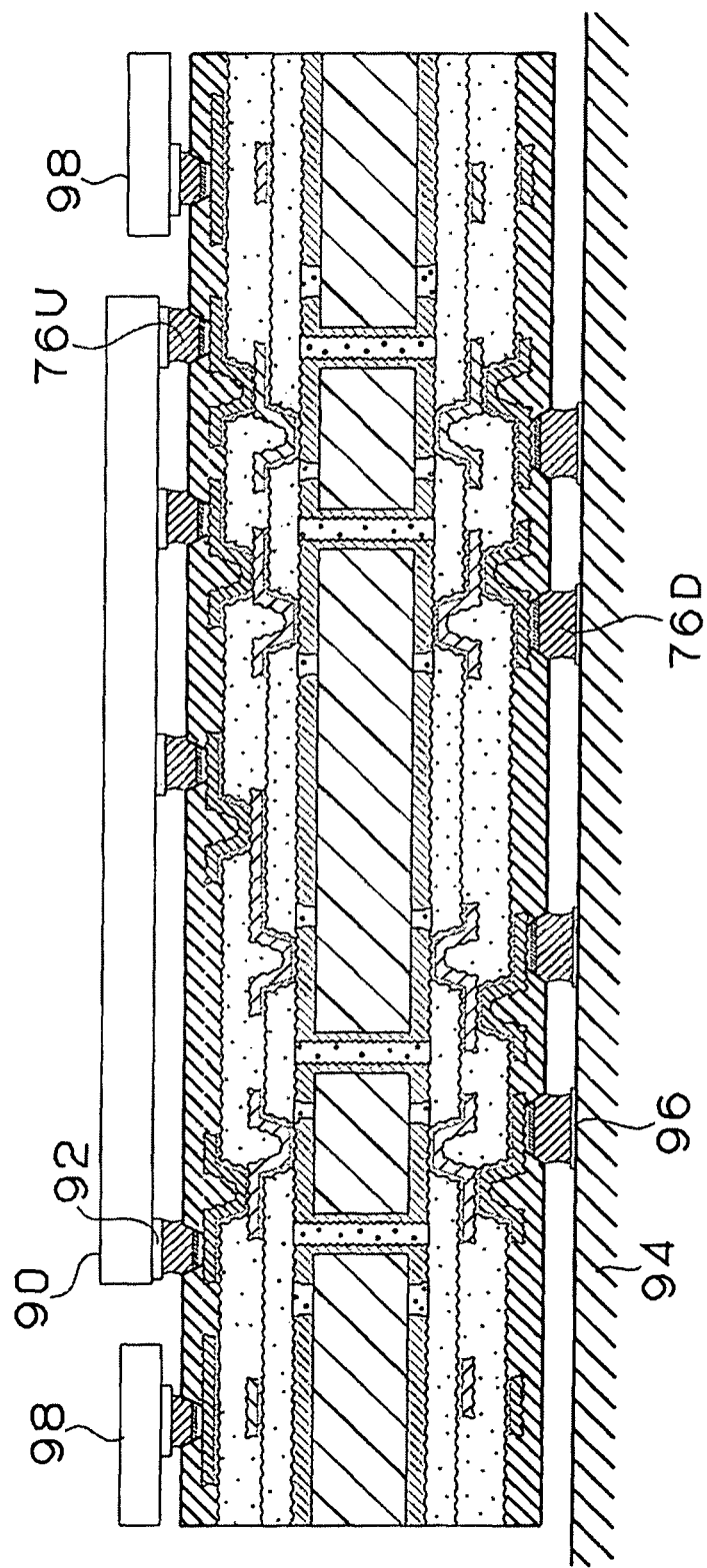
FIG. 7 is a sectional view showing a condition in which the IC chip is mounted on the multilayer printed wiring board according to the first embodiment.

The configuration of a multilayer printed wiring board 10 according to Embodiment 1 of the present invention will first be described with reference to FIGS. 1 to 7. FIG. 6 shows the cross section of the multilayer printed wiring board 10 and FIG. 7 shows a state in which an IC chip 90 is attached to the multilayer printed wiring board 10 shown in FIG. 6 and in which the board 10 is mounted on a daughter board 94. As shown in FIG. 6, the multilayer printed wiring board 10 has a conductor circuit 34 and a conductor layer 34P formed on the front surface of a core substrate 30, and a conductor circuit 34 and a conductor layer 34E formed on the rear surface of the core substrate 30. The upper conductor layer 34P is formed as a power supply plane layer while the lower conductor layer 34E is formed as an earth plane layer. The front and rear surfaces of the core substrate 30 are connected to each other via through holes 36. In addition, an interlayer resin insulating layer 50 on which via holes 60 and conductor circuits 58 are formed and an interlayer resin insulating layer 150 on which via holes 160 and conductor circuits 158 are formed are provided on each of the conductor layers 34P and 34E. Solder resist layers 70 are formed on upper layers of the via holes 160 and the conductor circuits 158, and bumps 76U and 76D are formed on the via holes 160 and the conductor circuits 158 through the opening portions 71 of the solder resist layers 70, respectively.

As shown in FIG. 7, solder bumps 76U on the upper surface of the multilayer printed wiring board 10 are connected to lands 92 of the IC chip 90. Further, chip capacitors 98 are mounted on the board 10. Solder bumps 76D on the lower surface thereof are connected to lands 96 of the daughter board 94.

The conductor layers 34P and 34E on the core substrate 30 are each formed to have a thickness of 1 to 250 μm, and the conductor circuits 58 on the interlayer resin insulating layers 50 and the conductor circuits 158 on the interlayer resin insulating layers 150 are each formed to have a thickness of 5 to 25 μm (preferably 10 to 20 μm).

On the multilayer printed wiring board according to Embodiment 1, the power supply layer (conductor layer) 34P and the conductor layer 34E of the core substrate 30 are made thick, thereby intensifying the strength of the core substrate, for which reason it is possible for the core substrate itself to relax warps and generated stresses even if the core substrate is made thin.

Furthermore, it is possible to increase the volumes of the conductors themselves by making the conductor layers 34P and 34E thick and to decrease the resistances of the conductors by increasing the volumes thereof.

In addition, by employing the conductor layer 34P as a power supply layer, it is possible to improve the capability of supplying power to the IC chip 90. Due to this, when the IC chip is mounted on the multilayer printed wiring board, it is possible to decrease a loop inductance of the IC chip—the substrate—the power supply. Accordingly, power shortage in an initial operation is decreased to make it difficult to cause power shortage. Therefore, even if the IC chip in a higher frequency range is mounted on the multilayer printed wiring board, malfunction, error or the like does not occur in the initial operation. Besides, by employing the conductor layer 34E as an earth layer, noise does not superpose on the signal of the IC chip and the supply of power to the IC chip, thus making it possible to prevent malfunction or error.

A method for manufacturing the multilayer printed wiring board 10 described above with reference to FIG. 6 will next be described with reference to FIGS. 1 to 5.

Embodiment 1-1

A. Manufacturing of Resin Film of Interlayer Resin Insulating Layer 29 parts by weight of bisphenol A type epoxy resin (epoxy equivalent weight of 455, Epicoat 1001 manufactured by Yuka Shell Epoxy), 39 parts by weight of cresol novolac type epoxy resin (epoxy equivalent weight of 215, EpiclonN-673 manufactured by Dainippon Ink and Chemicals) and 30 parts by weight of phenol novolac resin including a triazine structure (phenol hydroxyl group equivalent weight of 120, PhenoliteKA-7052 manufactured by Dainippon Ink and Chemicals) are heated and molten while being agitated with 20 parts by weight of ethyl diglycol acetate and 20 parts by weight of solvent naphtha, and 15 parts by weight of terminally epoxidized polybutadiene rubber (DenalexR-45EPT manufactured by Nagase Chemicals Ltd.) and 1.5 parts by weight of crushed product of 2-phenyl-4,5-bis(hydroxymethyl) imidazole, 2.5 parts by weight of pulverized silica and 0.5 parts by weight of silicon-based defoaming agent are added thereto, thereby preparing an epoxy resin composition.

The obtained epoxy resin composition is coated on a PET film having a thickness of 38 μm so as to have a thickness of 50 μm after being dried by a roll coater and dried for 10 minutes at 80 to 120° C., thereby manufacturing a resin film for an interlayer resin insulating layer.

B. Preparation of Resin Filler 100 parts by weight of bisphenol F type epoxy monomer (manufactured by Yuka Shell, molecular weight: 310, YL983U), 170 parts by weight of $SiO_2$ spheroidal particles having a silane coupling agent coated on surfaces thereof, a mean particle size of 1.6 μm, and a largest particle size of not more than 15 μm (manufactured by ADTEC Corporation, CRS 1101-CE) and 1.5 parts by weight of leveling agent (manufactured by Sannopuko KK, PelenolS4) are input in a container and agitated and mixed therein, thereby preparing resin filler having a viscosity of 44 to 49 Pa·s at 23±1° C. As hardening agent, 6.5 parts by weight of imidazole hardening agent (manufactured by Shikoku Chemicals, 2E4MZ-CN) is used. As the resin filler, thermosetting resin such as the other epoxy resin (e.g., bisphenol A type, novolac type or the like), polyimide resin or phenol resin may be used.

C. Manufacturing of Multilayer Printed Wiring Board (1) A copper-clad laminate 30A having copper foils 32 of 5 to 250 μm laminated on the both surfaces of an insulative substrate 30 made of glass epoxy resin or BT (Bismaleimide-Triazine) resin, respectively, is used as a starting material (FIG. 1(A)). First, this copper-clad laminate 30A is drilled, subjected to an electroless plating treatment and an electroplating treatment, and etched into a pattern to thereby form conductor circuits 34, conductor layers 34P and 34E and through holes 36 on the both surfaces of the substrate, respectively (FIG. 1(B)).

(2) After washing and drying the substrate 30 having the through holes 36 and the lower layer conductor circuits 34 formed thereon, an oxidization treatment using an aqueous solution containing NaOH (10 g/l), NaClO2 (40 g/l) and $Na_3PO_4$ (6 g/l) as a blackening bath (an oxidation bath) and a reduction treatment using an aqueous solution containing NaOH (10 g/l) and NaBH4 (6 g/l) as a reduction bath are conducted to the substrate 30, thereby respectively forming roughened surfaces 36α in the through holes 36 and roughened surfaces 34α on the entire surfaces of the conductor circuits 34 and the conductor layers 34P and 34E (FIG. 1(C)).

(3) After preparing the resin filler described in B above, within 24 hours of preparation, according to the following method, layers of the resin filler 40 are formed in the through holes 36 and on the conductor circuit unformed portions of the substrate, respectively (FIG. 1(D)).

Namely, a resin filling mask having openings in portions corresponding to the through holes and the conductor circuit unformed portions is put on the substrate, and the resin filler 40 is filled into the through holes, depressed lower layer conductor circuit unformed portions and the outer edges of the lower layer conductor circuits with a squeegee and then dried at 100° C. for 20 minutes.

(4) One of the surfaces of the substrate which has been subjected to the treatment of (3) is polished by belt sander polishing using #600 belt abrasive paper (manufactured by Sankyo Rikagaku Co.) so as not to leave the resin filler 40 on the outer edges of the conductor layers 34P and 34E and those of the lands of the through holes 36, and the entire surfaces of the conductor layers 34P and 34E (including the land surfaces of the through holes) are then buffed to remove scratches caused by the belt sander polishing. A series of these polishing treatments are similarly conducted to the other surface of the substrate. The resin filler 40 is then heated at 100° C. for 1 hour and at 150° C. for 1 hour and hardened (FIG. 2(A)).

As a result, a substrate in which the surface layer portions of the resin fillers 40 formed in the through holes 36 and on the conductor circuit unformed portions and the surfaces of the conductor layers 34P and 34E are flattened, the resin fillers 40 are fixedly attached to the side surfaces of the conductor layers 34P and 34E through the roughened surfaces and the inner wall surfaces of the through holes 36 are fixedly attached to the resin fillers through the roughened surfaces, is obtained. That is to say, through the steps, the surfaces of the resin fillers become almost flush with those of the lower layer conductor circuits.

The conductor layers of the core substrate are formed to have a thickness of 1 to 250 μm and the conductor layer serving as the power supply layer and formed on the core substrate is formed to have a thickness of 1 to 250 μm. Here in Embodiment 1-1, the conductor layers of the core substrate are formed to have a thickness of 30 μm and the conductor layer serving as the power supply layers and formed on the core substrate is formed to have a thickness of 30 μm using the copper foils of 40 μm. However, the thicknesses of the conductor layers may exceed the above thickness range.

(5) After washing and acid-degreasing the substrate, soft etching is conducted to the substrate and etchant is sprayed onto the both surfaces thereof to etch the surfaces of the conductor circuits 34, the conductor layers 34P and 34E and the land surfaces of the through holes 36, thereby forming roughened surfaces 36β on the entire surfaces of the respective conductor circuits (see FIG. 2(B)). As the etchant, etchant (manufactured by Mech Corporation, Mech-Etch Bond) comprising 10 parts by weight of an imidazole copper (II) complex, 7.3 parts by weight of glycolic acid and 5 parts by weight of potassium chloride is used.

(6) Interlayer resin insulating layer resin films 50γ slightly larger than the substrate manufactured in A are put on the both surfaces of the substrate, respectively, temporarily press-fitted under conditions of pressure of 0.45 MPa, a temperature of 80° C. and press-fit time of 10 seconds and cut, and then bonded using a vacuum laminator by the following method, thereby forming interlayer resin insulating layers (FIG. 2(C)). Namely, the interlayer resin insulating layer resin films are actually press-fitted onto the substrate under conditions of vacuum of 67 Pa, pressure of 0.47 MPa, a temperature of 85° C. and press-fit time of 60 seconds, and then thermally hardened at 170° C. for 40 minutes.

(7) Next, openings 50a for via holes are formed to have a diameter between 60 to 100 μm in the interlayer resin insulating layers 2 by a CO2 gas laser at a wavelength of 10.4 μm under conditions of a beam diameter of 4.0 mm, a top hat mode, a pulse width of 3.0 to 8.1 microseconds, the passthrough hole diameter of the mask of 1.0 to 5.0 mm and 1 to 3 shots (FIG. 2(D)). In this case, the openings 50a are formed to have diameters 60 μm and 75 μm.

(8) The substrate having the via hole openings 50a formed therein is immersed in a solution containing 60 g/l of permanganic acid at a temperature of 80° C. for 10 minutes to melt and remove epoxy resin particles existing on the surfaces of the interlayer resin insulating layers, thereby forming roughened surfaces 50a on the surfaces of the respective interlayer resin insulating layers 50 including the inner walls of the via hole openings 50a (FIG. 2(E)).

(9) Next, the substrate which has been subjected to the above-stated treatments is immersed in neutralizer (manufactured by Shipley Corporation) and then washed.

Further, a palladium catalyst is added to the surfaces of the roughened substrate (a roughening depth of 3 μm), thereby attaching catalyst nuclei to the surfaces of the interlayer resin insulating layers and the inner wall surfaces of the via hole openings. Namely, the substrate is immersed in a catalytic solution containing palladium chloride (PbCl2) and stannous chloride (SnCl2) and palladium metal is precipitated, thereby attaching the catalyst.

(10) The substrate to which the catalyst is attached is immersed in an electroless copper plating aqueous solution having the following composition and electroless copper plated films having a thickness of 0.3 to 3.0 μm are formed on the entire roughened surfaces, thereby obtaining the substrate having electroless copper plated films 52 formed on the surfaces of the interlayer resin insulating layers 50 including the inner walls of the via hole openings 50a (FIG. 3(A)).

| [Electroless plating aqueous solution] | |
| --- | --- |
| NiSO4 | 0.003 mol/l |
| Tartaric acid | 0.200 mol/l |
| Copper sulfate | 0.032 mol/l |
| HCHO | 0.050 mol/l |
| NaOH | 0.100 mol/l |
| α,α'-bipyridyl | 100 mg/l |
| Polyethylene glycol (PEG) | 0.10 g/l |
| [Electroless plating conditions] | |
| 45 minutes and a solution temperature of 34° C. | |

(11) Commercially available sensitive dry films are bonded to the substrate on which the electroless copper plated films 52 are formed, a mask is put on the substrate, the substrate is exposed at 110 mJ/cm$^2$ and developed with a 0.8% sodium carbonate aqueous solution, thereby providing plating resists 54 having a thickness of 25 μm (FIG. 3(B)).

(12) Next, the substrate is cleaned and degreased with water at 50° C., washed with water at 25° C., cleaned with sulfuric acid and electroplated under the following conditions, thereby forming electroplated copper films 56 having a thickness of 20 μm on portions on which the plating resists 54 are not formed (FIG. 3(C)).

| [Electroplating solution] | |
| --- | --- |
| Sulfuric acid | 2.24 mol/l |
| Copper sulfate | 0.26 mol/l |
| Additive (Kalapacid GL manufactured by Atotech Japan) | 19.5 ml/l |
| [Electroplating conditions] | |
| Current density | 1 A/dm$^2$ |
| Time | 65 minutes |
| Temperature | 22 ± 2° C. |

(13) After peeling off the plating resists 3 with 5% KOH, the electroless plated films under the plating resist are etched, molten and removed with a solution mixture of sulfuric acid and hydrogen peroxide, thus forming independent conductor circuits 58 and via holes 60 (FIG. 3(D)).

(14) The same treatment as that of (5) is performed to form roughened surfaces 58α and 60α on the surfaces of the conductor circuits 58 and the via holes 60. The thickness of the upper layer conductor circuits 58 is 15 μm (FIG. 4(A)). However, the upper layer conductor circuits may be formed to have a thickness between 5 and 25 μm.

(15) The steps (6) to (14) stated above are repeated, thereby forming further upper layer conductor circuits and a multilayer wiring board is obtained (FIG. 4(B)).

(16) Next, 45.67 parts by weight of oligomer (molecular weight: 4000) which is obtained by forming 50% of epoxy groups of 60 parts by weight of cresol novolac type epoxy resin (manufactured by Nippon Kayaku Co., Ltd.) dissolved in diethylene glycol dimethyl ether (DMDG) into an acrylic structure and which imparts photosensitive characteristic, 16.0 parts by weight of 80 wt % of bisphenol A type epoxy resin (manufactured by Yuka Shell, product name: Epicoat 1001) dissolved in methylethyl ketone, 1.6 parts by weight of imidazole hardening agent (manufactured by Shikoku Chemicals, product name: 2E4MZ-CN), 4.5 parts by weight of bifunctional acryl monomer which is photosensitive monomer (manufactured by Kyoei Chemical, product name: R604), 1.5 parts by weight of polyhydric acryl monomer (manufactured by Kyoei Chemical, product name: DPE6A), and 0.71 parts by weight of dispersing defoaming agent (manufactured by Sannopuko KK, product name: S-65) are input in the container, agitated and mixed to prepare a mixture composition. 1.8 parts by weight of benzophenone (manufactured by Kanto Chemical) serving as photoinitiator and 0.2 parts by weight of Michler's ketone (manufactured by Kanto Chemical) serving as photosensitizer are added to the mixture composition, thereby obtaining a solder resist composition adjusted to have a viscosity of 2.0 Pa·s at 25° C.

The viscosity is measured by using the No. 4 rotor of a B-type viscometer (manufactured by Tokyo Keiki, DVL-B type) when the velocity is 60 min-I, and using the No. 3 rotor thereof when the velocity is 6 min-I.

(17) Next, after the above-stated solder resist composition 70 is coated on each surface of the multilayer wiring board by a thickness of 20 μm, and dried under conditions of 70° C. for 20 minutes and 70° C. for 30 minutes (FIG. 4(C)), a photomask on which a pattern of solder resist opening portions are drawn and which has a thickness of 5 mm, is fixedly attached to each solder resist layer 70, exposed with ultraviolet rays of 1000 mJ/cm$^2$, and developed with a DMTG solution, thereby forming opening portions 71 having a diameter of 200 μm (FIG. 5(A)).

Further, heat treatments are conducted at 80° C. for 1 hour, at 100° C. for 1 hour, at 120° C. for 1 hour, and at 150° C. for 3 hours, respectively, to harden the solder resist layers, thus forming solder resist pattern layers each having opening portions and a thickness of 15 to 25 μm. As the solder resist composition, a commercially available solder resist composition can be also used.

(18) Next, the substrate having the solder resist layers 70 formed thereon is immersed in an electroless nickel plating solution containing nickel chloride (2.3×10$^{-1}$ mol/l), sodium hypophosphite (2.8×10$^{-1}$ mol/l) and sodium citrate (1.6×10$^{-1}$ mol/l) and a pH of 4.5 for 20 minutes, thereby forming nickel plated layers 72 having a thickness of 5 μm in the opening portions 71. Further, the resultant substrate is immersed in an electroless gold plating solution containing potassium gold cyanide (7.6×10$^{-3}$ mol/l), ammonium chloride (1.9×10$^{-1}$ mol/l), sodium citrate (1.2×10$^{-1}$ mol/l) and sodium hypophosphite (1.7×10$^{-1}$ mol/l) at 80° C. for 7.5 minutes, thereby forming gold plated layers 74 each having a thickness of 0.03 μm on the respective nickel plated layers 72 (FIG. 5(B)). Alternatively, a single tin or noble metal (gold, silver, palladium, platinum or the like) layer may be formed in stead of the nickel-gold layers.

(19) Thereafter, tin-lead containing solder paste is printed on each opening 71 of the solder resist layer 70 on one surface of the substrate on which surface the IC chip is mounted, tin-antimony containing solder paste is further printed on each opening on the other surface of the substrate, and solder bumps (solder bodies) are formed by conducting reflow at 200° C., thereby manufacturing a multilayer printed wiring board including solder bumps 76U and 76D (FIG. 6).

The IC chip 90 is attached to the multilayer printed wiring board and chip capacitors 98 are mounted thereon through the solder bumps 76U. Further, the multilayer printed wiring board is attached to the daughter board 94 through the solder bumps 76D (FIG. 7).

Embodiment 1-2

A multilayer printed wiring board is manufactured in the same manner as that of Embodiment 1-1 described above with reference to FIG. 6 except for the following respects:

Thickness of conductor layers of a core substrate: 55 μm; thickness of a power supply layer of the core substrate: 55 μm; and thickness of conductor layers of interlayer insulating layers: 15 μm.

Embodiment 1-3

A multilayer printed wiring board is manufactured in the same manner as that of Embodiment 1-1 except for the following respects:

Thickness of conductor layers of a core substrate: 75 μm; thickness of a power supply layer of the core substrate: 75 μm; and thickness of conductor layers of interlayer insulating layers: 15 μm.

Embodiment 1-4

A multilayer printed wiring board is manufactured in the same manner as that of Embodiment 1 except for the following respects:

Thickness of conductor layers of a core substrate: 180 μm; thickness of a power supply layer of the core substrate: 180 μm; and thickness of conductor layers of interlayer insulating layers: 6 μm.

Embodiment 1-5

A multilayer printed wiring board is manufactured in the same manner as that of Embodiment 1-1 except for the following respects:

Thickness of conductor layers of a core substrate: 18 μm; thickness of a power supply layer of the core substrate: 18 μm; and thickness of conductor layers of interlayer insulating layers: 15 μm.

In Embodiment 1, the conductor layer serving as the power supply layer of the core substrate and those of the interlayer insulating layers which satisfy 1<(thickness of conductor layer as power supply layer of core substrate/thickness of conductor layers of interlayer insulating layers)≤40 are set for appropriate examples of Embodiment 1 while those which satisfy (thickness of conductor layer as power supply layer of core substrate/thickness of conductor layers of interlayer insulating layers)≤1 are set for a comparative example. Furthermore, those which satisfy (thickness of conductor layer as power supply layer of core substrate/thickness of conductor layers of interlayer insulating layers)>40 are set for a reference example.

Figure 8:
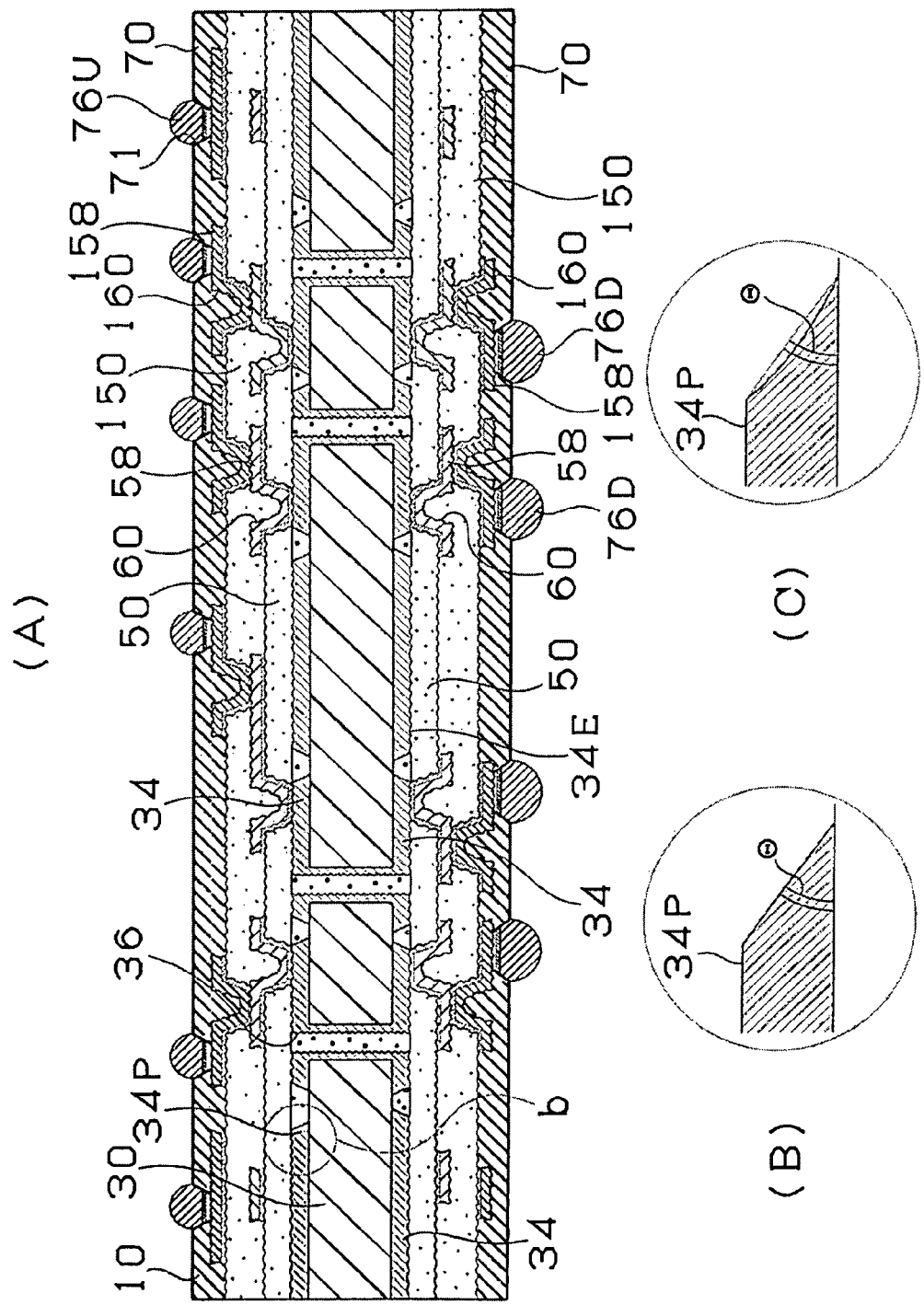
FIG. 8(A) is a sectional view of the multilayer printed wiring board according to the modification of the first embodiment, and FIGS. 8(B), (C) are the explanatory view enlarging the conductive layers surrounded by the circle b.

FIG. 8(A) shows a modification of the first embodiment. The side face of each of the conductive layers 34P, 34E of the core substrate 30 is in the form of taper (linear taper shown in FIG. 10(B) or rounded taper shown in FIG. 10(C)). When an angle formed by a straight line connecting the top end and the bottom end of the side face of the conductive layers 34P, 34E and a horizontal face of the core substrate is assumed to be Θ or when an angle formed by a straight line connecting the top end and bottom end of the side face of the conductive layers 34P, 34E in the inner layer of the core substrate and the core substrate is assumed to be Θ, the Θ satisfies the relational expression of 2.8<tan Θ<55.

Corresponding to the first embodiment-1 to the first embodiment-5, first embodiments-6 to 10 in which the side face of the conductive layers 34P, 34E of the core substrate 30 was formed into a rounded taper satisfying the aforementioned relational expression were manufactured. In the meantime, an etching method for forming the taper form will be described later.

Embodiment 2

Ceramic Substrate

A multilayer printed wiring board according to Embodiment 2 will be described.

In Embodiment 1 described above with reference to FIG. 6, the core substrate is formed out of insulating resin. In Embodiment 2, by contrast, a core substrate is an inorganic hard substrate made of ceramic, glass, ALN, mullite or the like. Since the other constitutions are the same as those in Embodiment 1 described above with reference to FIG. 6, they will not be described and illustrated herein.

On the multilayer printed wiring board in Embodiment 2 similarly to Embodiment 1, the conductor layers 34P and 34P on the core substrate 30 and the conductor layers 24 in the core substrate are formed out of metal such as copper or tungsten and the conductor circuits 58 on the interlayer resin insulating layers 50 and the conductor circuits 158 on the interlayer resin insulating layers 150 are formed out of copper. This Embodiment 2 attains the same advantages as those of Embodiment 1. The conductor layers of the core substrate, the power supply layer thereof and the interlayer insulating layers are formed to have the same thicknesses as those of Embodiment 1. Further, in Embodiment 2, the conductor layer serving as the power supply layer of the core substrate and those of the interlayer insulating layers which satisfy 1<(thickness of conductor layer as power supply layer of core substrate/thickness of conductor layers of interlayer insulating layers)≤40 are set for appropriate examples of Embodiment 1 while those which satisfy (thickness of conductor layer as power supply layer of core substrate/thickness of conductor layers of interlayer insulating layers)≤1 are set for a comparative example. Furthermore, those which satisfy (thickness of conductor layer as power supply layer of core substrate/thickness of conductor layers of interlayer insulating layers)>40 are set for a reference example.

Embodiment 2-1

A multilayer printed wiring board is manufactured in the same manner as that of Embodiment 2 stated above except for the following respects:

Thickness of conductor layers of a core substrate: 30 μm; thickness of a power supply layer of the core substrate: 30 μm; and thickness of conductor layers of interlayer insulating layers: 15 μm.

Embodiment 2-2

A multilayer printed wiring board is manufactured in the same manner as that of Embodiment 2 stated above except for the following respects:

Thickness of conductor layers of a core substrate: 50 μm; thickness of a power supply layer of the core substrate: 50 μm; and thickness of conductor layers of interlayer insulating layers: 15 μm.

Embodiment 2-3

A multilayer printed wiring board is manufactured in the same manner as that of Embodiment 2 stated above except for the following respects:

Thickness of conductor layers of a core substrate: 75 μm; thickness of a power supply layer of the core substrate: 75 μm; and thickness of conductor layers of interlayer insulating layers: 15 μm.

Embodiment 2-4

A multilayer printed wiring board is manufactured in the same manner as that of Embodiment 2 stated above except for the following respects:

Thickness of conductor layers of a core substrate: 180 µm; thickness of a power supply layer of the core substrate: 180 µm; and thickness of conductor layers of interlayer insulating layers: 6 µm.

Embodiment 3

Metal Core Substrate

A multilayer printed wiring board according to Embodiment 3 will be described with reference to FIGS. 9 and 10.

In Embodiment 1 described above with reference to FIG. 6, the core substrate is formed out of a resin board. In Embodiment 3, by contrast, a core substrate is formed out of a metallic plate.

Figure 9:
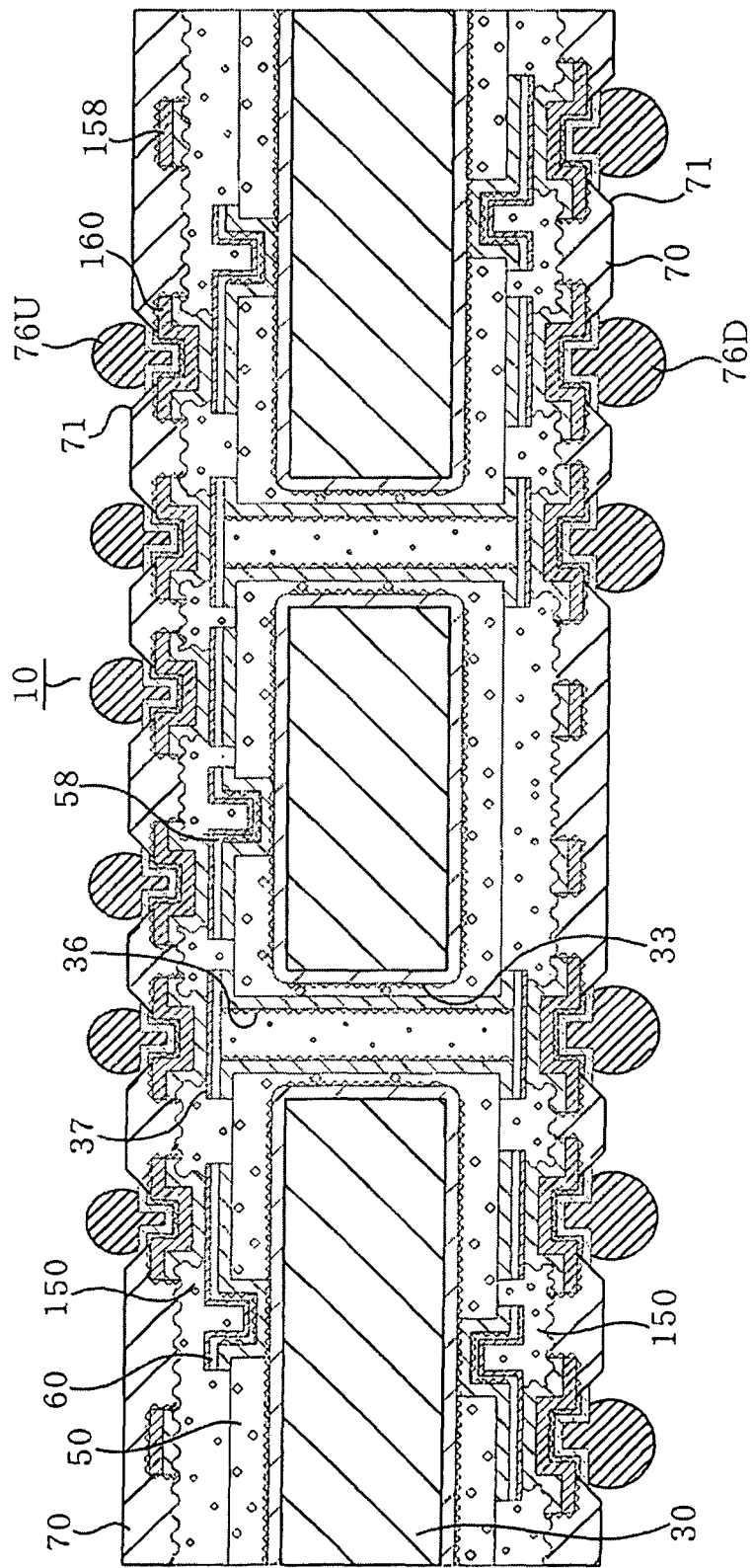
FIG. 9 is a sectional view of the multilayer printed wiring board according to a third embodiment.
Figure 11:
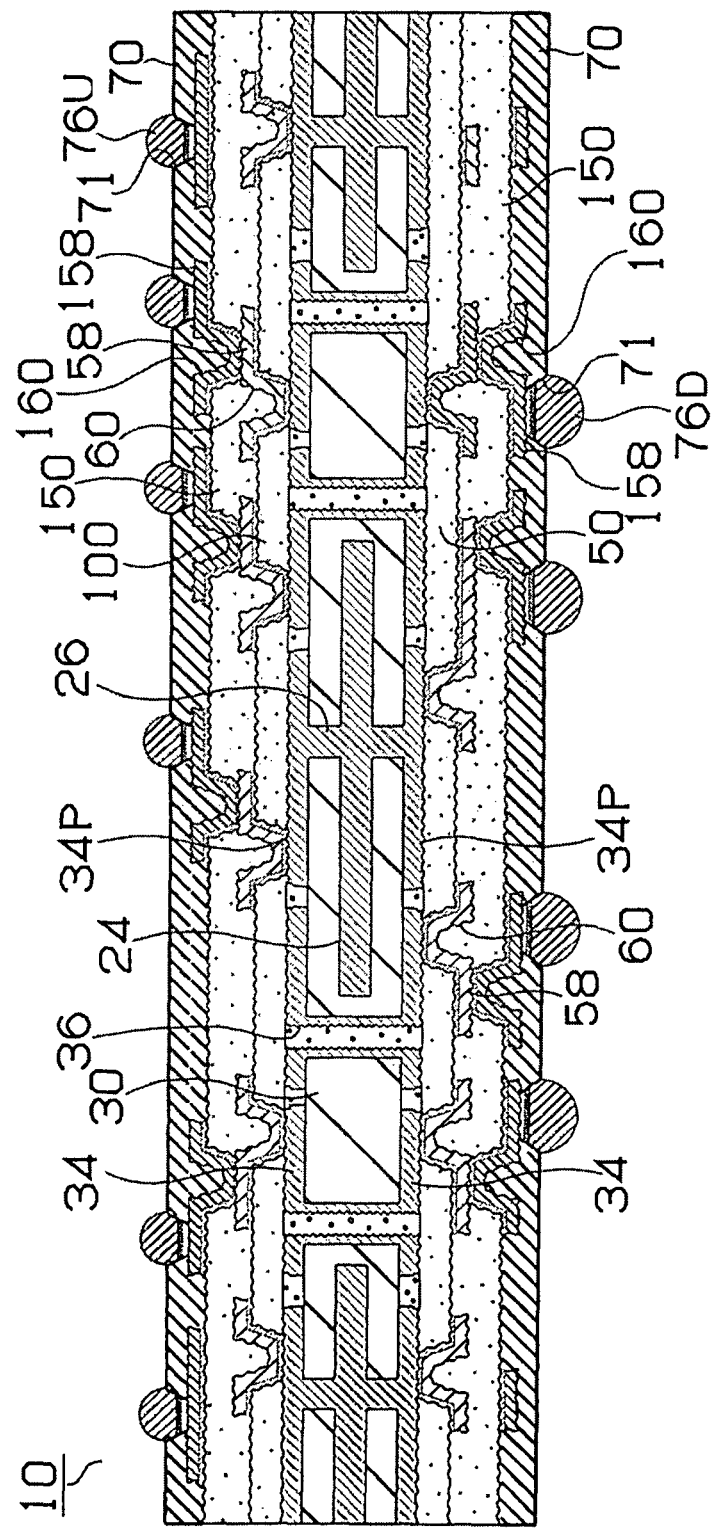
FIG. 11 is a sectional view of the multilayer printed wiring board according to a fourth embodiment.

FIG. 9 shows the cross section of the multilayer printed wiring board 10 according to Embodiment 3 and FIG. 11 shows a state in which an IC chip 90 is attached to the multilayer printed wiring board 10 shown in FIG. 9 and in which the board 10 is mounted on a daughter board 94.

As shown in FIG. 9, the core substrate 30 of the multilayer printed wiring board 10 is made of a metallic plate and used as a power supply layer. Interlayer resin insulating layers 50 on which via holes 60 and conductor circuits 58 are arranged are formed on the both surfaces of the core substrate 30, respectively and interlayer resin insulating layers 150 on which via holes 160 and conductor circuits 158 are arranged are formed on the respective interlayer resin insulating layers 50. In the pass-through holes 33 of the core substrate 30, through holes 36 are formed, and cover plating layers 37 are arranged on the both ends of the via holes. Solder resist layers 70 are formed on the upper layers of the via holes 160 and the conductor circuit 158 and bumps 76U and 76D are formed on the via holes 160 and the conductor circuits 158 through the opening portions 71 of the solder resist layers 70, respectively.

Figure 10:
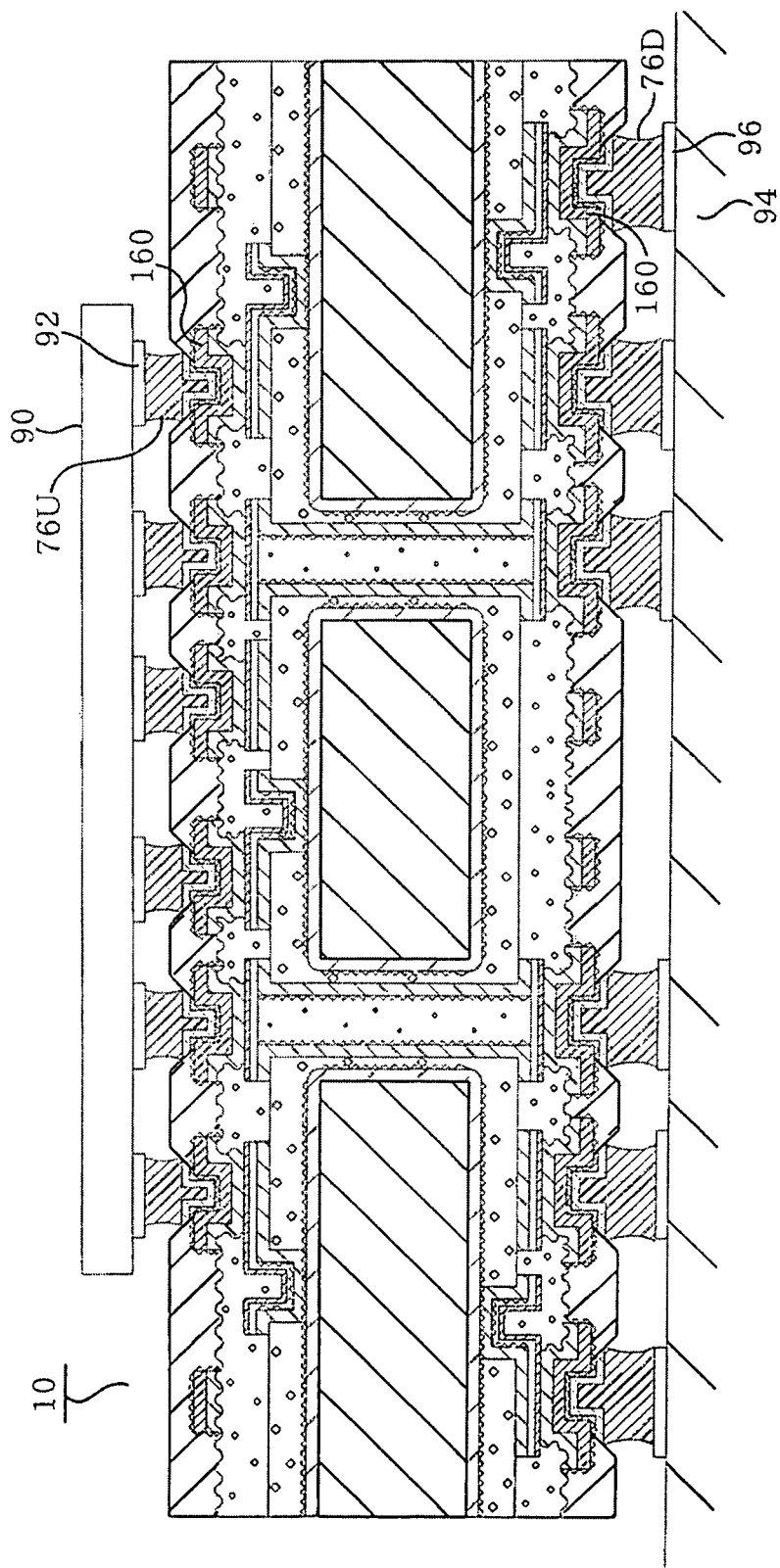
FIG. 10 is a sectional view showing a condition in which the IC chip is mounted on the multilayer printed wiring board according to the third embodiment.

As shown in FIG. 10, solder bumps 76U on the upper surface of the multilayer printed wiring board 10 are connected to lands 92 of the IC chip 90. Further, chip capacitors 98 are mounted on the board 10. Solder bumps 76D on the lower surface thereof are connected to lands 96 of the daughter board 94.

Here, the core substrate 30 is formed to have a thickness of 200 to 600 µm. The metallic plate is formed to have a thickness between 15 and 300 µm. The conductor layers of the interlayer resin insulating layers may be formed to have a thickness between 5 and 25 µm. However, the thickness of the metallic layer may exceed the above range.

Embodiment 3 attains the same advantages as those of Embodiment 1.

Embodiment 3-1

A multilayer printed wiring board is formed in the same manner as Embodiment 3 described above with reference to FIG. 9 except for the following respects:

Thickness of a core substrate: 550 µm; thickness of a power supply layer of the core substrate: 35 µm; and thickness of conductor layers of interlayer insulating layers: 15 µm.

Embodiment 3-2

A multilayer printed wiring board is formed in the same manner as Embodiment 3 except for the following respects:

Thickness of a core substrate: 600 µm; thickness of a power supply layer of the core substrate: 55 µm; and thickness of conductor layers of interlayer insulating layers: 15 µm.

Embodiment 3-3

A multilayer printed wiring board is formed in the same manner as Embodiment 3 except for the following respects:

Thickness of a core substrate: 550 µm; thickness of a power supply layer of the core substrate: 100 µm; and thickness of conductor layers of interlayer insulating layers: 10 µm.

Embodiment 3-4

A multilayer printed wiring board is formed in the same manner as Embodiment 3 except for the following respects:

Thickness of a core substrate: 550 µm; thickness of a power supply layer of the core substrate: 180 µm; and thickness of conductor layers of interlayer insulating layers: 6 µm.

Embodiment 3-5

A multilayer printed wiring board is formed in the same manner as Embodiment 3 except for the following respects:

Thickness of a core substrate: 550 µm; thickness of a power supply layer of the core substrate: 240 µm; and thickness of conductor layers of interlayer insulating layers: 6 µm.

In Embodiment 3, the conductor layer serving as the power supply layer of the core substrate and those of the interlayer insulating layers which satisfy 1<(thickness of conductor layer as power supply layer of core substrate/thickness of conductor layers of interlayer insulating layers)≤40 are set for appropriate examples of Embodiment 3 while those which satisfy (thickness of conductor layer as power supply layer of core substrate/thickness of conductor layers of interlayer insulating layers)≤1 are set for a comparative example. Furthermore, those which satisfy (thickness of conductor layer as power supply layer of core substrate/thickness of conductor layers of interlayer insulating layers)>40 are set for a reference example.

Embodiment 4

Multilayer Core Substrate

A multilayer printed wiring board according to Embodiment 4 will be described with reference to FIGS. 11 and 12.

In Embodiment 1 described above with reference to FIG. 6, the core substrate comprises a single board. In Embodiment 4, by contrast, a core substrate comprises multilayer boards and conductor layers are provided in the multilayer boards.

Figure 12:
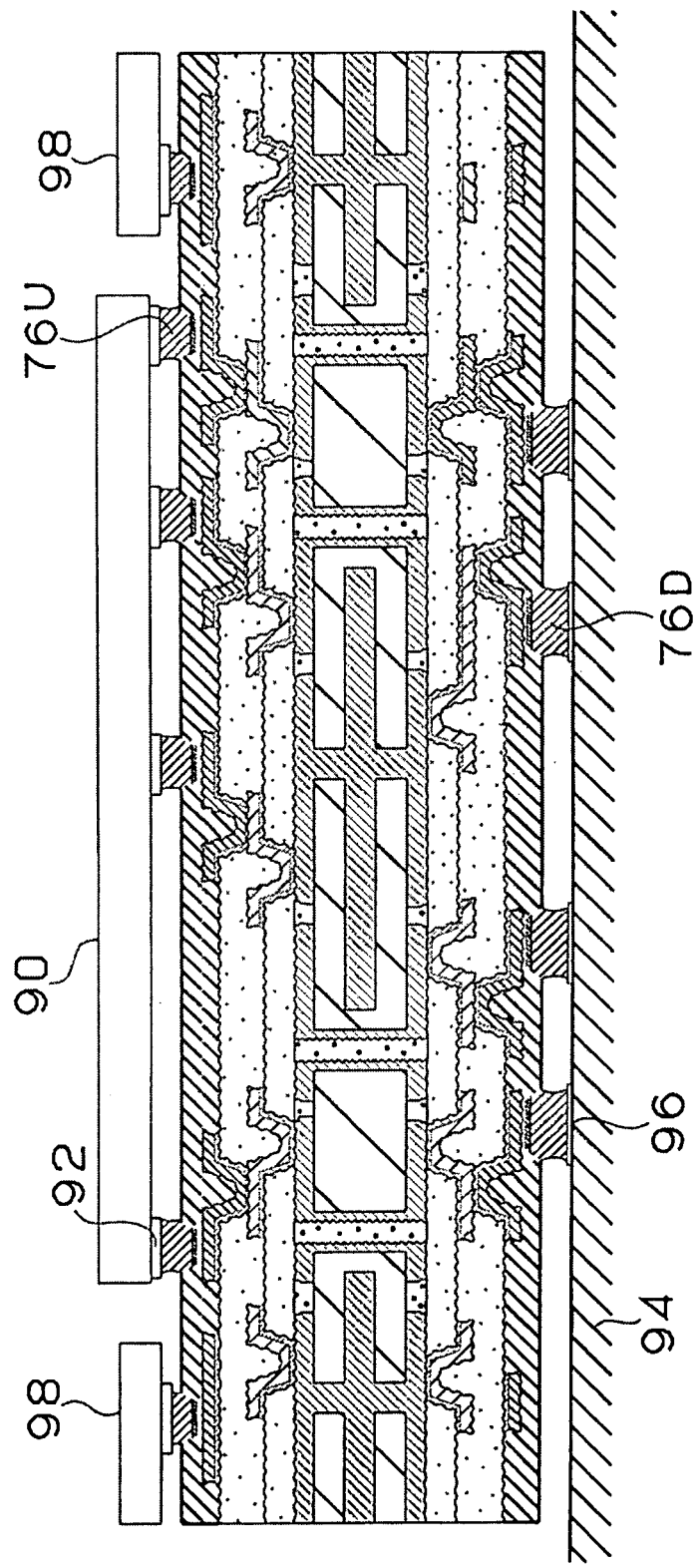
FIG. 12 is a sectional view showing a condition in which the IC chip is mounted on the multilayer printed wiring board according to the fourth embodiment.
Figure 13:
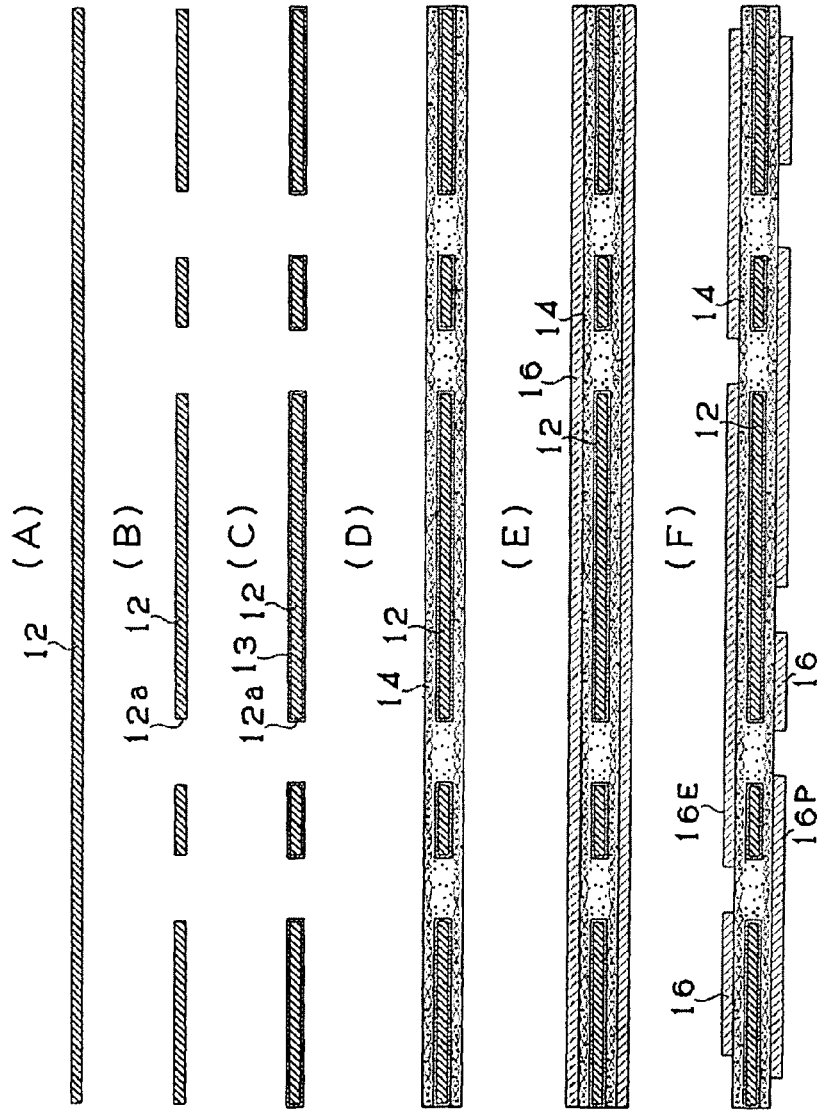
FIGS. 13(A), (B), (C), (D), (E) and (F) are process diagrams showing the manufacturing method of the multilayer printed wiring board according to a fifth embodiment of the present invention.

FIG. 11 shows the cross section of the multilayer printed wiring board 10 according to Embodiment 4 and FIG. 12 shows a state in which an IC chip 90 is attached to the multilayer printed wiring board 10 shown in FIG. 11 and in which the board 10 is mounted on a daughter board 94. As shown in FIG. 11, on the multilayer printed wiring board 10, conductor circuits 34 and conductor layers 34P are formed on the front and rear surfaces of the core substrate 30, respectively and conductor layers 24 are formed in the core substrate 30. The conductor layers 34P and 24 are formed as power supply plane layers. The conductor layers 34P and 24 are connected to one another by conductive posts 26. (The conductive posts mean herein via holes such as through holes or non-through holes (including blind through holes and blind via holes) or holes filled with through hole or via hole conductive material.) In addition, an interlayer resin insulating layer 50 on which via holes 60 and conductor circuits 58 are formed and an interlayer resin insulating layer 150 on which via holes 160 and conductor circuits 158 are formed are provided on each of the conductor layers 34P. Solder resist layers 70 are formed on upper layers of the via holes 160 and the conductor circuits 158, and bumps 76U and 76D are formed on the via holes 160 and the conductor circuits 158 through the opening portions 71 of the solder resist layers 70, respectively.

As shown in FIG. 12, solder bumps 76U on the upper surface of the multilayer printed wiring board 10 are connected to lands 92 of the IC chip 90. Further, chip capacitors 98 are mounted on the board 10. Solder bumps 76D on the lower surface thereof are connected to lands 96 of the daughter board 94.

Here, the conductor circuits 34 and the conductor layers 34P, 34P on the core substrate 30 and the conductor layers 24 in the core substrate are formed and conductor circuits 58 on interlayer resin insulating layers 50 and conductor circuits 158 on interlayer resin insulating layers 150 are formed. The conductor layers 34P and 24 of the core substrate are formed to have thicknesses between 1 and 250 μm and the conductor layers formed on the core substrate and serving as the power supply layers are formed to have a thickness between 1 and 250 μm. The thickness of each conductor layer in this case is the sum of the thicknesses of the power supply layers of the core substrate. This means that the thickness of the conductor layer is the sum of the thickness of the conductor layer 34 on the inner layer and that of the conductor layer 24 on the surface layer. This does not mean that the thicknesses of the layers serving as signal lines are added together. In Embodiment 4, by summing the thicknesses of the three conductor layers 34P, 34P and 24, the same advantages as those of Embodiment 1 are attained. The thickness of the power supply layers may exceed the above range.

In Embodiment 4, the conductor layer serving as the power supply layer of the core substrate and those of the interlayer insulating layers which satisfy 1<(sum of thickness of conductor layer as power supply layer of core substrate/thickness of conductor layers of interlayer insulating layers)≤40 are set for appropriate examples of Embodiment 4 while those which satisfy (sum of thickness of conductor layer as power supply layer of core substrate/thickness of conductor layers of interlayer insulating layers)≤1 are set for a comparative example. Furthermore, those which satisfy (sum of thickness of conductor layer as power supply layer of core substrate/thickness of conductor layers of interlayer insulating layers)>40 are set for a reference example.

Embodiment 4-1

A multilayer printed wiring board is formed in the same manner as that of Embodiment 4 stated above with reference to FIG. 11 except for the following respects:

Thickness of conductor layers (power supply layers) of the core substrate: 15 μm Thicknesses of intermediate conductor layers (power supply layers): 20 μm Sum of thicknesses of power supply layers of the core substrate: 50 μm Thickness of conductor layers of interlayer insulating layers: 15 μm.

Embodiment 4-2

A multilayer printed wiring board is formed in the same manner as that of Embodiment 4 except for the following respects.

Thickness of conductor layers (power supply layers) of the core substrate: 20 μm Thicknesses of intermediate conductor layers (power supply layers): 20 μm Sum of thicknesses of power supply layers of the core substrate: 60 μm Thickness of conductor layers of interlayer insulating layers: 15 μm.

Embodiment 4-3

A multilayer printed wiring board is formed in the same manner as that of Embodiment 4 except for the following respects.

Thickness of conductor layers (power supply layers) of the core substrate: 25 μm Thicknesses of intermediate conductor layers (power supply layers): 25 μm Sum of thicknesses of power supply layers of the core substrate: 75 μm Thickness of conductor layers of interlayer insulating layers: 15 μm.

Embodiment 4-4

A multilayer printed wiring board is formed in the same manner as that of Embodiment 4 except for the following respects.

Thickness of conductor layers (power supply layers) of the core substrate: 50 μm Thicknesses of intermediate conductor layers (power supply layers): 100 μm Sum of thicknesses of power supply layers of the core substrate: 200 μm Thickness of conductor layers of interlayer insulating layers: 10 μm.

Embodiment 4-5

A multilayer printed wiring board is formed in the same manner as that of Embodiment 4 except for the following respects.

Thickness of conductor layers (power supply layers) of the core substrate: 55 μm Thicknesses of intermediate conductor layers (power supply layers): 250 μm Sum of thicknesses of power supply layers of the core substrate: 360 μm Thickness of conductor layers of interlayer insulating layers: 12 μm.

Embodiment 4-6

A multilayer printed wiring board is formed in the same manner as that of Embodiment 4 except for the following respects.

Thickness of conductor layers (power supply layers) of the core substrate: 55 μm Thicknesses of intermediate conductor layers (power supply layers): 250 μm Sum of thicknesses of power supply layers of the core substrate: 360 μm Thickness of conductor layers of interlayer insulating layers: 9 μm.

Embodiment 5

Multilayer Core Substrate

Figure 17:
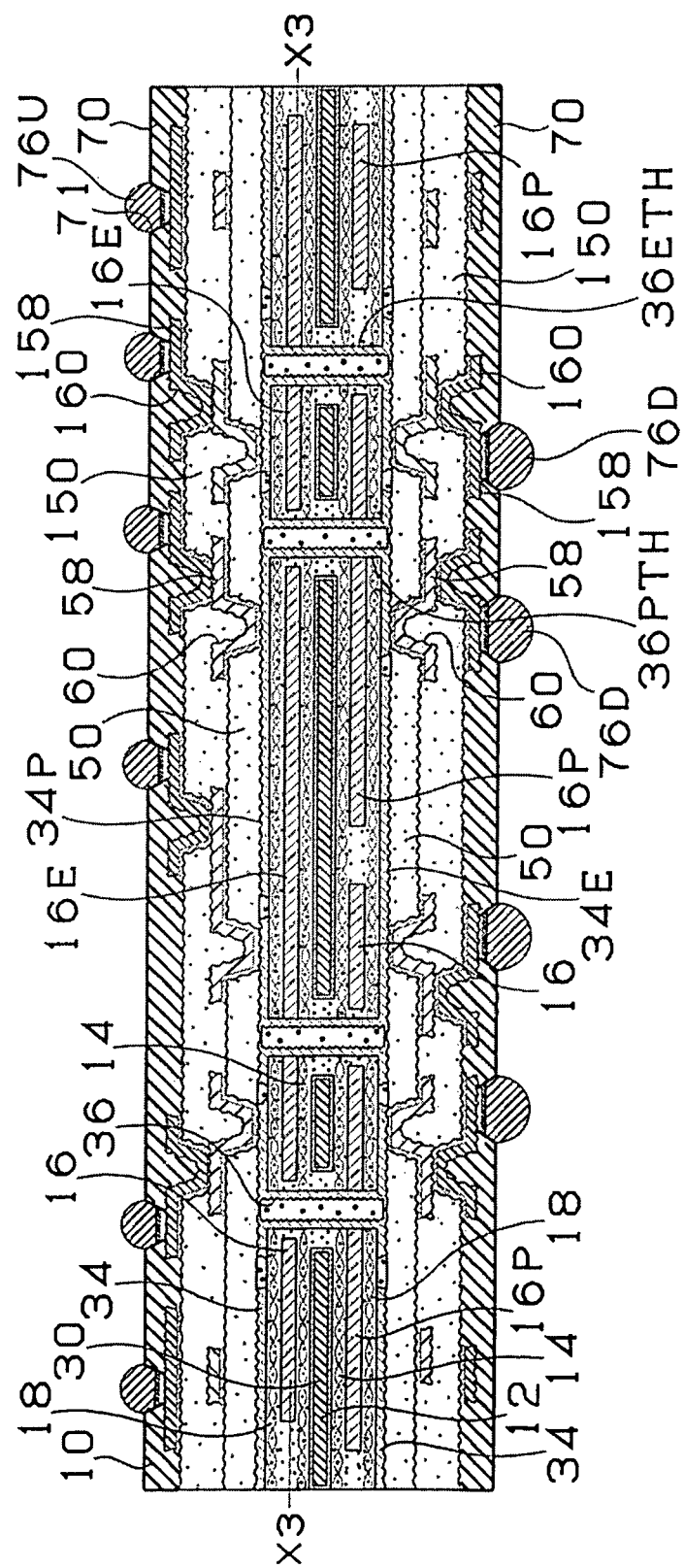
FIG. 17 is a sectional view of the multilayer printed wiring board according to the fifth embodiment.
Figure 18:
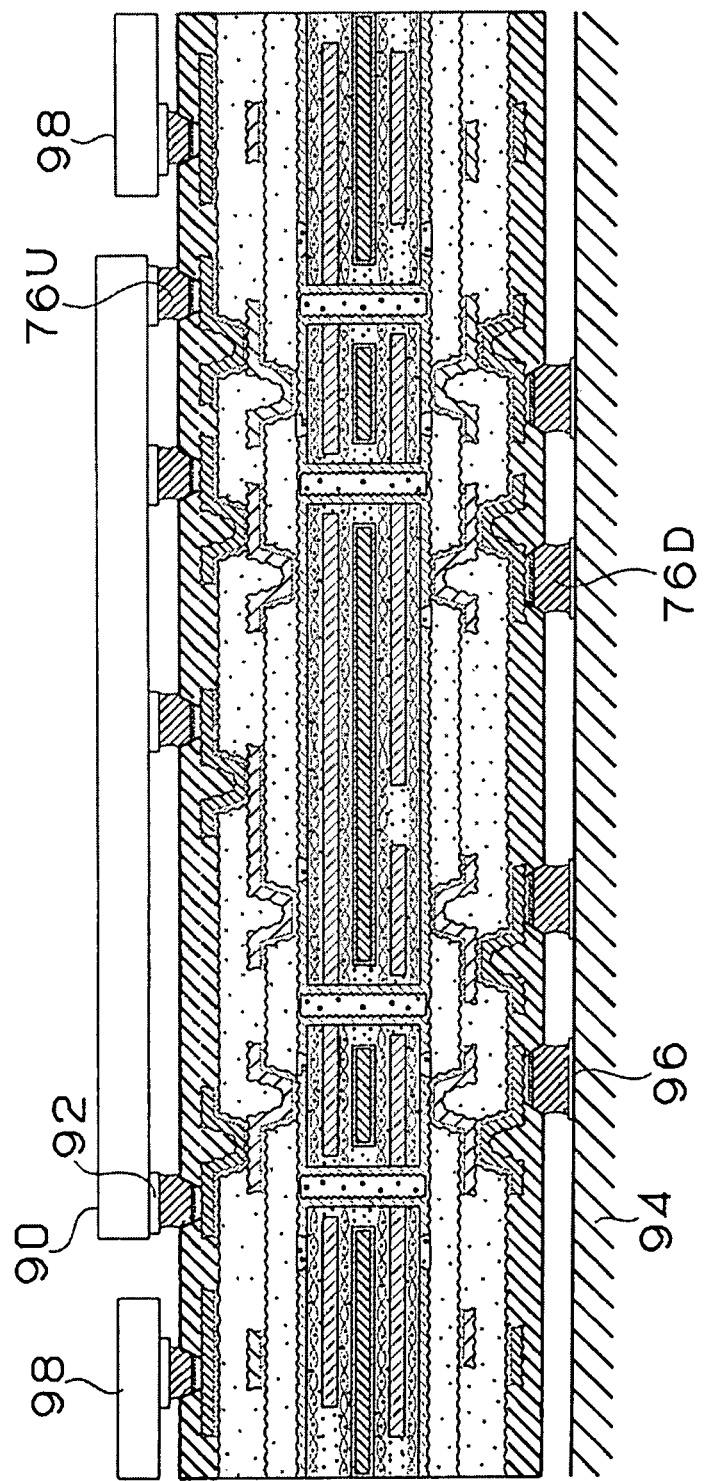
FIG. 18 is a sectional view showing a condition in which the IC chip is mounted on the multilayer printed wiring board according to the fifth embodiment.

A multilayer printed wiring board according to Embodiment 5 of the present invention will be described with reference to FIGS. 13 to 18. The configuration of a multilayer printed wiring board 10 according to Embodiment 5 will first be described with reference to FIGS. 17 and 18. FIG. 17 shows the cross section of the multilayer printed wiring board 10 and FIG. 18 shows a state in which an IC chip 90 is attached to the multilayer printed wiring board 10 shown in FIG. 17 and in which the board 10 is mounted on a daughter board 94. As shown in FIG. 17, a multilayer printed wiring board 10 employs a multilayer core substrate 30. A conductor circuit 34 and a conductor layer 34P are formed on the front surface of the multilayer core substrate 30 and a conductor circuit 34 and a conductor layer 34E are formed on the rear surface thereof. The upper conductor layer 34P is formed as a power supply plane layer while the lower conductor layer 34E is formed as an earth plane layer. Further, a conductor circuit 16 and a conductor layer 16E on the inner layer are formed on the inside surface of the multilayer core substrate 30 while a conductor circuit 16 and a conductor layer 16P are formed on the inside rear surface thereof. The upper conductor layer 16E is formed as an earth plane layer while the lower conductor layer 16P is formed as a power supply plane layer. Connection to the power supply plane layer is established by through holes or via holes. The plane layer may comprise a single layer formed on one side or comprise two or more layers. Preferably, the plane layer comprises two to four layers. Since it is not confirmed that the plane layer comprising four or more plane layers can improve electric characteristic, the electric characteristic of the plane layer comprising four or more layers is the same as that of the plane layer comprising four layers. Particularly if the plane layer comprising two layers, the expansion ratios of the substrate can be made uniform and warps less occur in terms of the rigidity matching of the multilayer core substrate. An electrically insulated metallic plate 12 is contained at the center of the multilayer core substrate 30. (Although the metallic plate 12 serves as a central material, it is not electrically connected to the through holes, via holes and the like. The metallic plate 12 mainly serves to improve the rigidity of the substrate 30 against warps.) A conductor circuit 16 and a conductor layer 16E are formed on the metallic plate 12 on the front surface side of the substrate 30 through an insulating resin layer 14 and a conductor circuit 16 and a conductor layer 16P are formed on the metallic plate 12 on the rear surface side of the substrate 30 through an insulating resin layer 14. Further, a conductor circuit 34 and a conductor layer 34P are formed on the metallic plate 12 on the front surface side of the substrate 30 through an insulating resin layer 18 and a conductor circuit 34 and a conductor layer 34E are formed on the metallic plate 12 on the rear surface side of the substrate 30 through an insulating resin layer 18. The front surface side and the rear surface side of the multilayer core substrate 30 are connected to each other via through holes 36.

Interlayer resin insulating layers 50 on which via holes 60 are formed and conductor circuits 58 are formed and interlayer resin insulating layers 150 on which via holes 160 and conductor circuits 158 are formed are arranged on the conductor layers 34P and 34E on the surfaces of the multilayer core substrate 30, respectively. Solder resist layers 70 are formed on the upper layers of the via holes 160 and the conductor circuits 158 and bumps 76U and 76D are formed on the via holes 160 and the conductor circuits 158 through the opening portions 71 of the solder resist layers 70, respectively.

As shown in FIG. 18, solder bumps 76U on the upper surface of the multilayer printed wiring board 10 are connected to lands 92 of the IC chip 90. Further, chip capacitors 98 are mounted on the board 10. External terminals 76D on the lower surface thereof are connected to lands 96 of the daughter board 94. External terminals refer herein to PGA's, BGA's, solder bumps or the like.

The conductor layers 34P and 34E on the front layers of the core substrate 30 are formed to have thicknesses of 10 to 60 μm, the conductor layers 16P and 16E are formed on the inner layer to have thicknesses of 10 to 250 μm, the conductor circuits 58 on the interlayer resin insulating layers 50 and the conductor circuits 158 on the interlayer resin insulating layers 150 are formed to have thicknesses of 5 to 25 μm.

On the multilayer printed wiring board according to Embodiment 5, the power supply layer (conductor layer) 34P on the surface layer of the core substrate 30, the conductor layers 34, the power supply layer (conductor layer) 16P on the inner layer of the core substrate 30, the conductor layer 16E and the metallic plate 12 are made thick, thereby intensifying the strength of the core substrate. As a result, even if the core substrate itself is formed thin, it is possible for the substrate itself to relax warps and generated stresses.

Furthermore, by making the conductor layers 34P and 34E and conductor layers 16P and 16E thick, it is possible to increase the volumes of the conductors themselves. By increasing the volumes, it is possible to decrease the resistance of the conductors.

In addition, by employing the conductor layers 34P and 16P as power supply layers, it is possible to improve the capability of supplying power to the IC chip 90. Due to this, if the IC chip is mounted on the multilayer printed wiring board, it is possible to decrease a loop inductance of the IC chip—the substrate—the power supply. Accordingly, power shortage in an initial operation is decreased to make it difficult to cause power shortage. Even if the IC chip in a higher frequency range is mounted on the multilayer printed wiring board, malfunction, error or the like does not occur in the initial operation. Besides, by employing the conductor layers 34E and 16E as earth layers, noise does not superpose on the signal of the IC chip and the supply of power to the IC chip, thus making it possible to prevent malfunction or error. By mounting capacitors, the power accumulated in the capacitors can be used as auxiliary power, making it difficult to cause power shortage. By providing the capacitors right under the IC chip, in particular, the effect (of making it difficult to cause power shortage) becomes conspicuous. This is because the capacitors right under the IC chip enables shortening wiring lengths on the multilayer printed wiring board.

In Embodiment 5, the multilayer core substrate 30 has the thick conductor layers 16P and 16E on the inner layer and the thin conductor layers 34P and 34E on the surface of the substrate 30, and the inner layer conductor layers 16P and 16E and the surface layer conductor layers 34P and 34E are employed as the power supply conductor layers and the earth conductor layers, respectively. Namely, even if the thick conductor layers 16P and 16E are arranged on the inner layer side of the substrate 30, the resin layers covering the conductor layers are formed. Due to this, it is possible to cancel irregularities derived from the conductor layers and thereby flatten the surface of the multilayer core substrate 30. Therefore, even if the thin conductor layers 34P and 34E are arranged on the surfaces of the multilayer core substrate 30 so as not to generate waviness on the conductor layers 58 and 158 of the respective interlayer resin insulating layers 50 and 150, it is possible to secure sufficient thickness as that of the conductor layers of the core by the sum of the thicknesses of the conductor layers 16P and 16E on the inner layer. Since no waviness occurs, no problem occurs to the impedances of the conductor layers on the interlayer insulating layers. By employing the conductor layers 16P and 34P as the power supply conductor layers and the conductor layers 16E and 34E as the earth conductor layers, it is possible to improve the electric characteristics of the multilayer printed wiring board.

Furthermore, by arranging the signal line 16 between the conductor layers 34P and 16P (on the same layer as that of the conductor layer 16E) in the core substrate, it is possible to form a micro-strip structure. Likewise, by arranging the signal line 16 between the conductor layers 16E and 34E (on the same layer as that of the conductor layer 16P), it is possible to form a micro-strip structure. By forming the micro-strip structures, it is possible to decrease inductance and to match impedances to one another. Due to this, it is possible to stabilize the electric characteristics of the multilayer printed wiring board.

That is to say, the thicknesses of the conductor layers 16P and 16E on the inner layer of the core substrate are set larger than those of the conductor layers 58 and 158 on the interlayer insulating layers 50 and 150. By doing so, even if the thin conductor layers 34E and 34P are arranged on the surfaces of the multilayer core substrate 30, it is possible to secure sufficient thickness as that of the conductor layers of the core by adding the thicknesses of the thick conductor layers 16P and 16E on the inner layer. The thickness ratio of the conductor layers preferably satisfies 1<(conductor layer on inner layer of core/conductor layer of insulating layer)≤40. More preferably, the thickness ratio satisfies 1.2≤(conductor layer on inner layer of core/conductor layer of insulating layer)≤30.

The multilayer core substrate 30 is constituted so that the conductor layers 16P and 16E as inner layer is formed on each surface of an electrically isolated metallic plate 12 through a resin layer 14 and so that the conductor layers 34P and 34E on the surface layer is formed outside of the conductor layers 16P and 16E as the inner layer through the resin layer 18. By arranging the electrically insulated metallic plate 12 on the central portion of the substrate, it is possible to secure sufficient mechanical strength. Further, by forming the conductor layers 16P and 16E on the inner layer of the both surfaces of the metallic plate 12 through the resin layers 14, respectively and the conductor layers 34P and 34E on the surface layer on the outside of the conductor layers 16P and 16E as the inner layer on the both surfaces of the metallic plate 12 through the resin layers 18, respectively, it is possible to impart symmetry to the both surfaces of the metallic plate 12 and to prevent the occurrence of warps, waviness and the like in a heat cycle and the like.

Figure 19:
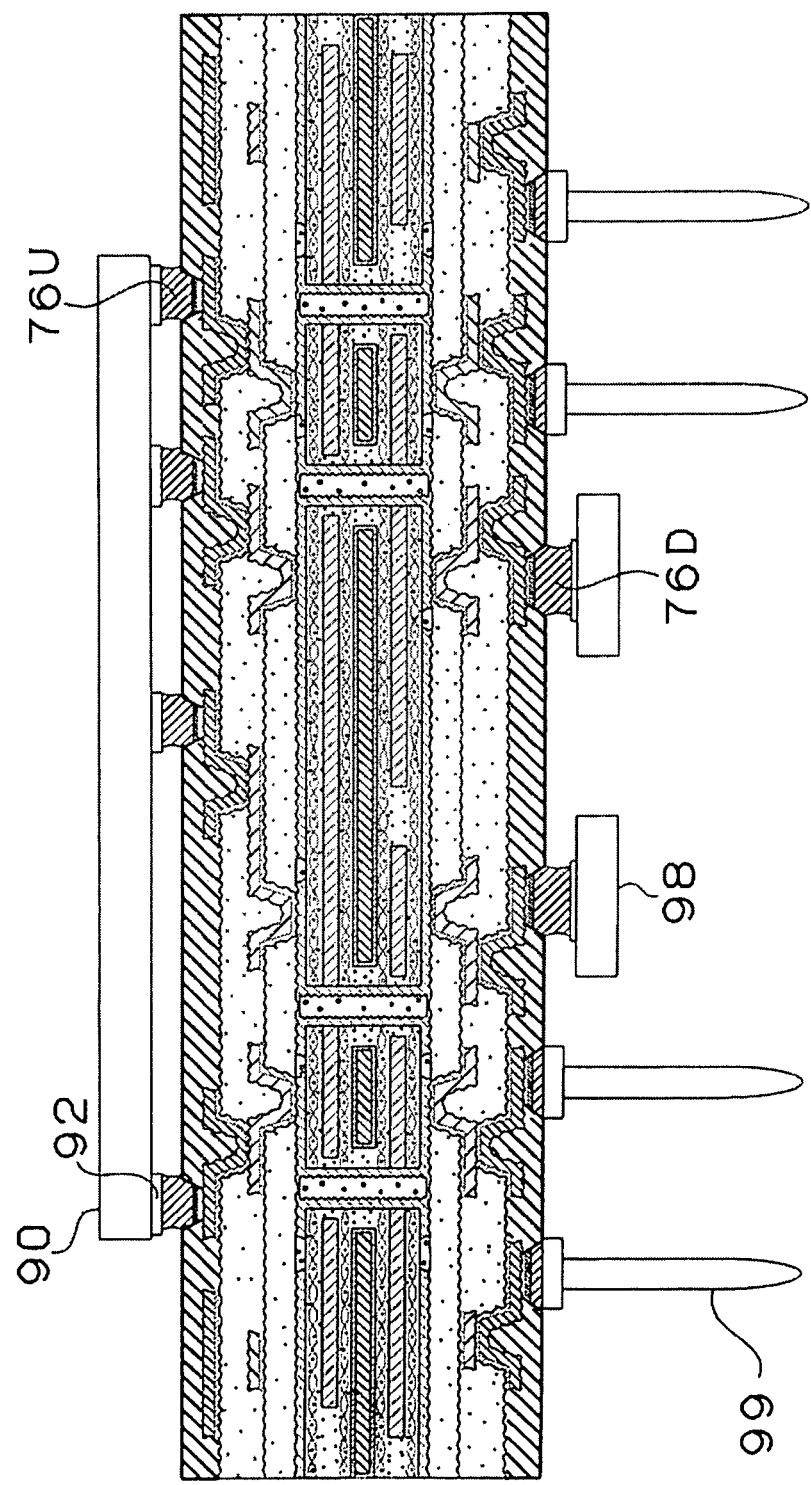
FIG. 19 is a sectional view showing a condition in which the IC chip is mounted on the multilayer printed wiring board according to the fifth embodiment.

FIG. 19 shows a modification of Embodiment 5. In this modification, capacitors 98 are arranged right under the IC chip 90. Due to this, the distance between the IC chip 90 and the capacitor 98 is short, making it possible to prevent the voltage drop of the power supplied to the IC chip 90.

Next, a method for manufacturing the multilayer printed wiring board 10 shown in FIG. 17 will be described with reference to FIGS. 13 to 18.

(1) Formation of metallic layer

Openings 12a are provided in an inner layer metallic layer (metallic plate) 12 having a thickness of 50 to 400 µm as shown in FIG. 13(A) to penetrate the front and rear surfaces of the layer 12 (FIG. 13(B)). As the material of the metallic layer, a material containing a mixture of copper, nickel, zinc, aluminum, iron and the like can be used. The openings 12a are formed by punching, etching, drilling, a laser or the like. Depending on cases, metallic films 13 may be coated on the entire surfaces of the metallic layer 12 having the openings 12a formed therein by electroplating, electroless plating, substitutional plating or sputtering (FIG. 13(C)). The metallic plate 12 may comprise a single layer or a plurality of layers of two or more layers. In addition, the metallic films 13 preferably have curves formed on the corners of the openings 12a. The curves can eliminate points at which stresses are concentrated and make it more difficult to cause defects such as cracks and the like around the points.

(2) Formation of insulating layers on inner layer and conductive layers

Insulating resin is used to cover the entire surfaces of the metallic layer 12 and fill up the openings 12a. For example, the metallic plate 12 is put between resin films in a B stage state of a thickness of about 30 to 200 µm, the resin films are thermally pressed and hardened (FIG. 13(D)), copper foils having thickness of 12~275 µm are laminated the outsides, whereby insulating rein layers 14 and conductive layer 16 can be formed (FIG. 13(E)). Depending on cases, the insulating rein layers 14 may be formed out of films after applying resin, applying resin and press-fitting the resin films or applying the resin only to the opening portions.

As the material of the insulating resin layers 14, a prepreg having a core material such as glass cloth, aramid bonded material impregnated with thermosetting resin such as polyimide resin, epoxy resin, phenol resin or BT resin is preferable. The other resin may be used.

In embodiment 5, a prepreg having thickness of 50 µm is used. The conductive layer 16 can be made by plating on a metal foil.

(3) Formation of circuits of metallic layer on the inner layer

Two or more layers may be formed. The metallic layer may be formed by the additive method.

Through a denting method, etching steps and the like, conductor layers 16, 16P and 16E on the inner layer are formed from the inner layer metallic layer 16α (FIG. 13(F)). The inner layer conductor layers are formed to have thicknesses of 10 to 250 µm. Alternatively, the thicknesses may exceed the range. In embodiment 1, the thickness of conductive layer for the power supply on inner layer is 25 µm. In this process, for an insulating reliability examination of the core substrate, comb tooth pattern for the insulating reliability examination having conductive circuit width/interval between conductive circuit=150 µm/150 µm is formed as the test pattern (insulating reliability examination pattern of the core substrate). As shown in FIG. 17, in the case where power supply through hole 36PTH connecting to the power supply of the IC goes through the grand layer 16E on inner layer, the power supply through hole may not have an extending pattern thereof. Hereinafter, this through hole called as power supply through hole not having dummy land. Also, in the case where grand through hole 36EPH connecting to the grand of the IC goes through power supply layer 16P on inner layer, the grand through hole may not have an extending pattern thereof. Hereinafter, this through hole called as grand through hole not having dummy land. Also, the both through holes simply called as through hole not having dummy land. Due to the configuration, the pitch between the through holes can be narrow, interval between the through hole and the inner conductive circuit becomes narrow pith, mutual inductance decreases. FIG. 38(A) shows the X3-X3 cross section view of the through hole not having dummy land. FIG. 38(B) shows the X3-X3 cross section view of the through hole having dummy land. By placing the through hole not having dummy land, through hole pitch and an interval between the through hole 36PTH and grand layer 16E become narrow. A placing area for grand layer 16E increases. Numeral 35 is a space to make sure the insulation between through hole 36PTH and grand layer 16E. Numeral 36 is through hole land (dummy land).

(4) Formation of insulating layers as outer layers and conductive layer

Insulating resin is used to cover the entire surfaces of the inner layer conductor layers 16, 16P and 16E and fill up the gaps between the circuits of outer layer metal. By way of example, outer layer insulating resin layers 18 and outermost conductive layer of the core substrate 34α are formed on the both sides of the substrate of the process (3) by putting the metallic plate between resin films in a B stage state of a thickness of about 30 to 400 μm, thermally press-fitting and hardening the resin films (FIG. 14(A)). Depending on cases, the outer layer insulating resin layers 18 and outermost conductive layer of the core substrate 34α may be formed out of films after applying resin, applying resin and press-fitting the resin films or applying the resin only to the opening portions. By applying pressure, it is possible to flatten the surfaces of the layers 18. B-stage prepreg having a core material such as glass cloth, aramid bonded material may be used. In embodiment 1, the prepreg having thickness of 200 μm is used. As an alternative to the method for forming the metallic foils, one-sided copper-clad laminates are built up. Two or more layers of the laminates may be formed on the metallic foils. The metallic layers may be formed by the additive method.

(5) Formation of through holes

Pass-through holes 36α for through holes having opening diameter of 50 to 400 μm are formed to penetrate the front and rear surfaces of the substrate (FIG. 14(C)). As a formation method, the holes are formed by drilling, a laser or a combination of drilling and the laser. (The holes are opened in the outermost insulating layers by the laser, and then may be penetrated through the substrate by drilling while using the holes opened by the laser as target marks.) The forms of the holes are preferably those having linear sidewalls. Depending on cases, the holes may be tapered.

To secure the conductive properties of the through holes, it is preferable to form plated films 22 in the respective pass-through holes 36a for the through holes and roughen the surfaces of the plated films 22 (FIG. 14(D)), and then to fill the holes with resin filler 23 (FIG. 14(E)). As the resin filler, either an electrically insulated resin material (e.g., a resin material containing a resin component, hardening agent, particles and the like) or a conductive material holding electrical connection by metallic particles (e.g., a conductive material containing metallic particles such as gold or copper particles, a resin material, hardening agent and the like) can be used.

As plating, electroplating, electroless plating, panel plating (electroless plating and electroplating) or the like may be performed. The plated films 22 are formed by plating metals containing copper, nickel, cobalt, phosphorus or the like. The thicknesses of the plated metals are preferably 5 to 30 μm.

The resin filler 23 filled in the pass-through holes 36a for the through holes is preferably made of an insulating material comprising a resin material, hardening agent, particles and the like. As the particles, inorganic particles such as silica or alumina particles can be used solely, metallic particles such as gold, silver or copper particles can be used solely, resin particles can be used solely or the inorganic particles, the metallic particles and the resin particles can be mixed together. The particles equal in particle size from 0.1 to 5 μm or different in particle size from 0.1 to 5 μm can be mixed. As the resin material, thermosetting resin such as epoxy resin (e.g., bisphenol type epoxy resin or novolac type epoxy resin and the like) or phenol resin, ultraviolet setting resin having a photosensitive property, thermoplastic resin or the like may be used solely or mixed together. As the hardening agent, imidazole based hardening agent, amine based hardening agent or the like can be used. Alternatively, hardening agent containing hardening stabilizer, reaction stabilizer, particles and the like may be used. In the latter case, the resin filler is replaced by conductive paste made of a conductive material comprising metallic particles, a resin component, hardening agent and the like. Depending on cases, metallic films having a conductive property may be formed on the surface layers of an insulating material such as solder or insulating resin. It is also possible to fill the pass-through holes 36a for through holes with plated members. Since the conductive paste is hardened and contracted, depressed portions are sometimes formed on the surface layers.

(6) Formation of outermost layer conductor circuits

Cover plated members 25 may be formed right on the through holes 36 by coating plated films on the entire surfaces of the substrate (FIG. 15(A)). Thereafter, outer layer conductor circuits 34, 34P and 34E are formed through the denting method, etching steps and the like (FIG. 15(B)). As a result, the multilayer core substrate 30 is completed.

At this time, although not shown in the drawings, the electrical connection of the outer conductor circuits to inner conductor layers 16 and the like of the multilayer core substrate may be established by via holes, blind through holes or blind via holes.

(7) The multilayer core substrate 30 on which the conductor circuits 34 have been formed thereon is subjected to a blackening treatment and a reduction treatment, thereby forming roughened surfaces 34β on the entire surfaces of the conductor circuits 34 and the conductor layers 34P and 34E (FIG. 15(C)).

(8) Layers of the resin filler 40 are formed on the conductor circuit unformed portions of the multilayer core substrate 30 (FIG. 16(A)).

(9) The one surface of the substrate which has been subjected to the above treatments is polished by belt sander polishing or the like so as not to leave the resin filler 40 on the outer edges of the conductor layers 34P and 34E, and then the entire surfaces of the conductor layers 34P and 34E (including the land surfaces of the through holes) are further polished by buffing or the like so as to eliminate scratches caused by the former polishing. A series of polishing operations are similarly conducted to the other surface of the substrate. Next, the resin filler 40 is hardened by heat treatments at 100° C. for 1 hour and 150° C. for 1 hour (FIG. 16(B)). Thereby the multilayer core substrate having 4 layers is completed.

The resin filler may not be filled between the conductor circuits. In that case, using resin layers such as interlayer insulating layers, the insulating layers are formed and the portions between the conductor circuits are filled up.

(10) Etchant is sprayed onto the both surfaces of the multi-layer core substrate 30 and the surfaces of the conductor circuits 34 and the conductor layers 34P and 34E and the land surfaces and inner walls of the through holes 36 are subjected to etching or the like, thereby forming roughened surfaces 36β on the entire surfaces of the conductor circuits (FIG. 16(C)). Hereafter, the process are same as the embodiment 1 shown in FIGS. 3 to 7, the explanation of the process will be omitted. In FIG. 3(B), plating resists are formed on a part of the interlayer resin insulating layers for examine of effect for the undulation of interlayer resin insulating layers due to the thickness of the multilayer core substrate. The plating resists are formed so that the plated circuit patterns (minimum lines distance, line width making ability examination pattern) have conductive circuit width/interval between conductive circuit=5/5 µm, 7.5/7.5 µm, 10/10 µm, 12.5/12.5 µm, 15/15 µm. The plating resists having a thickness of 10 to 30 µm are used.

In Embodiment 5, the conductor layer serving as the power supply layer of the core substrate and those of the interlayer insulating layers which satisfy 1<(thickness of conductor layer as power supply layer/thickness of conductor layers of interlayer insulating layers)≤40 are set for appropriate examples of Embodiment 5 while those which satisfy (thickness of conductor layer as power supply layer/thickness of conductor layers of interlayer insulating layers)≤1 are set for a comparative example. Furthermore, those which satisfy (thickness of conductor layer as power supply layer/thickness of conductor layers of interlayer insulating layers)>40 are set for a reference example.

Embodiment 5-1

The multilayer printed wiring board is manufactured in the same manner as that of Embodiment 5 described above with reference to FIG. 17 except for the following respects:

Thickness of conductor layers on the inner layer of the core substrate: 50 µm; thickness of conductor layers as surface layers thereof: 20 µm;

Sum of the thicknesses of the conductor circuits of the core substrate: 100 µm

Thickness of the conductor layers of the interlayer insulating layers: 15 µm.

The conductor layers on the inner layer and those on the surface layer serve as power supply layers. However, the areas of the surface conductor layers are about those of the lands and smaller than those of the inner conductor layers, so that the effect of dropping power is cancelled. Due to this, the thicknesses of the two inner conductor layers are added to the thicknesses of the conductor layers of the core substrate.

Embodiment 5-2

The conductor layers on the inner layer and the conductor layers on the surface layer serve as power supply layers. One surface layer and one inner layer are electrically connected to each other by a through hole.

Thickness of conductor layers on the inner layer of the core substrate: 60 µm; thickness of conductor layers as surface layers thereof: 20 µm;

Sum of the thicknesses of the conductor circuits of the core substrate: 80 µm

Thickness of the conductor layers of the interlayer insulating layers: 15 µm.

One of the conductor layers on the inner layer and one of the conductor layers on the surface layer serve as one power supply layer. The areas of the conductor layers as the surface layers are equal to those of the conductor layers on the inner layer. The effect of dropping power is exhibited. Due to this, the sum of the thicknesses of the conductor layers of the core substrate is the sum of the thicknesses of the conductor layers on the inner layer and those as the surface layers.

Embodiment 5-3

The sum of the thicknesses of the conductor layers of the core substrate is the thickness of the conductor layer on the inner layer.

Thickness of conductor layers on the inner layer of the core substrate: 150 µm; thickness of conductor layers as surface layers thereof: 20 µm;

Sum of the thicknesses of the conductor circuits of the core substrate: 150 µm

Thickness of the conductor layers of the interlayer insulating layers: 15 µm.

The conductor layers on the inner layer and those on the surface layer serve as power supply layers. However, the areas of the surface conductor layers are about those of the lands and smaller than those of the inner conductor layers, so that the effect of dropping power is cancelled. Due to this, the sum of the thicknesses of the conductor circuits of the core substrate is the thicknesses of the one inner conductor layer. the thicknesses of the two inner conductor layers are added to the thicknesses of the conductor layers of the core substrate.

Embodiment 5-4

A multilayer printed wiring board is formed in the same manner as that of Embodiment 5-1 except for the following respects.

Thickness of conductor layers on the inner layer of the core substrate: 100 µm; thickness of conductor layers as surface layers thereof: 20 µm;

Sum of the thicknesses of the conductor circuits of the core substrate: 200 µm

Thickness of the conductor layers of the interlayer insulating layers: 10 µm.

The sum of the thicknesses of the conductor circuits of the core substrate is the sum of the thicknesses of the conductor layers on the inner layer.

Embodiment 5-5

A multilayer printed wiring board is formed in the same manner as that of Embodiment 5-1 except for the following respects.

Thickness of conductor layers on the inner layer of the core substrate: 1200 µm; thickness of conductor layers as surface layers thereof: 20 µm;

Sum of the thicknesses of the conductor circuits of the core substrate: 240 µm

Thickness of the conductor layers of the interlayer insulating layers: 8 µm.

The sum of the thicknesses of the conductor circuits of the core substrate is the sum of the thicknesses of the conductor layers on the inner layer.

Embodiment 5-6

A multilayer printed wiring board is formed in the same manner as that of Embodiment 5-2 except for the following respects.

Thickness of conductor layers on the inner layer of the core substrate: 250 µm; thickness of conductor layers as surface layers thereof: 50 µm;

Sum of the thicknesses of the conductor circuits of the core substrate: 300 µm

Thickness of the conductor layers of the interlayer insulating layers: 7.5 µm.

Embodiment 6

Capacitor Included Core Substrate

A multilayer printed wiring board according to Embodiment 6 will be described with reference to FIGS. 20 and 21.

On the multilayer printed wiring board according to Embodiment 6, chip capacitors 20 are included in the core substrate 30.

Figure 20:
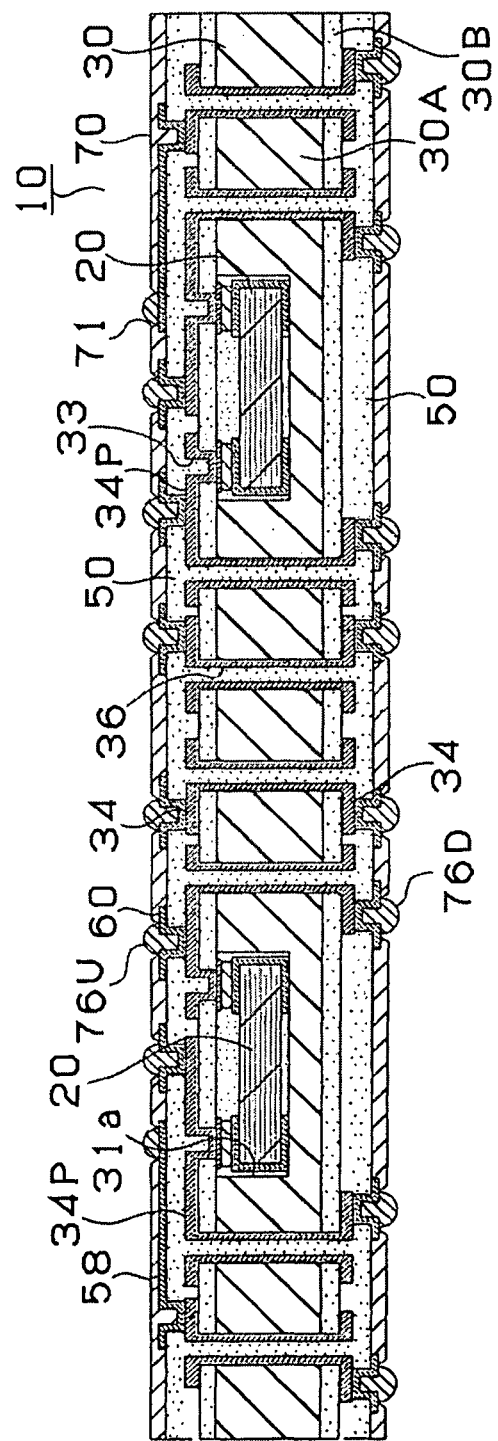
FIG. 20 is a sectional view of the multilayer printed wiring board according to a sixth embodiment.
Figure 21:
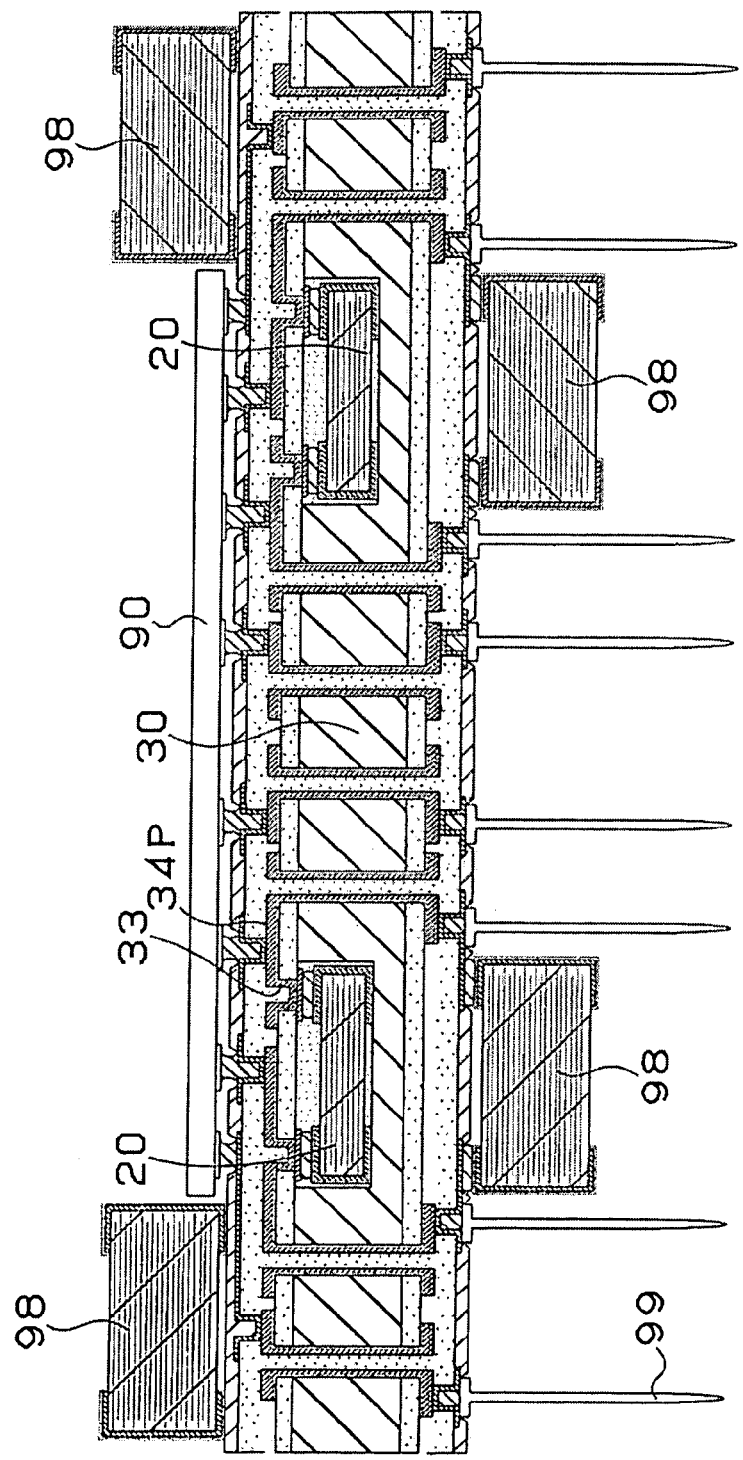
FIG. 21 is a sectional view showing a condition in which the IC chip is mounted on the multilayer printed wiring board according to the sixth embodiment.
Figure 22:
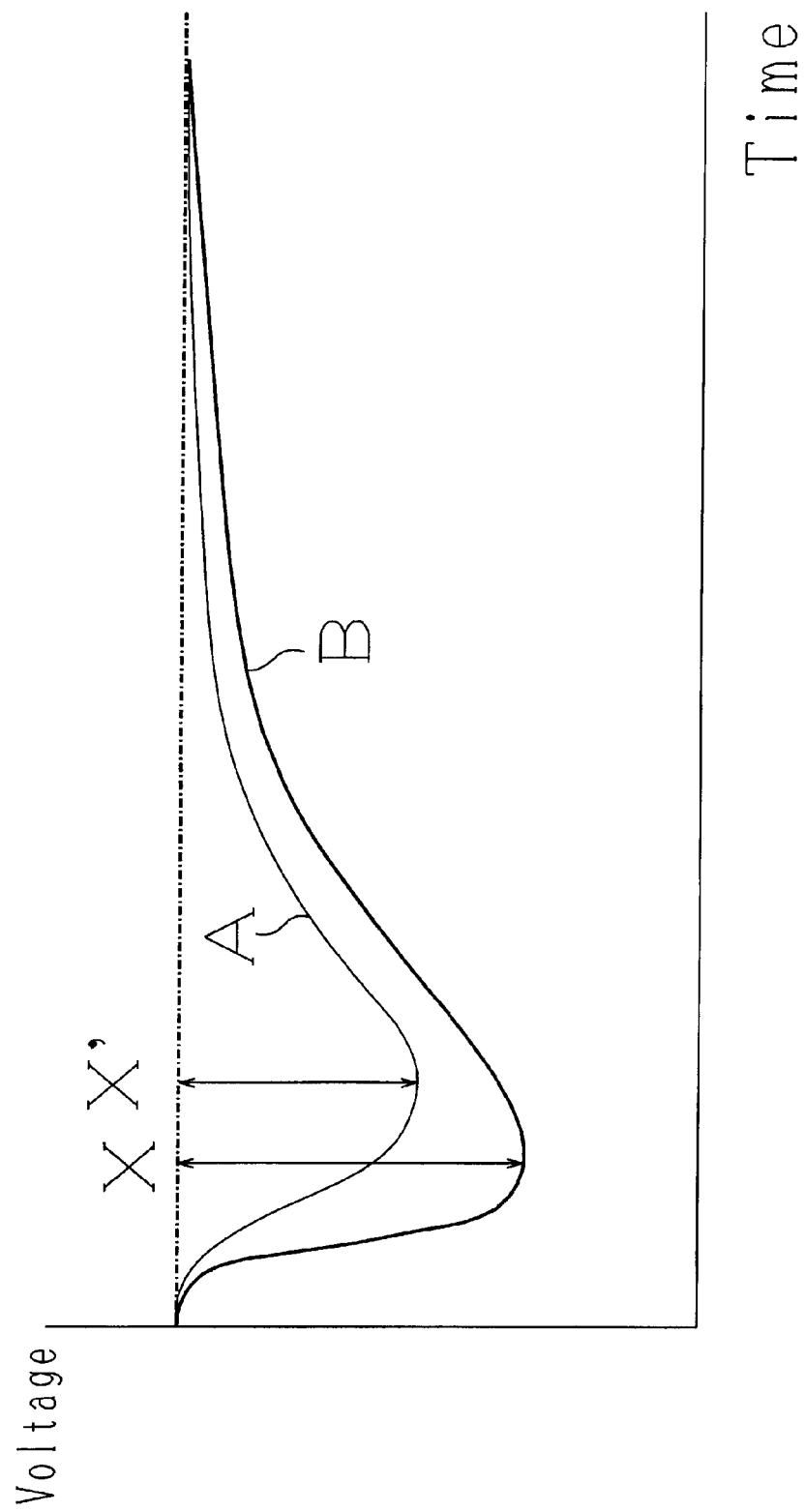
FIG. 22 is a graph showing changes in voltage during the operation of the IC chip.

FIG. 20 is a cross-sectional view of the multilayer printed wiring board 10 according to Embodiment 6 and FIG. 21 shows a state in which the IC chip 90 is attached to the multilayer printed wiring board 10 shown in FIG. 20. As shown in FIG. 20, the core substrate 30 of the multilayer printed wiring board 10 comprises a resin substrate 30A and resin layers 30B. The resin substrate 30A is provided with openings 31a for containing the capacitors 20, respectively. The electrodes of the capacitors 20 are connected to one another by via holes 33 provided in the resin layer 30B. A conductor layer 34P for forming conductor circuits 34 and a power supply layer is formed on the upper surface of the core substrate 30, and interlayer resin insulating layers 50 on which via holes 60 and conductor circuit 58 are arranged are formed on the both surfaces of the core substrate 30, respectively. Through holes 36 are formed in the core substrate 30. Solder resist layers 70 are formed on the upper layers of the respective interlayer resin insulating layers 50 and bumps 76U and 76D are formed on the via holes 160 and the conductor circuits 158 through the opening portions 71 of the solder resist layers 70, respectively.

As shown in FIG. 21, solder bumps 76U on the upper surface of the multilayer printed wiring board 10 are connected to lands 92 of the IC chip 90. Further, chip capacitors 98 are mounted on the board 10. On the other hand, conductive connection pins 99 for the connection of the core substrate 30 to lower solder bumps are attached to the core substrate 30.

The conductor layer 34E is formed to have a thickness of 30 μm. Since the capacitors 20 are included in the core substrate 30 according to Embodiment 6, Embodiment 6 can attain more advantages than those of Embodiment 1.

Embodiment 6-1

A multilayer printed wiring board is manufactured in the same manner as that of Embodiment 6 described above with reference to FIG. 20 except for the following respects:

Thickness of the conductor layers of the core substrate: 30 μm; thickness of the power supply layer of the core substrate: 30 μm; thickness of the conductor layer of the interlayer insulating layer: 15 μm.

Embodiment 6-2

A multilayer printed wiring board is manufactured in the same manner as that of Embodiment 6 except for the following respects:

Thickness of the conductor layers of the core substrate: 55 μm; thickness of the power supply layer of the core substrate: 55 μm; thickness of the conductor layer of the interlayer insulating layer: 15 μm.

Embodiment 6-3

Thickness of the conductor layers of the core substrate: 75 μm; thickness of the power supply layer of the core substrate: 75 μm; thickness of the conductor layer of the interlayer insulating layer: 15 μm.

Embodiment 6-4

A multilayer printed wiring board is manufactured in the same manner as that of Embodiment 6-1 except for the following respects:

Thickness of the conductor layers (power supply layer) of the core substrate: 180 μm; thickness of the conductor layer of the interlayer insulating layer: 6.0 μm.

Comparison Example

In a comparison example for Embodiments 1 to 5, the thickness of the power supply layer of the core substrate and that of the conductor layer of the interlayer insulating layer are set to satisfy (thickness of power supply layer of core substrate/thickness of conductor layer of interlayer insulating layer)≤1. As an actual example of the comparison example, the thickness of the power supply layer of the core substrate is set at 15 μm and that of the conductor layer of the interlayer insulating layer is set at 15 μm.

Reference Example

In a reference example for Embodiments 1 to 5, the thickness of the power supply layer of the core substrate and that of the conductor layer of the interlayer insulating layer are set to satisfy (thickness of power supply layer of core substrate/ thickness of conductor layer of interlayer insulating layer) ≤40. As an actual example of the reference example, the thickness of the power supply layer of the core substrate is set at 415 μm and that of the conductor layer of the interlayer insulating layer is set at 10 μm.

IC chips with a frequency of 3.1 GHz are mounted on the substrate according to the embodiments, the comparison example and the reference examples, respectively, power equal in quantity is supplied to the respective chips, the voltage drop quantities of the power supplied to the respective IC chips when the chips are actuated are measured. The averages of the voltage drop quantities are shown. The averages are those of the voltage drop quantities varied at a power supply voltage of 1.0 V. The voltage of the IC is measured in an circuit made in the printed circuit board.

In addition, reliability tests are conducted to the embodiments, comparison example and reference example, respectively, under bias high temperature, high humidity conditions (130, humidity of 85 wt % and application of 2 V). The tests are conducted for test time of 100 hrs, 300 hrs, 500 hrs and 1000 hrs, respectively, to inspect the presence/absence of IC malfunction and the presence/absence of via connection opens in the conductor layers of the core for the embodiments, comparison example and reference example, respectively. Test results are shown on tables of FIGS. 25 and 26. In the case where the voltage change tolerance is +10% on the 1.0V of source voltage (the third voltage drop amount), the voltage change is stable and the IC malfunction is not happen. That is, in the case, the voltage drop is less or equal 0.1V, the IC malfunction cause by the voltage drop is not happen.

FIGS. 25 and 26 demonstrate that the multilayer printed wiring boards manufactured in the appropriate embodiments is less prone to the malfunction of the IC chip and opens. Namely, electrical connection and reliability are ensured according to the embodiments.

In the comparison example, the malfunction of the IC chip occurs, so that electrical connection involves a disadvantage. In addition, because of the thin conductors, the stresses generated under the reliability tests cannot be buffered and cracks occur to the via connection portions. As a result, reliability is deteriorated. However, if the ratio of the thickness of the power supply layer of the core substrate/the thickness of the conductor layer of the interlayer insulating layer exceeds 1.2, the effect of the thickness ratio appears.

If the ratio of the thickness of the power supply layer of the core substrate/the thickness of the conductor layer of the interlayer insulating layer exceeds 40 (in the reference example), reliability is deteriorated due to the defects of the upper conductor circuits (e.g., the generation of stresses to the upper conductor layers, the lowering of adhesion due to waviness and the like). Although no problem normally occurs, the tendency appears depending on the factors such as materials.

The test results demonstrate that the thickness of the power supply layer of the core substrate and that of the conductor layer of the interlayer insulating layer which satisfy the electrical characteristics and reliability are those which satisfy 1<(total thickness of power supply layer of core substrate/thickness of conductor layer of interlayer insulating layer) ≤40.

The result of Embodiments 1-6 to 1-10 is not shown in FIGS. 25, 26, however, is same as the result of Embodiments 1-5.

Seventh Embodiment

FIG. 27 shows a sectional view of the multilayer printed wiring board according to the seventh embodiment. According to the seventh embodiment, the side faces of the conductive layers 16E, 16P are formed into a linear taper or rounded taper and an angle Θ (see FIG. 27(B) which is an enlargement of a circle portion b of the conductive layer 16 shown in FIG. 27(A): linear taper and FIG. 27(C): rounded taper) formed by a straight line connecting the top end and bottom end of the side face of the conductive layer and the core substrate was adjusted as indicated in the seventh embodiment-1 to the seventh embodiment-9 by changing etching condition such as spray pressure, etching time or etching by using only the bottom face of a spray type etching unit when the conductive layers 16E, 16P in the inner layer of the core substrate were formed referring to FIG. 13(F) indicating the fifth embodiment. In the meantime, the Θ and shape (linear taper or rounded taper) of each section of the seventh embodiment-1 to the seventh embodiment-6 are a measured value obtained by observing the section using ×100 to ×1000 microscope by polishing so that the longitudinal section of the conductor in the inner layer can be observed.

Seventh Embodiment-1

The Θ was adjusted to 2 and the shape was adjusted to a rounded taper.

Seventh Embodiment-2

The tan Θ was adjusted to 2.8 and the shape was adjusted to a rounded taper.

Seventh Embodiment-3

The tan Θ was adjusted to 3.5 and the shape was adjusted to a rounded taper.

Seventh Embodiment-4

The tan Θ was adjusted to 53 and the shape was adjusted to a rounded taper.

Seventh Embodiment-5

The tan Θ was adjusted to 55 and the shape was adjusted to a rounded taper.

Seventh Embodiment-6

The tan Θ was adjusted to 57 and the shape was adjusted to a rounded taper.

Seventh Embodiment-7

The tan Θ was adjusted to 2.8 and the shape was adjusted to a linear taper.

Seventh Embodiment-8

The tan Θ was adjusted to 53 and the shape was adjusted to a linear taper.

Seventh Embodiment-9

The tan Θ was adjusted to 57 and the shape was adjusted to a linear taper.

Then, HAST test and heat cycle test were carried out to multilayer printed wiring boards of the seventh embodiment-1 to the seventh embodiment-6 under the following time condition (frequency). Only the heat cycle test was carried out to multilayer printed wiring boards of the seventh embodiments-7,8,9. This result is shown in Table of FIG. 28. A graph with tan Θ on the abscissa axis and insulation resistance and changes in resistivity on the ordinate axis is shown in FIG. 29.

Condition and time of HAST test
Condition: 85° C.×85%×3.3 V
Time: 115 hours
A test piece was accepted when insulation resistance was over $10^7 \Omega$ after the test.
Heat cycle test
Condition: −55° C.×5 minutes ↔ 125° C.×5 minutes
Frequency: 1,000 times
A test piece was accepted if a change in resistivity after test was less than ±10%. Measurement was made the same as for the eighth embodiment described below.

Figure 29:
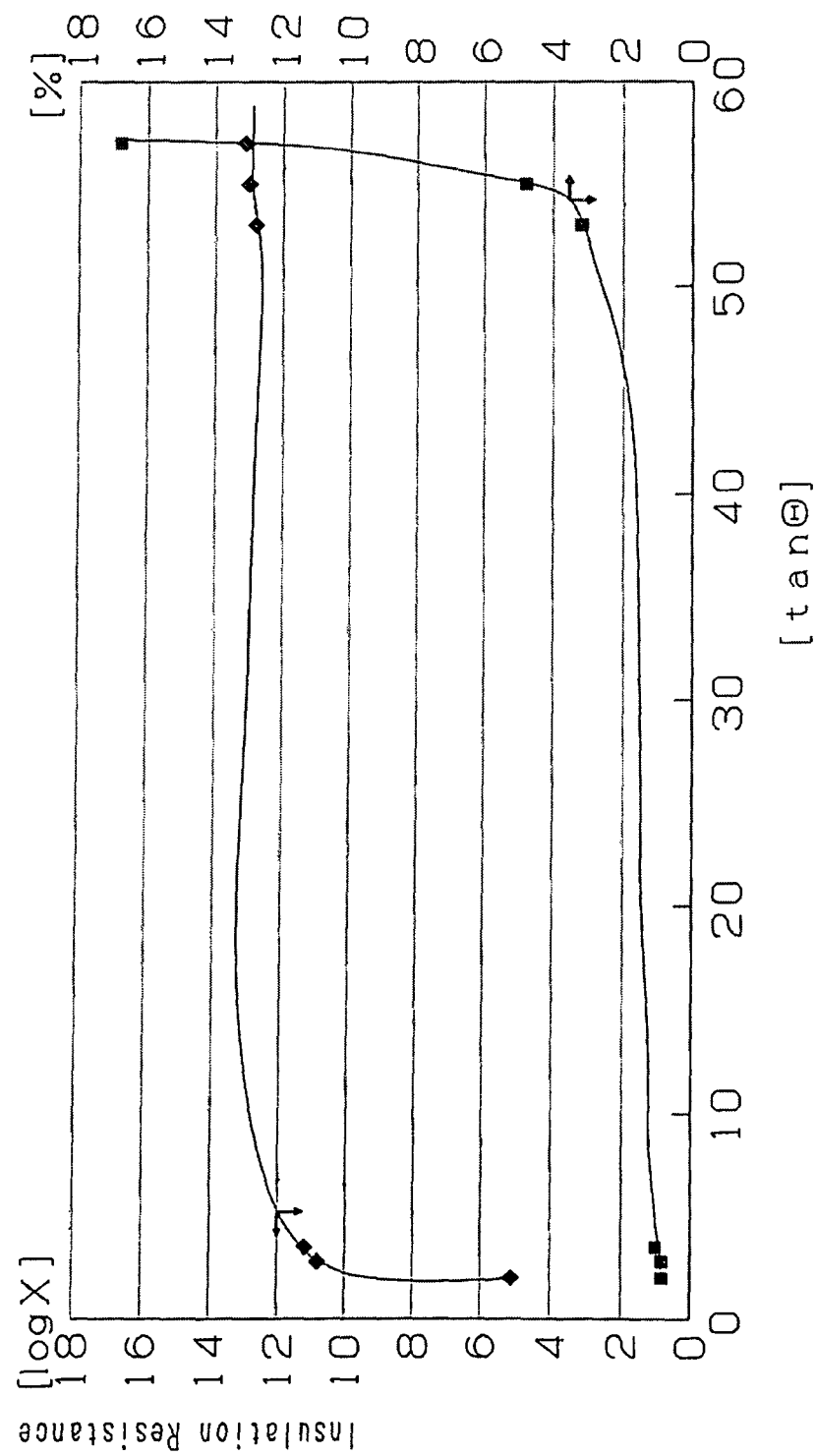
FIG. 29 is a graph with tan Θ on the abscissa axis and insulation resistance and changes in resistivity on the ordinate axis, when it is assumed that an angle formed by a straight line connecting the top end and bottom end of the side face of the conductive layer and the horizontal face of the core substrate is Θ.

From a result of FIGS. 28, 29, it is evident that insulation reliability and connection reliability are satisfied when the Θ satisfies the relation of 2.8<tan Θ<55.

The multilayer printed wiring board of the seventh embodiment-1 after the HAST test and the multilayer printed wiring board of the seventh embodiment-6 after heat cycle test were analyzed.

In the seventh embodiment-6, it was made evident that crack occurred in an interface between the side wall of the conductive layer in the inner layer of the multilayer core substrate and insulation resin as a beginning point and that resistance rose due to peeling in that interface.

In the seventh embodiment-1, it was made evident that insulation resistance dropped due to copper left at a place and another after etching between the conductive layers (on the insulation layer) at the bottom of the conductive layers in the inner layer of the multilayer core substrate. If the Θ satisfies the relation of 2.8<tan Θ<55, it is evident that the insulation reliability and connection reliability are improved.

By comparing the seventh embodiments-2,4,6 (FIG. 27(C): rounded taper) with the seventh embodiment-7 to the seventh embodiment-9 (FIG. 27(B): linear taper), it is evident that as for the shape of the side face of the conductive layer, rounded taper is more excellent than linear taper in viewpoints of connection reliability. This reason is estimated to be that adhesion strength between the side face of the conductive layer and the insulation resin is increased and stress is dispersed in the rounded configuration, so that crack and peeling are more difficult to occur.

Eighth Embodiment

According to the eighth embodiment, formation of a circuit in the conductive layers 16E, 16P in the inner layer of the core substrate is carried out like the fifth embodiment as shown in FIG. 13(F). This is so-called tenting method and etching solution was sprayed to a substrate carried to an etching zone with a conveyor through nozzles (installed up and down off the substrate at a specified distance) with main component of the etching solution as copper dichloride. The shape of the taper and an angle of the side face of the conductive layer were adjusted as shown in the eighth embodiment-1 to the eighth embodiment-30 by changing the etching method or etching condition or adding inhibitor to the main component. The $\Theta$ and shape (linear taper or rounded taper) of each of the eighth embodiment-1 to the eighth embodiment-30 area measured values obtained by observing a section with a microscope with a graduation of ×100 to ×1000 by polishing so that the longitudinal section of a conductor in the inner layer can be observed. In the meantime, observation of the section was carried out with a side face shape observation substrate of the conductive layer manufactured separately from a product under the same condition. As for the quantity of measurements, a product was divided to four sections and then, every two parts were measured at random (8 data in total).

For each embodiment, the thickness of the conductive layer in the inner layer was changed by changing the thickness of copper foil in FIG. 13(E) when the multilayer core was produced.

The aforementioned inhibitor is an additive which adheres to copper to inhibit the copper from being etched (side etching) in the horizontal direction relative to the substrate and is capable of increasing the above-mentioned $\Theta$. As that inhibitor, benzotriazole and the like are available and the degree of inhibition of the side etching can be controlled depending on its concentration. Addition of benzotriazole in a high concentration is made possible by adding surface active agent (ampholytic surface active agent: alkyldimethyl aminoacetic acid betaine and nonionic surface active agent: polyoxyethylene alkyl ether) at the same time, so that the side face of the conductive layer turns to a shape more vertical.

Eighth Embodiment-1

Thickness of conductive layer in inner layer: 30 μm
Thickness of conductor of 34, 34P, 34E in FIG. 15(B): set to 20 μm
Addition of inhibitor to etching solution
Inhibitor: no added
Etching method
Used nozzle: full-cone nozzle (nozzle for spraying radially)
Swing of nozzle (oscillation): yes
Used nozzle: only bottom face
Because according to the eighth embodiment-1, etching solution as material having no additive was sprayed radially with a full-cone nozzle, the side face of the conductive layer turned to rounded taper, so that the tan $\Theta$ was 1.6 to 2.5 (minimum value–maximum value in 8 data)

Eighth Embodiment-2

The thickness of conductor in the inner layer of the eighth embodiment-1 was changed from 30 μm to 45 μm. The other things were the same.
Side face shape of conductive layer and measurement result of $\Theta$
Taper shape: rounded face
tan $\Theta$: 1.4 to 2.1 (minimum value to maximum value of 8 data)

Eighth Embodiment-3

The thickness of conductor in the inner layer of the eighth embodiment-1 was changed from 30 μm to 60 μm. The other things were the same.
Side face shape of conductive layer and measurement result of $\Theta$
Taper shape: rounded face
tan $\Theta$: 1.4 to 2.1 (minimum value to maximum value of 8 data)

Eighth Embodiment-4

The thickness of conductor in the inner layer of the eighth embodiment-1 was changed from 30 μm to 100 μm. The other things were the same.
Side face shape of conductive layer and measurement result of $\Theta$
Taper shape: rounded face
tan $\Theta$: 1.3 to 1.9 (minimum value to maximum value of 8 data)

Eighth Embodiment-5

Figure 14:
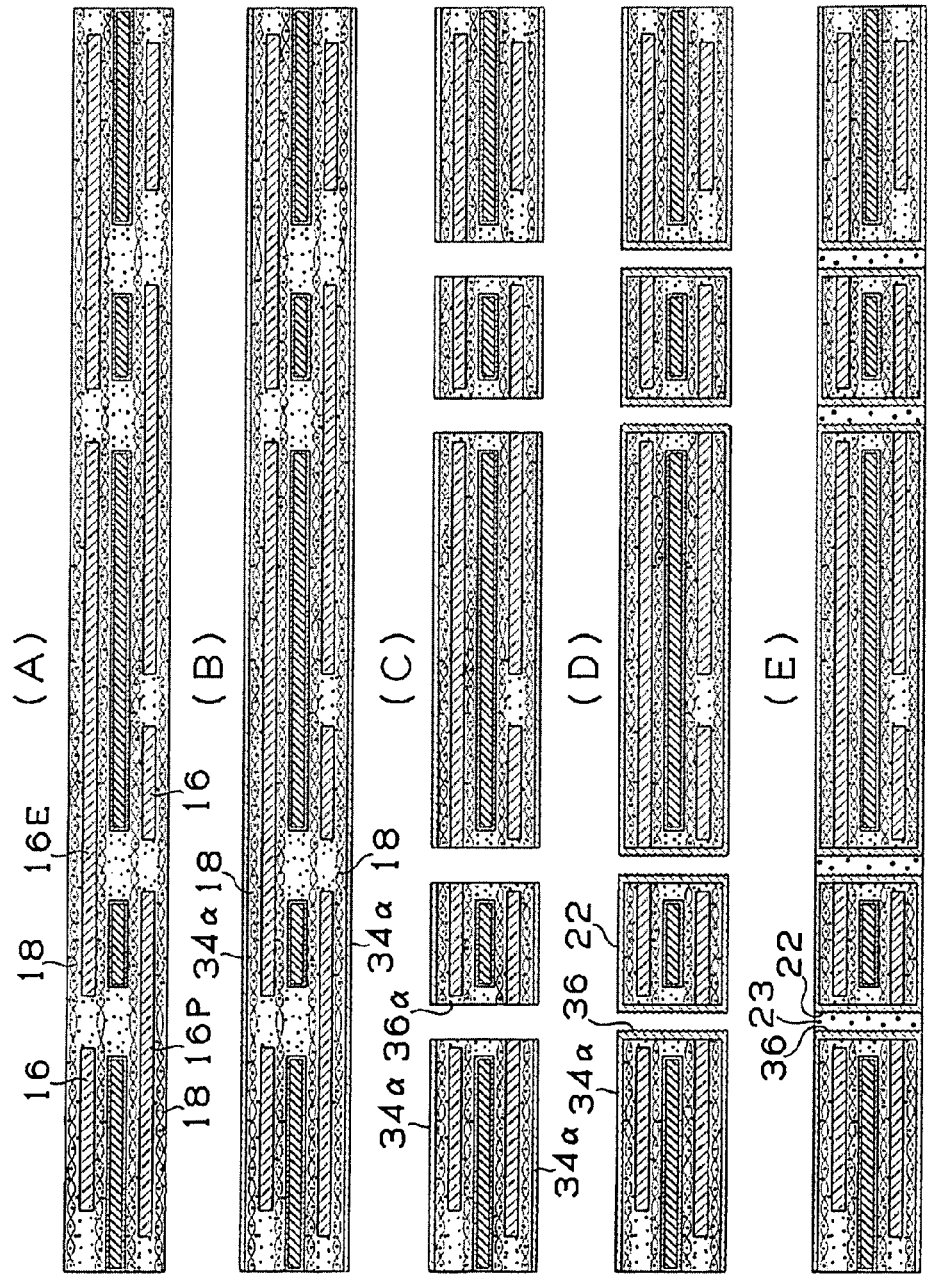
FIGS. 14(A), (B), (C), (D) and (E) are process diagrams showing the manufacturing method of the multilayer printed wiring board according to the fifth embodiment of the present invention.
Figure 15:
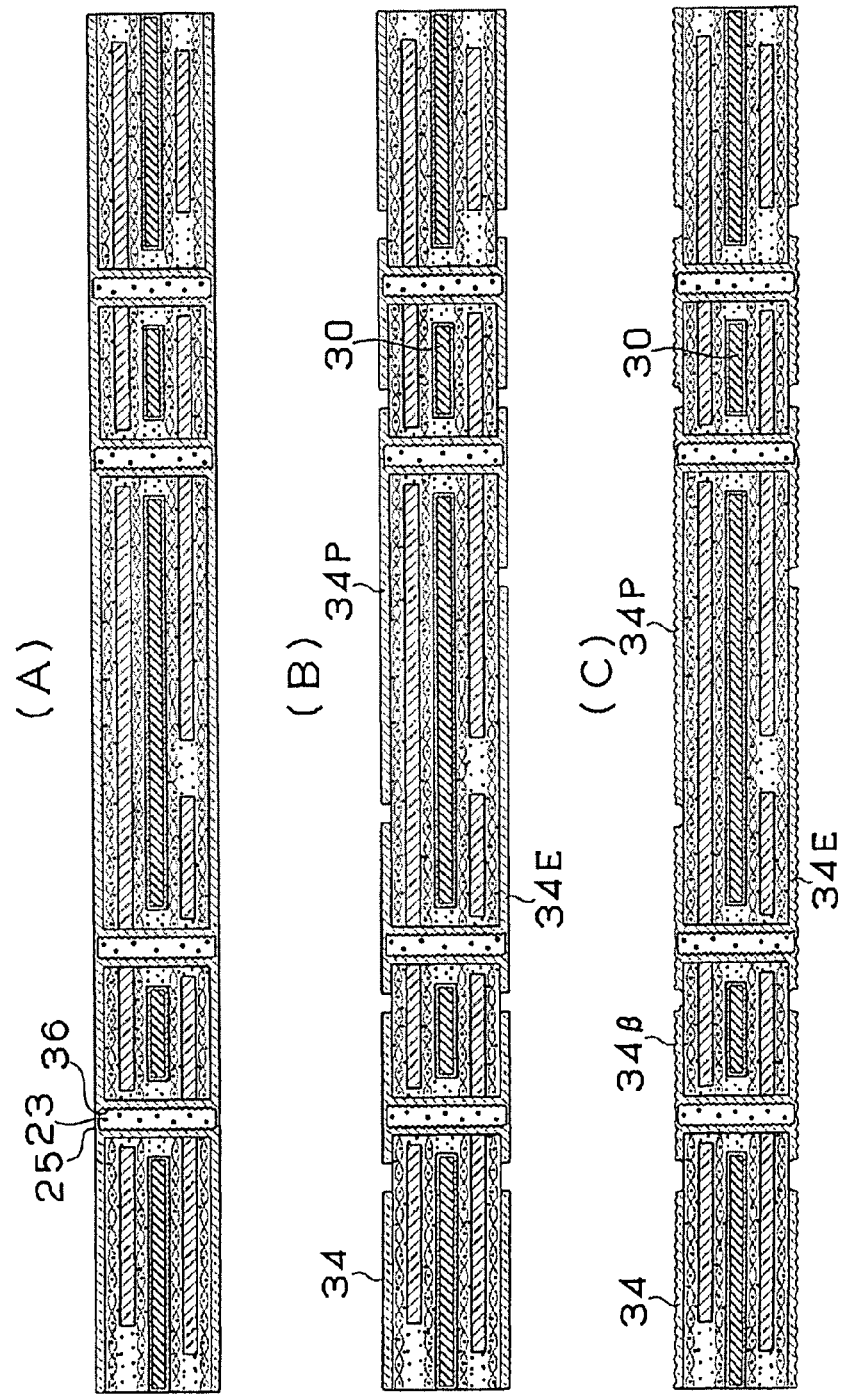
FIGS. 15(A), (B) and (C) are process diagrams showing the manufacturing method of the multilayer printed wiring board according to the fifth embodiment of the present invention.
Figure 16:
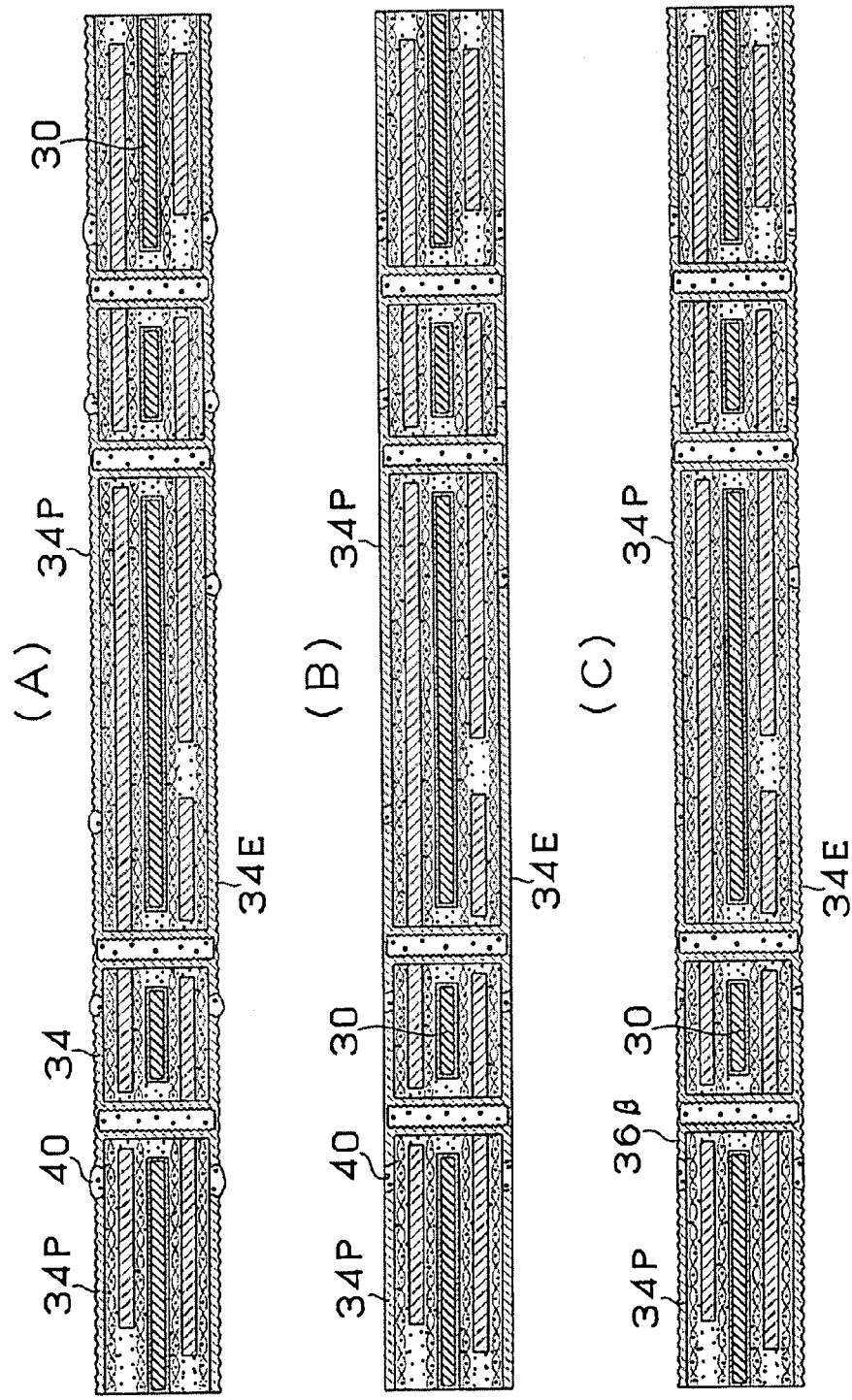
FIGS. 16(A), (B) and (C) are process diagrams showing the manufacturing method of the multilayer printed wiring board according to the fifth embodiment of the present invention.

The thickness of conductor in the inner layer of the eighth embodiment-1 was changed from 30 μm to 125 μm and the thickness of prepreg in FIG. 14 (A) was set tp 225 μm. The other things were the same.
Side face shape of conductive layer and measurement result of $\Theta$
Taper shape: rounded face
tan $\Theta$: 1.3 to 1.9 (minimum value to maximum value of 8 data)

Eighth Embodiment-6

The thickness of conductor in the inner layer of the eighth embodiment-1 was changed from 30 μm to 150 μm and the thickness of prepreg in FIG. 14 (A) was set to 250 μm. The other things were the same.
Side face shape of conductive layer and measurement result of $\Theta$
Taper shape: rounded face
tan $\Theta$: 1.2 to 1.7 (minimum value to maximum value of 8 data)

Eighth Embodiment-7

Thickness of conductive layer in the inner layer: 30 μm
Thickness of conductor of 34, 34P, 34E in FIG. 15(B): set to 20 μm
Addition of inhibitor to etching solution
Inhibitor: benzotriazole (BTA) of 1200 ppm and surface active agent of 450 ppm were added.
Etching method
Used nozzle: slit nozzle (nozzle for spraying linearly)
Nozzle swing (oscillation): none
Used nozzle: only top face
Because according to the eighth embodiment-7, inhibitor was added to etching solution and it was sprayed linearly with a slit nozzle, the tan $\Theta$ became larger than the eighth embodiment-1 to the eighth embodiment-6.
Side face shape of conductive layer and measurement result of $\Theta$
Taper shape: rounded face
tan $\Theta$: 3.0 to 10.8 (minimum value to maximum value of 8 data)

Eighth Embodiment-8

The thickness of conductor in the inner layer of the eighth embodiment-7 was changed from 30 μm to 45 μm. The other things were the same.
Side face shape of conductive layer and measurement result of Θ
Taper shape: rounded face
tan Θ: 3.0 to 11.0 (minimum value to maximum value of 8 data)

Eighth Embodiment-9

The thickness of conductor in the inner layer of the eighth embodiment-7 was changed from 30 μm to 60 μm. The other things were the same.
Side face shape of conductive layer and measurement result of Θ
Taper shape: rounded face
tan Θ: 3.0 to 11.2 (minimum value to maximum value of 8 data)

Eighth Embodiment-10

The thickness of conductor in the inner layer of the eighth embodiment-7 was changed from 30 μm to 100 μm. The other things were the same.
Side face shape of conductive layer and measurement result of Θ
Taper shape: rounded face
tan Θ: 2.8 to 11.2 (minimum value to maximum value of 8 data)

Eighth Embodiment-11

The thickness of conductor in the inner layer of the eighth embodiment-7 was changed from 30 μm to 125 μm and the thickness of prepreg in FIG. 14(A) was set to 225 μm. The other things were the same.
Side face shape of conductive layer and measurement result of Θ
Taper shape: rounded face
tan Θ: 2.7 to 11.0 (minimum value to maximum value of 8 data)

Eighth Embodiment-12

The thickness of conductor in the inner layer of the eighth embodiment-7 was changed from 30 μm to 150 μm and the thickness of prepreg in FIG. 14(A) was set to 250 μm. The other things were the same.
Side face shape of conductive layer and measurement result of Θ
Taper shape: rounded face
tan Θ: 2.7 to 11.4 (minimum value to maximum value of 8 data)

Eighth Embodiment-13

Thickness of conductive layer in inner layer: 30 μm
Thickness of conductor of 34, 34P, 34E in FIG. 15(B): set to 20 μm
Addition of inhibitor to etching solution
Inhibitor: benzotriazole (BTA) of 1000 ppm and surface active agent of 450 ppm were added.
Etching method
Used nozzle: slit nozzle (nozzle for spraying linearly)
Nozzle swing (oscillation): none
Used nozzle: only bottom face
Because according to the eighth embodiment-13, the amount of inhibitor added to etching solution was smaller than the eighth embodiment-7 and spraying was made through only a slit nozzle on the bottom face, the lower value of tan Θ was the same and its range was smaller than the eighth embodiment-7.
Side face shape of conductive layer and measurement result of Θ
Taper shape: rounded face
tan Θ: 3.0 to 5.3 (minimum value to maximum value of 8 data)

Eighth Embodiment-14

The thickness of conductor in the inner layer of the eighth embodiment-13 was changed from 30 μm to 45 μm. The other things were the same.
Side face shape of conductive layer and measurement result of Θ
Taper shape: rounded face
tan Θ: 3.1 to 5.4 (minimum value to maximum value of 8 data)

Eighth Embodiment-15

The thickness of conductor in the inner layer of the eighth embodiment-13 was changed from 30 μm to 60 μm. The other things were the same.
Side face shape of conductive layer and measurement result of Θ
Taper shape: rounded face
tan Θ: 3.1 to 5.4 (minimum value to maximum value of 8 data)

Eighth Embodiment-16

The thickness of conductor in the inner layer of the eighth embodiment-13 was changed from 30 μm to 100 μm. The other things were the same.
Side face shape of conductive layer and measurement result of Θ
Taper shape: rounded face
tan Θ: 2.7 to 5.5 (minimum value to maximum value of 8 data)

Eighth Embodiment-17

The thickness of conductor in the inner layer of the eighth embodiment-13 was changed from 30 μm to 125 μm and the thickness of prepreg in FIG. 14(A) was set to 225 μm. The other things were the same.
Side face shape of conductive layer and measurement result of Θ
Taper shape: rounded face
tan Θ: 2.9 to 5.7 (minimum value to maximum value of 8 data)

Eighth Embodiment-18

The thickness of conductor in the inner layer of the eighth embodiment-13 was changed from 30 μm to 150 μm and the thickness of prepreg in FIG. 14(A) was set to 250 μm. The other things were the same.
Side face shape of conductive layer and measurement result of Θ
Taper shape: rounded face
tan Θ: 2.7 to 5.7 (minimum value to maximum value of 8 data)

Eighth Embodiment-19

Etching was executed with a slit nozzle only on the bottom face under the condition of the eighth embodiment-7. As a result, the range of tan Θ became smaller as compared with the eighth embodiment-7.
Side face shape of conductive layer and measurement result of Θ
Taper shape: rounded face
tan Θ: 4.2 to 10.8 (minimum value to maximum value of 8 data)

Eighth Embodiment-20

The thickness of conductor in the inner layer of the eighth embodiment-19 was changed from 30 μm to 45 μm. The other things were the same.
Side face shape of conductive layer and measurement result of Θ
Taper shape: rounded face
tan Θ: 4.0 to 11.0 (minimum value to maximum value of 8 data)

Eighth Embodiment-21

The thickness of conductor in the inner layer of the eighth embodiment-19 was changed from 30 μm to 60 μm. The other things were the same.
Side face shape of conductive layer and measurement result of Θ
Taper shape: rounded face
tan Θ: 3.8 to 11.0 (minimum value to maximum value of 8 data)

Eighth Embodiment-22

The thickness of conductor in the inner layer of the eighth embodiment-19 was changed from 30 μm to 100 μm. The other things were the same.
Side face shape of conductive layer and measurement result of Θ
Taper shape: rounded face
tan Θ: 3.7 to 11.2 (minimum value to maximum value of 8 data)

Eighth Embodiment-23

The thickness of conductor in the inner layer of the eighth embodiment-19 was changed from 30 μm to 125 μm and the thickness of prepreg in FIG. 14(A) was set to 225 μm. The other things were the same.
Side face shape of conductive layer and measurement result of Θ
Taper shape: rounded face
tan Θ: 3.7 to 11.4 (minimum value to maximum value of 8 data)

Eighth Embodiment-24

The thickness of conductor in the inner layer of the eighth embodiment-19 was changed from 30 μm to 150 μm and the thickness of prepreg in FIG. 14(A) was set to 250 μm. The other things were the same.
Side face shape of conductive layer and measurement result of Θ
Taper shape: rounded face
tan Θ: 3.7 to 11.3 (minimum value to maximum value of 8 data)

Eighth Embodiment-25

The concentration of benzotriazole under the condition of the eighth embodiment-19 was set to 1800 ppm. As a result, the side face shape of the conductive layer turned into linear taper.
Side face shape of conductive layer and measurement result of Θ
Taper shape: linear
tan Θ: 4.0 to 10.8 (minimum value to maximum value of 8 data)

Eighth Embodiment-26

The thickness of conductor in the inner layer of the eighth embodiment-25 was changed from 30 μm to 45 μm. The other things were the same.
Side face shape of conductive layer and measurement result of Θ
Taper shape: linear
tan θ: 4.0 to 10.8 (minimum value to maximum value of 8 data)

Eighth Embodiment-27

The thickness of conductor in the inner layer of the eighth embodiment-25 was changed from 30 μm to 60 μm. The other things were the same. Side face shape of conductive layer and measurement result of Θ
Taper shape: linear
tan Θ: 4.0 to 11.0 (minimum value to maximum value of 8 data)

Eighth Embodiment-28

The thickness of conductor in the inner layer of the eighth embodiment-25 was changed from 30 μm to 100 μm. The other things were the same.
Side face shape of conductive layer and measurement result of Θ
Taper shape: linear
tan Θ: 3.7 to 11.2 (minimum value to maximum value of 8 data)

Eighth Embodiment-29

The thickness of conductor in the inner layer of the eighth embodiment-25 was changed from 30 μm to 125 μm and the thickness of prepreg in FIG. 14(A) was set to 225 μm. The other things were the same.
Side face shape of conductive layer and measurement result of Θ
Taper shape: linear
tan Θ: 3.8 to 11.4 (minimum value to maximum value of 8 data)

Eighth Embodiment-30

The thickness of conductor in the inner layer of the eighth embodiment-25 was changed from 30 μm to 150 μm and the thickness of prepreg in FIG. 14(A) was set to 250 μm. The other things were the same.
Side face shape of conductive layer and measurement result of Θ

Taper shape: linear
tan Θ: 3.7 to 11.4 (minimum value to maximum value of 8 data)

Eighth Comparative Example-1

Under the eighth embodiment-1, the thickness of copper foil in FIG. 13(E) was set to 7.5 μm and the thickness of conductor of 34, 34P, 34E in FIG. 15(B) was set to 7.5 μm. That is, this is a case where the sum of thicknesses of power source conductive layers in the core substrate is equal to the conductor circuit 58 on the interlayer insulation layer.

Eighth Comparative Example-2

Under the eighth embodiment-7, the thickness of copper foil in FIG. 13(E) was set to 7.5 μm and the thickness of conductor of 34, 34P, 34E in FIG. 15(B) was set to 7.5 μm. That is, this is a case where the sum of thicknesses of power source conductive layers in the core substrate is equal to the conductor circuit 58 on the interlayer insulation layer.

Eighth Comparative Example-3

Under the eighth embodiment-3, the thickness of copper foil in FIG. 13(E) was set to 7.5 μm and the thickness of conductor of 34, 34P, 34E in FIG. 15(B) was set to 7.5 μm. That is, this is a case where the sum of thicknesses of power source conductive layers in the core substrate is equal to the conductor circuit 58 on the interlayer insulation layer.

Eighth Comparative Example-4

Under the eighth embodiment-9, the thickness of copper foil in FIG. 13(E) was set to 7.5 μm and the thickness of conductor of 34, 34P, 34E in FIG. 15(B) was set to 7.5 μm. That is, this is a case where the sum of thicknesses of power source conductive layers in the core substrate is equal to the conductor circuit 58 on the interlayer insulation layer.

FIG. 30 shows the taper shape of the multilayer printed wiring board of each of the eighth embodiments and eighth comparative examples and the tan Θ. Whether or not a loaded IC chip malfunctioned was confirmed about the multilayer printed wiring board of the eighth embodiments and the eighth comparative examples according to the method described below.

As for the IC chip, any one of the IC chips selected from following Nos. 1-4 was loaded on each multilayer printed wiring board and the simultaneous switching was executed 100 times to evaluate whether or malfunction occurred.

FIG. 30 shows a multilayer printed wiring board and a result of simultaneous switching test.
No. 1: drive frequency: 3.06 GHz, bass clock (FSB): 533 MHz
No. 2: drive frequency: 3.2 GHz, bass clock (FSB): 800 MHz
No. 3: drive frequency: 3.4 GHz, bass clock (FSB): 800 MHz
No. 4: drive frequency: 3.46 GHz, bass clock (FSB): 1066 MHz The same heat cycle test as for the seventh embodiment was carried out for the multilayer printed wiring board of the eighth embodiments 19-30 loaded with the IC 1,000 times, 2,000 times to evaluate connection resistance. Connection resistance of a closed circuit connected to the measuring terminal 2 on the rear surface of the multilayer printed wiring board through an IC from the measuring terminal 1 on the rear surface of the multilayer printed wiring board was measured. If (connection resistance after heat cycle−connection resistance as initial value)/connection resistance of initial value× 100 is within ±10%, it is acceptable and otherwise, it is unacceptable.

Figure 31:
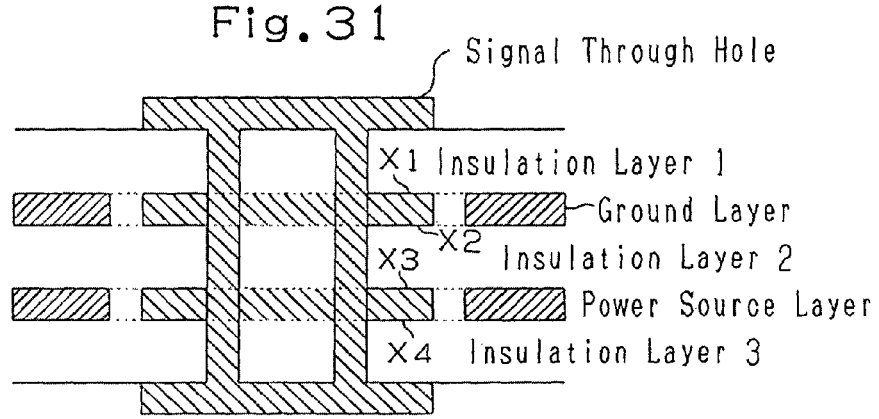
FIG. 31 is a schematic view of the signal through hole passing the multilayer core.

From a result of loading the No. 1 IC chip, it was made evident that no malfunction occurred in the multilayer printed wiring board of the present invention. From comparison of the eight embodiment-1 loaded with the No. 2 IC chip with the eighth embodiments-7, 13, 19, 25, it was evident that the thickness of the conductive layer of the core substrate was larger than the thickness of the conductor circuit on the interlayer insulation layer and that if the value of tan Θ was over 2.7, malfunction was difficult to occur. Because the conductive volume of the conductive layer in the inner layer according to the eighth embodiment-1 is small, resistance of the power source layer rises and therefore, it can be estimated that malfunction occurred because delay was generated in supply of power. According to the multilayer printed wiring board loaded with the No. 3 IC chip, no malfunction occurred if the thickness of the conductive layer in the inner layer was 60-100 μm, however, malfunction occurred in the eighth embodiments-1, 2 whose tan Θ was small and the eighth embodiments-11, 12 whose tan Θ range was large. The reason why malfunction occurred in the eighth embodiments-11, 12 is estimated to be that a difference of impedance of the signal through hole passing through the multilayer core increased among through holes so that a difference was generated in arrival of signal. If comparing the eighth embodiments-19 to 24 loaded with the No. 4 IC chip with the multilayer printed wiring board of the eighth embodiments-25 to 30, it is evident that malfunction is difficult to occur if the shape of the taper is rounded. The reason is estimated to be that because if the side face of the conductive layer in the inner layer was linear, a difference of impedance (see FIG. 31) sensed by the signal through hole became larger than in case of a rounded multilayer printed wiring board, causing more signal reflection or that the side face of the conductive layer and the insulation layer adhere to each other.

According to the eighth embodiments-13 to 24, it was evident that the tan Θ was 2.7 to 5.7 or 3.7 to 11.4 and that the thickness of the conductor in the inner layer was preferred to be 45 to 150 μm.

Multilayer printed wiring boards of the eighth embodiments-14 to 18, 20 to 24 were left under high temperature and high humidity (85° C., 85%) for 100 hours and a No. 4 IC chip was loaded and the simultaneous switching was carried out. Although no malfunction occurred in the eighth embodiments-15 to 18, 21 to 24 in which the thickness of the conductive layer in the inner layer was 60 to 150 μm, malfunction was observed in the eighth embodiments-14, 20. The reason is estimated to be that resistance of the conductor rose due to high temperature/high humidity test. From this result, it is evident that the tan Θ is 2.7 to 5.7 or 3.7 to 11.4 and that the thickness of the conductor in the inner layer is preferred to be 60 to 150 μm.

Ninth Embodiment

Multilayer printed wiring boards of the ninth embodiment-1 to ninth embodiment-28 and the ninth comparative example 1 to ninth comparative example 3 were manufactured according to the fifth embodiment. In each embodiment and comparative example, the thickness of the conductive layer of the core substrate, the quantity of layers in the conductive layer of the core substrate, quantity of through holes having no dummy land, area having no dummy land and the thickness of the conductive layer on the interlayer insulation layer were changed. If the thickness of the conductive layer in the inner layer was changed, the thickness of the copper foil was changed in FIG. 13(E). If the thickness of the conductive layer on the front and rear surfaces of the core substrate was changed, the thickness of the copper foil in FIG. 14(B) and the thickness of plating in FIGS. 14(D), 15(A) were changed. When the quantity of layers of the conductive layer of the core substrate was changed, formation of a circuit, roughing of circuit surface, and lamination of prepreg and copper foil were repeated a predetermined time after the process of FIG. 14(B). If the quantity of through holes having no dummy land and area having no dummy land were changed, an exposure mask at the time of etching resist formation for etching the copper foil was changed at the time of circuit formation (tenting method) of FIG. 13(F). When the thickness of the conductive layer on the interlayer insulation layer was changed, the thickness of plating was changed in FIG. 3(C).

Hereinafter, the quantity of layers of the core of each embodiment and comparative example, the thickness of the power source conductive layer, the thickness of the conductive layer on the interlayer insulation layer, the quantity of through holes having no dummy land, its area and the like are shown below.

Ninth Embodiment-1

Thickness of power source conductive layer in inner layer of 4-layer core substrate: 25 μm
Thickness of power source conductive layer on front surface layer of 4-layer core substrate: 15 μm
Sum of thicknesses of power source conductive layer of core substrate: 40 μm
Thickness of conductive layer on interlayer insulation layer: 20 μm

Ninth Embodiment-2

Thickness of power source conductive layer in inner layer of 4-layer core substrate: 15 μm
Thickness of power source conductive layer on front surface layer of 4-layer core substrate: 9 μm
Sum of thicknesses of power source conductive layer of core substrate: 24 μm
Thickness of conductive layer on interlayer insulation layer: 20 μm

Ninth Embodiment-3

Thickness of power source conductive layer in inner layer of 4-layer core substrate: 45 μm
Thickness of power source conductive layer on front surface layer of 4-layer core substrate: 15 μm
Sum of thicknesses of power source conductive layer of core substrate: 60 μm
Thickness of conductive layer on interlayer insulation layer: 20 μm

Ninth Embodiment-4

Thickness of power source conductive layer in inner layer of 4-layer core substrate: 60 μm
Thickness of power source conductive layer on front surface layer of 4-layer core substrate: 15 μm
Sum of thicknesses of power source conductive layer of core substrate: 75 μm
Thickness of conductive layer on interlayer insulation layer: 20 μm

Ninth Embodiment-5

Thickness of power source conductive layer in inner layer of 14-layer core substrate: 100 μm
Thickness of power source conductive layer on front surface layer of 14-layer core substrate: 15 μm
Sum of thicknesses of power source conductive layer of core substrate: 615 μm
Thickness of conductive layer on interlayer insulation layer: 20 μm

Ninth Embodiment-6

Thickness of power source conductive layer in inner layer of 18-layer core substrate: 100 μm
Thickness of power source conductive layer on front surface layer of 18-layer core substrate: 15 μm
Sum of thicknesses of power source conductive layer of core substrate: 815 μm
Thickness of conductive layer on interlayer insulation layer: 20 μm

Ninth Embodiment-7

Thickness of power source conductive layer in inner layer of 4-layer core substrate: 15 μm
Thickness of power source conductive layer on front surface layer of 4-layer core substrate: 45 μm
Sum of thicknesses of power source conductive layer of core substrate: 60 μm
Thickness of conductive layer on interlayer insulation layer: 20 μm

Ninth Embodiment-8

Thickness of power source conductive layer in inner layer of 4-layer core substrate: 15 μm
Thickness of power source conductive layer on front surface layer of 4-layer core substrate: 60 μm
Sum of thicknesses of power source conductive layer of core substrate: 75 μm
Thickness of conductive layer on interlayer insulation layer: 20 μm

Ninth Embodiment-9

Thickness of power source conductive layer in inner layer of 4-layer core substrate: 50 μm
Thickness of power source conductive layer on front surface layer of 4-layer core substrate: 15 μm
Sum of thicknesses of power source conductive layer of core substrate: 65 μm
Thickness of conductive layer on interlayer insulation layer: 20 μm

Ninth Embodiment-10

Thickness of power source conductive layer in inner layer of 4-layer core substrate: 150 μm
Thickness of power source conductive layer on front surface layer of 4-layer core substrate: 15 μm
Sum of thicknesses of power source conductive layer of core substrate: 165 μm
Thickness of conductive layer on interlayer insulation layer: 20 μm In process for formation of outer insulation layer and conductive layer (4) of the above-described fifth embodiment, a prepreg 300 μm thick was used.

Ninth Embodiment-11

Thickness of power source conductive layer in inner layer of 4-layer core substrate: 175 μm
Thickness of power source conductive layer on front surface layer of 4-layer core substrate: 15 μm
Sum of thicknesses of power source conductive layer of core substrate: 190 μm
Thickness of conductive layer on interlayer insulation layer: 20 μm
In process for formation of outer insulation layer and conductive layer (4) of the above-described fifth embodiment, a prepreg 300 μm thick was used.

Ninth Embodiment-12

Thickness of power source conductive layer in inner layer of 4-layer core substrate: 200 μm
Thickness of power source conductive layer on front surface layer of 4-layer core substrate: 15 μm
Sum of thicknesses of power source conductive layer of core substrate: 215 μm
Thickness of conductive layer on interlayer insulation layer: 20 μm
In process for formation of outer insulation layer and conductive layer (4) of the above-described fifth embodiment, a prepreg 300 μm thick was used.

Ninth Embodiment-13

Part of the power source through holes and grounding through holes of the ninth embodiment-3 were formed as through holes having no dummy land indicated in the (5)<process of formation of a circuit composed of metallic layer as inner layer> of the fifth embodiment. The area is a portion just below the IC. The quantity of the power source through holes having no dummy land was set to 50% all the power source through holes and the quantity of the grounding through holes having no dummy land was set to 50% all the grounding through holes.

Ninth Embodiment-14

All the power source through holes and grounding through holes located just below the IC of the ninth embodiment-3 were formed as through holes having no dummy land indicated in the (5)<process of formation of a circuit composed of metallic layer as inner layer> of the fifth embodiment.

Ninth Embodiment-15

Part of the power source through holes and grounding through holes of the ninth embodiment-9 were formed as through holes having no dummy land indicated in the (5)<process of formation of a circuit composed of metallic layer as inner layer> of the fifth embodiment. The area is a portion just below the IC. The quantity of the power source through holes having no dummy land was set to 50% all the power source through holes and the quantity of the grounding through holes having no dummy land was set to 50% all the grounding through holes.

Ninth Embodiment-16

All the power source through holes and grounding through holes located just below the IC of the ninth embodiment-9 were formed as through holes having no dummy land indicated in the (5)<process of formation of a circuit composed of metallic layer as inner layer> of the fifth embodiment.

Ninth Embodiment-17

Part of the power source through holes and grounding through holes of the ninth embodiment-4 were formed as through holes having no dummy land indicated in the (5)<process of formation of a circuit composed of metallic layer as inner layer> of the fifth embodiment. The area is a portion just below the IC. The quantity of the power source through holes having no dummy land was set to 50% all the power source through holes and the quantity of the grounding through holes having no dummy land was set to 50% all the grounding through holes.

Ninth Embodiment-18

All the power source through holes and grounding through holes located just below the IC of the ninth embodiment-4 were formed as through holes having no dummy land indicated in the (5)<process of formation of a circuit composed of metallic layer as inner layer> of the fifth embodiment.

Ninth Embodiment-19

Part of the power source through holes and grounding through holes of the ninth embodiment-10 were formed as through holes having no dummy land indicated in the (5)<process of formation of a circuit composed of metallic layer as inner layer> of the fifth embodiment. The area is a portion just below the IC. The quantity of the power source through holes having no dummy land was set to 50% all the power source through holes and the quantity of the grounding through holes having no dummy land was set to 50% all the grounding through holes.

Ninth Embodiment-20

All the power source through holes and grounding through holes located just below the IC of the ninth embodiment-10 were formed as through holes having no dummy land indicated in the (5)<process of formation of a circuit composed of metallic layer as inner layer> of the fifth embodiment.

Ninth Embodiment-21

Part of the power source through holes and grounding through holes of the ninth embodiment-1 were formed as through holes having no dummy land indicated in the (5)<process of formation of a circuit composed of metallic layer as inner layer> of the fifth embodiment. The area is a portion just below the IC. The quantity of the power source through holes having no dummy land was set to 50% all the power source through holes and the quantity of the grounding through holes having no dummy land was set to 50% all the grounding through holes.

Ninth Embodiment-22

All the power source through holes and grounding through holes located just below the IC of the ninth embodiment-11 were formed as through holes having no dummy land indicated in the (5)<process of formation of a circuit composed of metallic layer as inner layer> of the fifth embodiment.

Ninth Embodiment-23

Part of the power source through holes and grounding through holes of the ninth embodiment-12 were formed as through holes having no dummy land indicated in the (5)<process of formation of a circuit composed of metallic layer as inner layer> of the fifth embodiment. The area is a portion just below the IC. The quantity of the power source through holes having no dummy land was set to 50% all the power source through holes and the quantity of the grounding through holes having no dummy land was set to 50% all the grounding through holes.

Ninth Embodiment-24

All the power source through holes and grounding through holes located just below the IC of the ninth embodiment-12 were formed as through holes having no dummy land indicated in the (5)<process of formation of a circuit composed of metallic layer as inner layer> of the fifth embodiment.

Ninth Embodiment-25

Part of the power source through holes and grounding through holes of the ninth embodiment-7 were formed as through holes having no dummy land indicated in the (5)<process of formation of a circuit composed of metallic layer as inner layer> of the fifth embodiment. The area is a portion just below the IC. The quantity of the power source through holes having no dummy land was set to 50% all the power source through holes and the quantity of the grounding through holes having no dummy land was set to 50% all the grounding through holes.

Ninth Embodiment-26

All the power source through holes and grounding through holes located just below the IC of the ninth embodiment-7 were formed as through holes having no dummy land indicated in the (5)<process of formation of a circuit composed of metallic layer as inner layer> of the fifth embodiment.

Ninth Embodiment-27

Thickness of power source conductive layer in each inner layer of 6-layer core substrate: 32.5 μm
Thickness of power source conductive layer on front surface layer of 6-layer core substrate: 15 μm
Sum of thicknesses of power source conductive layers of core substrate: 80 μm
Thickness of conductive layer on interlayer insulation layer: 20 μm

Ninth Embodiment-28

Thickness of power source conductive layer in each inner layer of 4-layer core substrate: 125 μm
Thickness of power source conductive layer on front surface layer of 4-layer core substrate: 15 μm
Sum of thicknesses of power source conductive layers of core substrate: 140 μm
Thickness of conductive layer on interlayer insulation layer: 20 μm

Ninth Comparison Example-1

Thickness of power source conductive layer in each inner layer of 4-layer core substrate: 10 μm
Thickness of power source conductive layer on front surface layer of 4-layer core substrate: 10 μm
Sum of thicknesses of power source conductive layers of core substrate: 20 μm
Thickness of conductive layer on interlayer insulation layer: 20 μm

Ninth Comparison Example-2

Thickness of power source conductive layer in each inner layer of 18-layer core substrate: 100 μm
Thickness of power source conductive layer on front surface layer of 18-layer core substrate: 40 μm
Sum of thicknesses of power source conductive layers of core substrate: 840 μm
Thickness of conductive layer on interlayer insulation layer: 20 μm

Ninth Comparison Example-3

Thickness of power source conductive layer in each inner layer of 22-layer core substrate: 100 μm
Thickness of power source conductive layer on front surface layer of 22-layer core substrate: 15 μm
Sum of thicknesses of power source conductive layers of core substrate: 1015 μm
Thickness of conductive layer on interlayer insulation layer: 20 μm In the multilayer printed wiring boards of the ninth embodiment and ninth comparative example, all the through holes have a dummy land unless anything about dummy land is mentioned.

The amounts of voltage drop (voltage drop corresponding to the third time of voltage drops generated in a plurality of quantities) occurring when an IC chip of 3.1 GHz in frequency was mounted on a multilayer printed wiring board of the ninth embodiment-1 to ninth embodiment-12, ninth embodiments-27, 28 and ninth comparative example-1 to ninth comparative example-3 and started by supplying the same amount of power were measured. In the meantime, because in the IC, a voltage of the IC could not be measured directly, a circuit which enabled the measurement was formed on the printed wiring board and the voltage of the IC was measured. The values of the voltage drops at this time are shown in FIGS. 32, 33. This is a value of the voltage drop when the voltage of power supply was 1.0 V.

Further, HAST test (85° C., 85% in humidity, 3.3V applied) was executed on the printed wiring boards of the ninth embodiment-1 to the ninth embodiment-12, the ninth embodiment-28, the ninth comparative example-1 to ninth comparative example-3. A pattern to be evaluated is an insulation resistance evaluation test pattern formed in the core substrate. The result is shown in FIG. 32. The test time is 115 hours and if the insulation resistance is over $10^7 \Omega$, its result is acceptable and otherwise, it is unacceptable.

According to the ninth embodiments-3, 4, 7, 8, the minimum line interval and line width formation capacity evaluation pattern (see the process (10) of the fifth embodiment) were evaluated during manufacturing of the printed wiring board. This result is show as a formation capacity in FIG. 34. In the same Figure, O indicates that there was a short-circuit and X indicates that there was a short-circuit between adjoining wirings.

Figure 35:
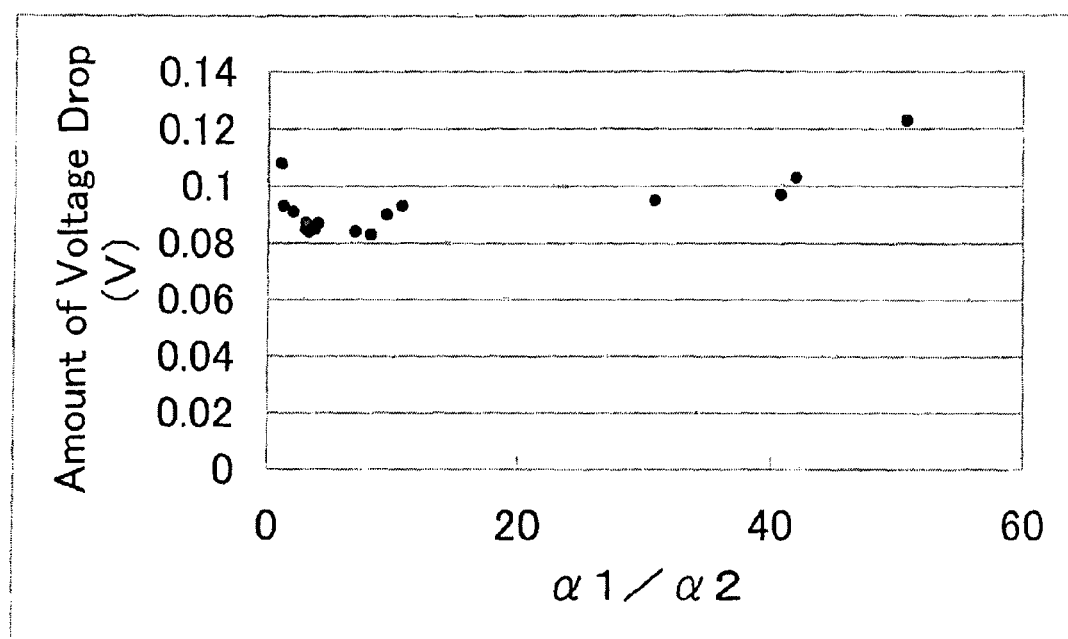
FIG. 35 is a graph of voltage drop amount to α1/α2.

FIGS. 32, 33 show the amount of the voltage drop and a result of insulation resistance after the HAST with respect to various α1/α2. As the result of the HAST test, an acceptable result is indicated with O and an unacceptable result is indicated with X. FIG. 35 shows a graph of the voltage drop amount with respect to the various $\alpha1/\alpha2$.

If in the results of FIGS. 32, 33, the deflection tolerable range is within ±10% (voltage drop amount of the third time) when the power voltage is 1.0 V, it comes that the behavior of voltage is stable, thereby inducing no malfunction of the IC chip. That is, if the voltage drop amount is less than 0.1 V, malfunction of the IC chip due to the voltage drop is not induced. Therefore, if it is less than 0.09 V, the stability is increased. For the reason, it is better if the ratio of (sum of thicknesses of power source conductive layers of multilayer core substrate/thickness of conductive layer on interlayer insulation layer) is over 1.0. Further, if 1.2≤(sum of thicknesses of power source conductive layers of multilayer core substrate/thickness of conductive layer on interlayer insulation layer)≤40, it is within the deflection tolerable range.

However, if that value exceeds 8.25, it begins to rise and if it exceeds 40, the amount of the voltage drop exceeds 0.1 V. The reason is estimated to be that the conductive layer of the multilayer core substrate is thickened and the quantity of layers of the inner layer increases, so that the length of the through hole increases thereby taking long to supply power to the IC.

However, if (sum of the thicknesses of power source conductive layers of the multilayer core substrate/thickness of conductive layer on interlayer insulation layer) is within the above-described range, according to the ninth embodiments-11, 12 in which only a single conductive layer is thickened, the insulation reliability of the core substrate is inferior to other embodiments and the result is unacceptable (see FIG. 32). By setting the sum of the thicknesses of the power source conductive layers by forming the core into multilayer structure without thickening only a single layer, it is possible to produce a printed wiring board having an excellent insulation reliability, in which no malfunction occurs even if a high frequency IC is loaded.

As a result of analyzing an insulation property evaluation test pattern of the core substrate of the ninth embodiments-11, 12, the interval between lines was kept small. It is estimated that the insulation resistance drops below the standard because of this reason. From comparison of the ninth embodiments-3, 4 of FIG. 34 with the ninth embodiments-7, 8, it is evident that it is preferable that the thickness of the conductive layers on the front and rear surfaces of the multilayer core substrate is smaller than the thickness of the conductive layer in the inner layer. The reason is that because interlayer agent swells when thick conductive layers are formed on the front and rear surfaces, fine wiring cannot be formed on the interlayer insulation layer.

About the multilayer printed wiring board manufactured according to the ninth embodiments-1 to 12, 27, 28 and the ninth comparative examples 1 to 3, whether or not malfunction occurred in a loaded IC chip was confirmed according to a method described below.

As the IC chip, any one of following Nos. 1 to 3 IC chips was mounted on each multilayer printed wiring board and whether or not malfunction occurred was evaluated by executing the simultaneous switching 100 times.

Its result is shown in FIG. 33.

No. 1: drive frequency: 3.06 GHz, bass clock (FSB): 533 MHz
No. 2: drive frequency: 3.2 GHz, bass clock (FSB): 800 MHz
No. 3: drive frequency: 3.46 GHz, bass clock (FSB): 1066 MHz According to a result of loading a No. 1 IC chip, if the ratio of $\alpha1/\alpha2$ is over 1.0 to less than 40, it is evident that no malfunction is observed in the IC. This reason is estimated to be that because the conductor resistance of the power source layer is low, the supply of power to the IC is carried out immediately. Because according to the result of loading a No. 2 IC chip, power needs to be supplied to the IC in a shorter time if the drive frequency of the IC is accelerated, it is evident that a more preferable range exists. The reason why malfunction occurred in the ninth embodiments-11, 12 in which the conductive layer in the inner layer of the multilayer core is thick and the ninth embodiments-5, 6 having many layers in the inner layer is estimated to be that a signal deteriorates when it is propagated through the signal through hole (through hole connected electrically with the IC signal circuit) as well as that it takes long to supply power because the core substrate was thickened. When the signal through hole passes through the 4-layer core, from the top, that through hole passes through the insulation layer (insulation layer between the power source layer on the front surface layer and the ground layer in the inner layer in FIG. 18), the ground layer, the insulation layer (insulation layer between the ground layer in the inner layer and power source layer in the inner layer in FIG. 18), the power source layer and the insulation layer (insulation layer between the power source layer in the inner layer and ground layer on the surface in FIG. 18). Because impedance changes in the signal wiring depending on surrounding ground or presence/absence of power source, for example, the value of impedance differs across an interface between an insulation layer between the power source layer on the front surface layer and the ground layer and the ground layer. Thus, reflection of signal occurs on that interface. The same thing occurs on other interface. Because the change amount of impedance increases as a distance between the signal through hole and ground layer or power source layer decreases or the thickness of the ground layer and power source layer increases or the quantity of interfaces increases, it is estimated that malfunction occurred in the ninth embodiments-5, 6, 11, 12. In the ninth embodiments-1, 2, it is estimated that it occurred because the sum of the thicknesses of the power source layers is small.

From a result of loading the No. 3 IC, it is evident that forming a 4-layer core whose $\alpha1/\alpha2$ is 3 to 7 is effective if the IC is accelerated more. This reason is estimated to be that supply of power in a short time and prevention of deterioration of the signal can be achieved at the same time. From comparison of the ninth embodiments-3, 4 and the ninth embodiments-7, 8, it is evident that disposing a thick conductive layer in the inner layer is also advantageous from electrical viewpoints. This reason is estimated to be that inductance decreases due to interaction between the power source through hole and ground layer in the inner layer and between the ground through hole and the power source layer in the inner layer in order to equip the inner layer with a thick conductive layer.

About the multilayer printed wiring board manufactured according to the ninth embodiments-13 to 26, whether or not malfunction occurred in a loaded IC chip was verified according to a method described below.

As the IC chip, any one selected from following Nos. 1-3 IC chips was loaded on each multilayer printed wiring board and whether or not malfunction occurred was evaluated by executing the simultaneous switching 100 times.

FIG. 36 shows those results. TH in the same diagram is an abbreviation of the through hole.

No. 1: drive frequency: 3.06 GHz, bass clock (FSB): 533 MHz
No. 2: drive frequency: 3.2 GHz, bass clock (FSB): 800 MHz
No. 3: drive frequency: 3.46 GHz, bass clock (FSB): 1066 MHz If comparing the ninth embodiment-10 with the ninth embodiments-19, 20, it is evident that malfunction of the IC is difficult to generate by forming a through hole having no dummy land. This reason is estimated to be that mutual inductance decreased because the through hole and conductive layer in the inner layer each having an opposite potential approach each other corresponding to having no dummy land. Alternatively, the reason is that because electricity likely flows on the surface of the conductor, the length of wiring on which electricity flows decreases corresponding to having no dummy land.

Printed wiring boards of the ninth embodiments-3, 4, 13, 14, 17, 18, 28 were left under high temperature/high humidity (85° C., 85%) for 100 hours. After that, the aforementioned No. 3 IC chip was mounted on the printed wiring board and whether or not malfunction occurred was confirmed by executing the simultaneous switching. No malfunction occurred except the ninth embodiment-3. The reason is estimated to be that the malfunction occurred in the ninth embodiment-3 because resistance of the conductive layer increased because of the high temperature/high humidity test. The reasons for the other embodiments is estimated to be that although resistance rose, no malfunction occurred because inductance was lower than the ninth embodiment-3 as the thickness of the conductive layer was large or there was provided a through hole having no dummy land. Therefore, the thickness of the conductive layer in the inner layer is preferred to be 60 μm to 125 μm. In conclusion, in the multilayer core, it is estimated that the thickness of the conductor in the inner layer and the through hole having no dummy land influence each other.

Tenth Embodiment

In the process of FIG. 13(F), the power source through hole just below the IC and ground through hole were formed as through holes having no dummy land in the multilayer printed wiring board of the eighth embodiments-14 to 18, 20 to 24. As for the quantity thereof, they were produced so that the quantities were 50% and 100% with respect to all power source through holes and all ground through holes. Those were named tenth embodiments-1 to 20. Printed wiring board of the tenth embodiments-1 to 20 were left under high temperature/high humidity (85° C./85%) for 100 hours. After that, a No. 4 IC chip used in the evaluation test of the eighth embodiment was mounted and the simultaneous switching was executed. Its result is shown in FIG. 37. From this result, it is evident that the result becomes better by forming the through hole as a through hole having no dummy land and tapering the side wall of the conductive layer. The thickness of the conductor of the ground layer in the inner layer of the embodiments 7-10 is equal to the thickness of the conductor of the power source layer in the inner layer and the thickness of the conductor in the ground layer on the rear surface of the core substrate is equal to the thickness of the conductor in the power source layer on the front surface. For the reason, the sum of the thicknesses of the conductors in the ground layer is large like the power source layer, whereby reducing noise, so that malfunction is unlikely to occur.

The invention claimed is:

1. A multilayer printed wiring board, comprising:
a core substrate;
an interlayer insulation layer formed on the core substrate; and
a conductive layer formed on the interlayer insulation layer,
wherein said core substrate has a plurality of conductive layers comprising a plurality of power conductor layers, a plurality of ground conductor layers, and a plurality of signal conductor layers, the power conductor layers and the ground conductor layers are alternately formed in the core substrate, the plurality of power conductor layers is connected to power and includes an outer power conductor layer formed on a first surface of the core substrate and an inner power conductor layer formed inside the core substrate, the plurality of ground conductor layers is connected to ground and includes an outer ground conductor layer formed on a second surface of the core substrate and an inner ground conductor layer formed inside the core substrate, the plurality of signal conductor layers includes a first inner signal conductor layer and a second inner signal conductor layer, the first inner signal conductor layer is formed on a same layer as the inner power conductor layer, and the second inner signal conductor layer is formed on a same layer as the inner ground conductor layer, and at least one of the inner power and ground conductor layers in said core substrate is relatively thick compared to other ones of the inner power and ground conductor layers, and at least one of the outer power and ground conductor layers in said core substrate is relatively thin compared to other ones of the outer power and ground conductor layers.

2. The multilayer printed wiring board according to claim 1, wherein the inner power and ground conductor layers of said core substrate have thicknesses which are larger than a thickness of the conductive layer on the interlayer insulation layer.

3. The multilayer printed wiring board according to claim 1, further comprising a metal plate positioned inside the core substrate, wherein the metal plate is isolated electrically from the plurality of conductive layers in the core substrate by a plurality of resin layers formed in the core substrate.

4. The multilayer printed wiring board according to claim 1, wherein at least one of the conductive layers of said core substrate has a tapered side face, and the tapered side face satisfies a relational equation, 2.8<tan Θ<55, where Θ represents an angle formed by a straight line connecting the top end and bottom end of the tapered side face of the at least one of the conductive layers and a horizontal face of the core substrate.

5. The multilayer printed wiring board according to claim 1, wherein the outer and inner power conductor layers and the conductive layer formed on the interlayer insulation layer satisfy a relation of α2<α1≤40α2, where α1 represents the sum of thicknesses of the outer and inner power conductor layers of said core substrate and α2 represents a thickness of the conductive layer formed on the interlayer insulation layer.

6. The multilayer printed wiring board according to claim 1, wherein the outer and inner ground conductor layers and the conductive layer formed on the interlayer insulation layer satisfy a relation of α2<α1≤40α2, where α1 represents the sum of thicknesses of the outer and inner ground conductor layers of said core substrate, and α2 represents a thickness of the conductive layer formed on the interlayer insulation layer.

7. The multilayer printed wiring board according to claim 1, wherein the outer and inner power conductor layers and the conductive layer formed on the interlayer insulation layer satisfy a relation of α2<α1≤40α2, where α1 represents the sum of thicknesses of the outer and inner power conductor layers of said core substrate, and α2 represents a thickness of the conductive layer formed on the interlayer insulation layer, and the outer and inner ground conductor layers and the conductive layer formed on the interlayer insulation layer satisfy a relation of $\alpha 2 < \alpha 3 \leq 40 \alpha 2$, where $\alpha 3$ represents the sum of thicknesses of the outer and inner ground conductor layers of said core substrate, and $\alpha 2$ represents the thickness of the conductive layer formed on the interlayer insulation layer.

8. The multilayer printed wiring board according to claim 1, wherein the core substrate has a plurality of through holes which connects the power conductor layers and a plurality of through holes which connects the ground conductor layers.

9. The multilayer printed wiring board according to claim 1, wherein the interlayer insulation layer is formed on the first surface of the core substrate and the outer power conductor layer, and the interlayer insulation layer has a via hole structure connecting the outer power conductor layer and the conductive layer formed on the interlayer insulation layer.

10. The multilayer printed wiring board according to claim 1, wherein the interlayer insulation layer is formed on the second surface of the core substrate and the outer ground conductor layer, and the interlayer insulation layer has a via hole structure connecting the outer ground conductor layer and the conductive layer formed on the interlayer insulation layer.

11. The multilayer printed wiring board according to claim 1, wherein the outer power conductor layer has a thickness which is greater than a thickness of the conductive layer formed on the interlayer insulation layer.

12. The multilayer printed wiring board according to claim 1, wherein the outer ground conductor layer has a thickness which is greater than a thickness of the conductive layer formed on the interlayer insulation layer.

13. The multilayer printed wiring board according to claim 1, wherein the outer power conductor layer has a thickness which is greater than a thickness of the conductive layer formed on the interlayer insulation layer, and the outer ground conductor layer has a thickness which is greater than a thickness of the conductive layer formed on the interlayer insulation layer.

14. The multilayer printed wiring board according to claim 1, wherein the inner power conductor layer has a thickness which is greater than a thickness of the outer power conductor layer.

15. The multilayer printed wiring board according to claim 1, wherein the inner ground conductor layer has a thickness which is greater than a thickness of the outer ground conductor layer.

16. The multilayer printed wiring board according to claim 1, wherein the inner power conductor layer has a thickness which is greater than a thickness of the outer power conductor layer, and the inner ground conductor layer has a thickness which is greater than a thickness of the outer ground conductor layer.

17. The multilayer printed wiring board according to claim 1, wherein the inner power conductor layer and the inner ground conductor layer have a thickness of 10 to 250 µm.

18. The multilayer printed wiring board according to claim 1, wherein the outer power conductor layer and the outer ground conductor layer have a thickness of 10 to 60 µm.

19. The multilayer printed wiring board according to claim 1, wherein the plurality of resin layers comprises a prepreg including glass cloth impregnated with a resin.

* * * * *